(12) United States Patent
Pyo et al.

(10) Patent No.: US 12,101,897 B2
(45) Date of Patent: Sep. 24, 2024

(54) DISPLAY DEVICE

(71) Applicant: LG ELECTRONICS INC., Seoul (KR)

(72) Inventors: Jonggil Pyo, Seoul (KR); Kwaneun Jin, Seoul (KR); Jaeyong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 225 days.

(21) Appl. No.: 17/772,898

(22) PCT Filed: Oct. 14, 2020

(86) PCT No.: PCT/KR2020/014014
§ 371 (c)(1),
(2) Date: Apr. 28, 2022

(87) PCT Pub. No.: WO2021/085896
PCT Pub. Date: May 6, 2021

(65) Prior Publication Data
US 2022/0369484 A1    Nov. 17, 2022

(30) Foreign Application Priority Data

Nov. 1, 2019  (KR) .................. 10-2019-0138434

(51) Int. Cl.
*H05K 5/02* (2006.01)
*H05K 5/00* (2006.01)

(52) U.S. Cl.
CPC ......... *H05K 5/0217* (2013.01); *H05K 5/0018* (2022.08)

(58) Field of Classification Search
CPC ... H05K 5/0017; H05K 5/0217; H05K 5/0018
(Continued)

(56) References Cited

U.S. PATENT DOCUMENTS 11,262,803 B2 * 3/2022 Pyo ................ G06F 1/1652
2012/0002357 A1   1/2012 Auld et al.
(Continued)

FOREIGN PATENT DOCUMENTS

EP    3690868    8/2020
EP    4050589    8/2022
(Continued)

OTHER PUBLICATIONS

European Patent Office Application Serial No. 20882184.3, Search Report dated Nov. 2, 2023, 12 pages.
(Continued)

*Primary Examiner* — Hung S. Bui
(74) *Attorney, Agent, or Firm* — LEE, HONG, DEGERMAN, KANG & WAIMEY

(57) ABSTRACT

A display device is disclosed. The display device of the present disclosure includes: a housing; a roller installed in the housing; a display unit rolled around or unrolled from the roller; a foldable link including a lower link having one side pivotally coupled to the housing, and an upper link having one side pivotally coupled to another side of the lower link and having another side pivotally coupled to an upper portion of the display unit; a motor installed adjacent to the lower link in the housing and configured to provide a driving force; a gear fixed to a driving shaft of the motor; and a link gear coupled to the lower link and engaged with the gear, wherein the lower link is eccentric to an axis of rotation of the link gear, to be coupled to the link gear.

11 Claims, 51 Drawing Sheets

(58) Field of Classification Search
USPC .................................. 361/807, 728, 809, 810
See application file for complete search history.

(56) References Cited

U.S. PATENT DOCUMENTS

| | | | |
|---|---|---|---|
| 2015/0146359 A1* | 5/2015 | Katsunuma | B60K 35/00 |
| | | | 361/679.22 |
| 2017/0013726 A1* | 1/2017 | Han | G09F 15/0062 |
| 2021/0204427 A1* | 7/2021 | Pyo | G06F 1/1652 |

FOREIGN PATENT DOCUMENTS

| | | |
|---|---|---|
| JP | 2008-095888 | 4/2008 |
| KR | 10-2017-0006013 | 1/2017 |
| KR | 10-2018-0027318 | 3/2018 |
| KR | 10-2031910 | 10/2019 |

OTHER PUBLICATIONS

PCT International Application No. PCT/KR2020/014014, International Search Report dated Jan. 26, 2021, 4 pages.

* cited by examiner

[FIG. 1]
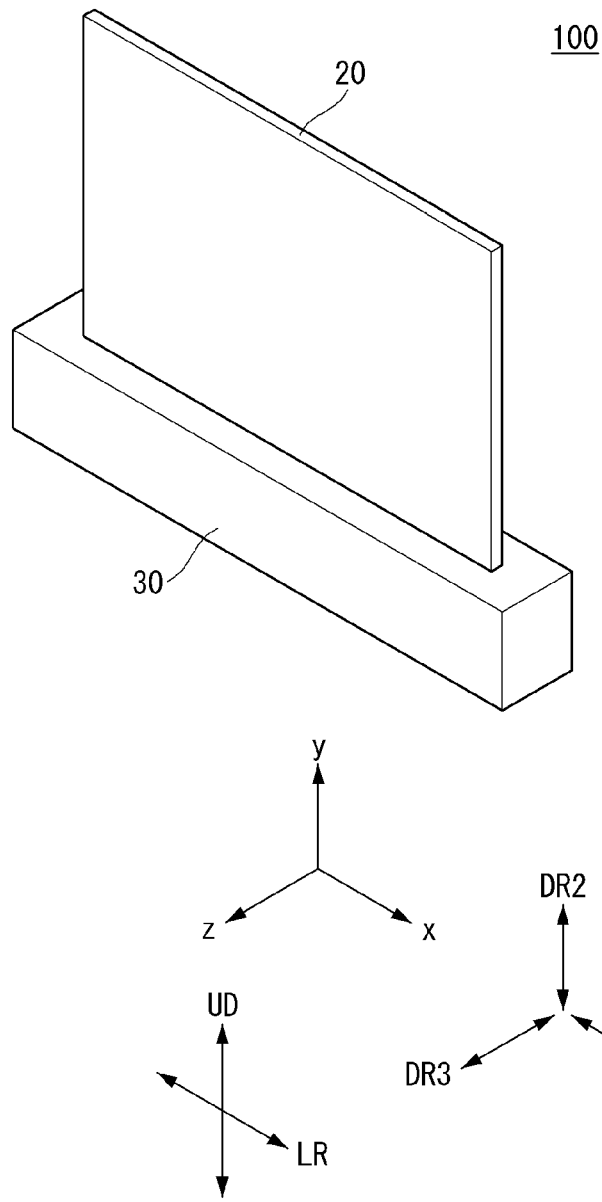

[FIG. 2]
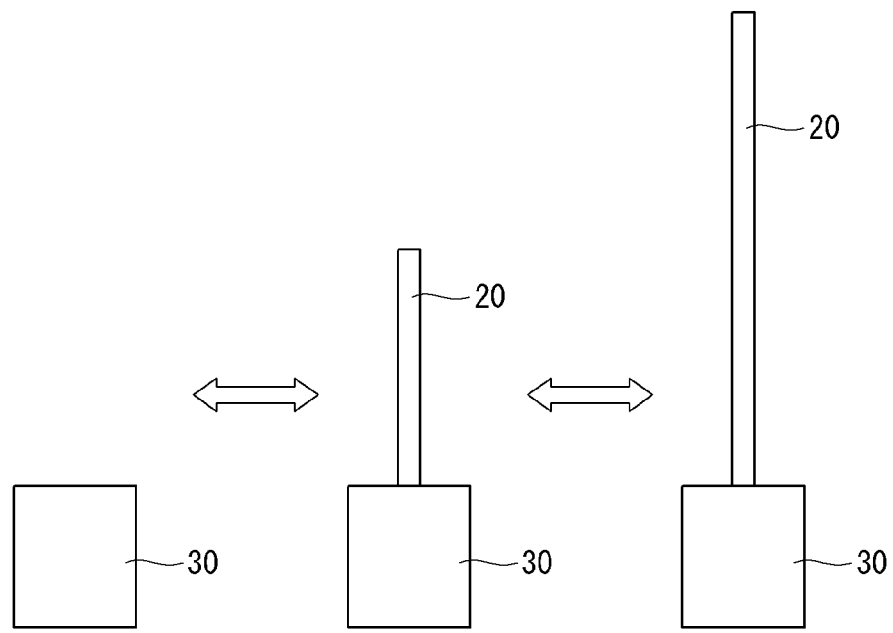

[FIG. 3]
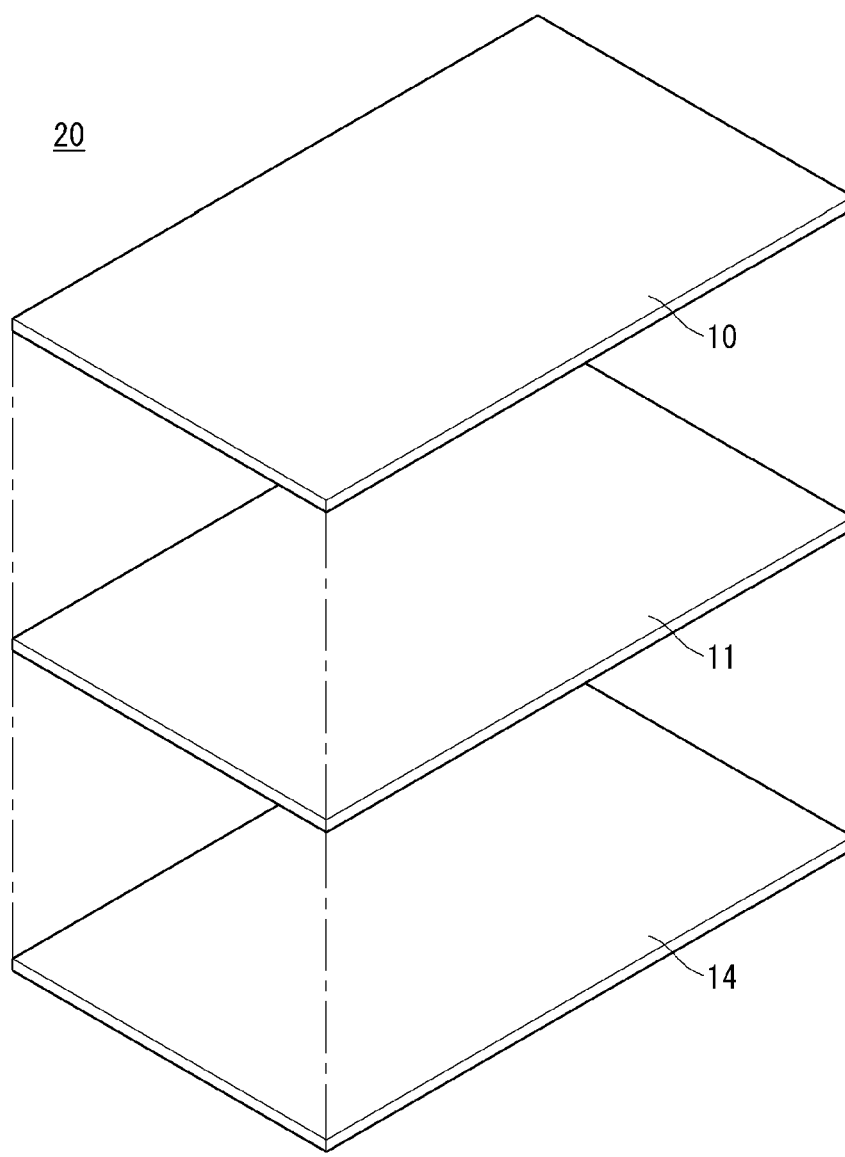

[FIG. 4]
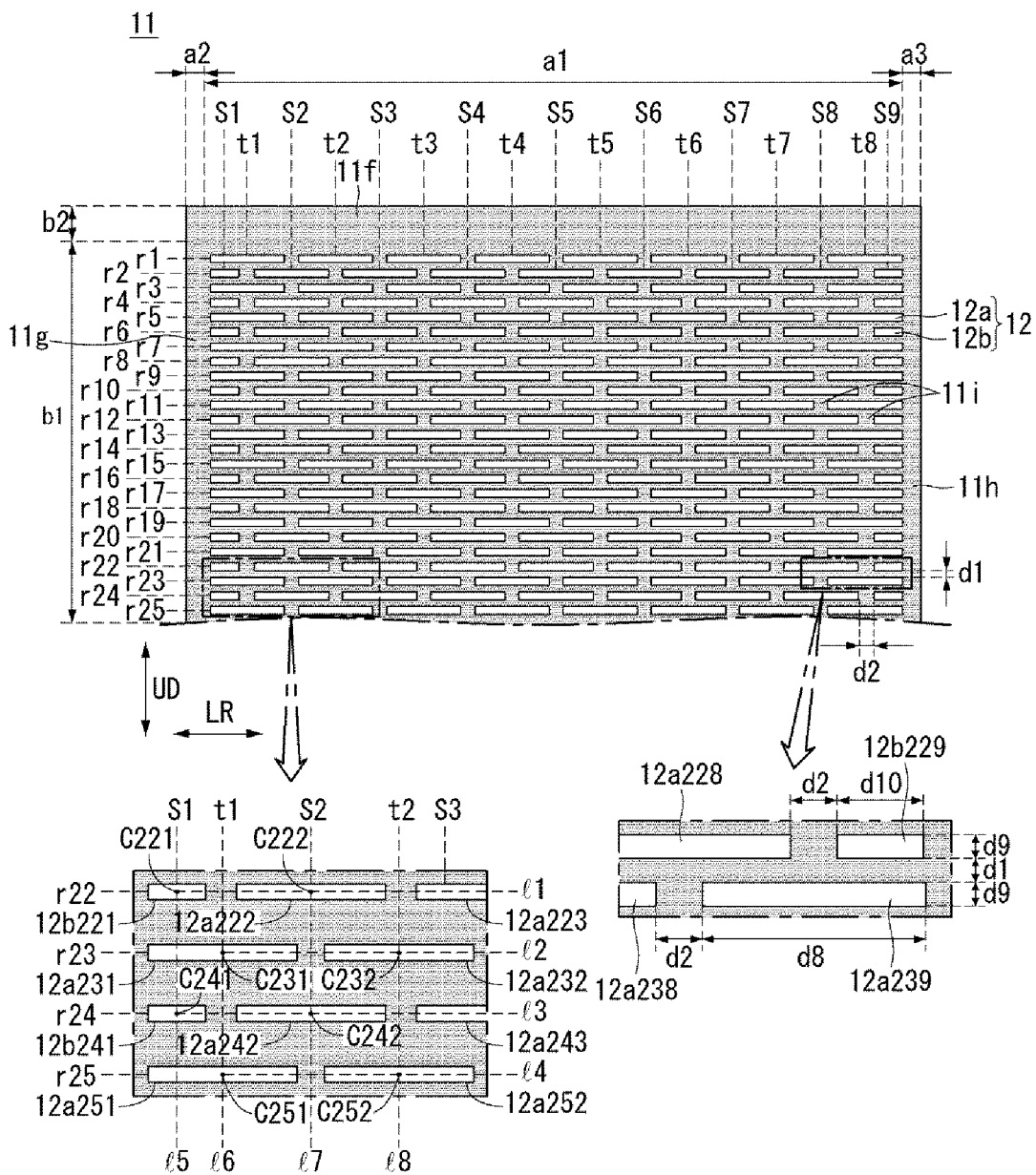

[FIG. 5]
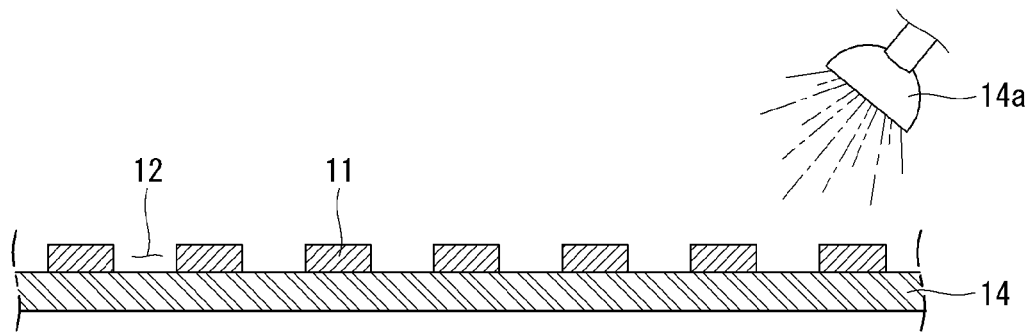
[FIG. 6]
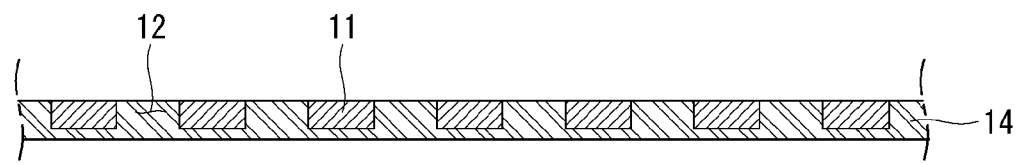
[FIG. 7]
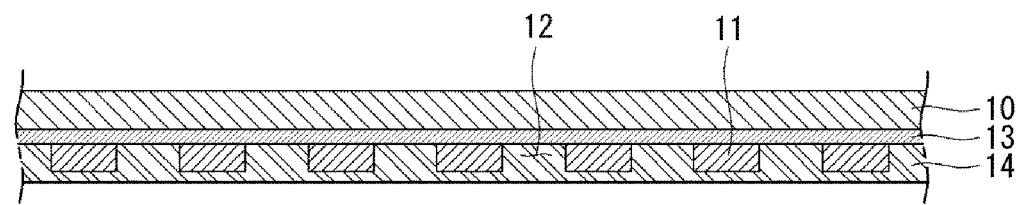

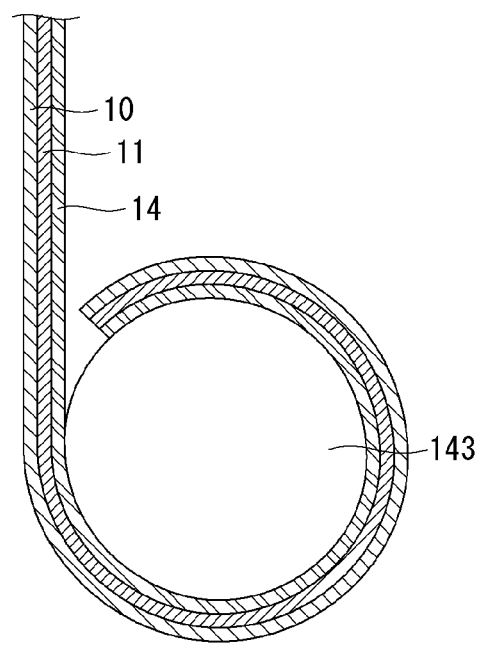
[FIG. 8]

[FIG. 9]
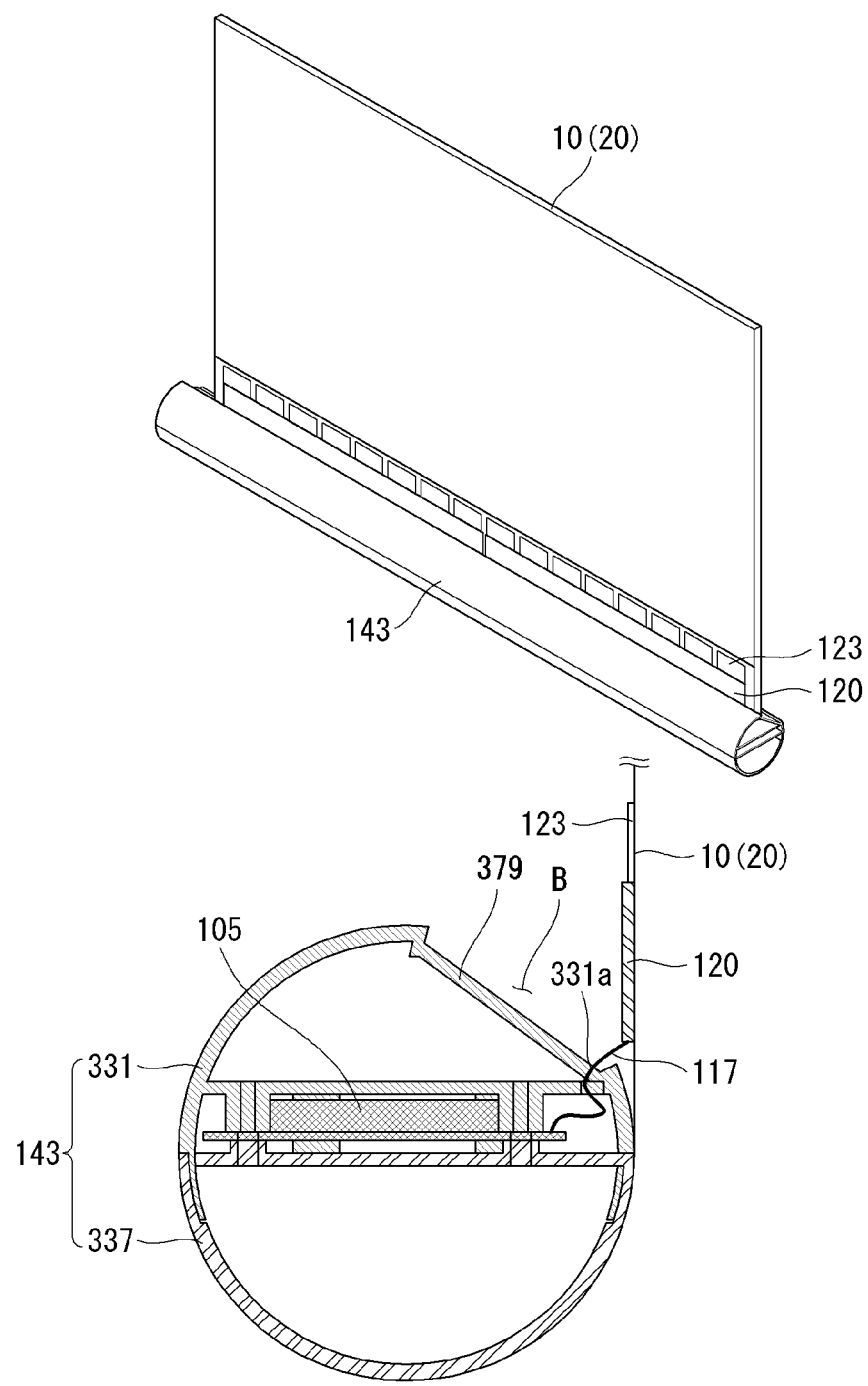

[FIG. 10]
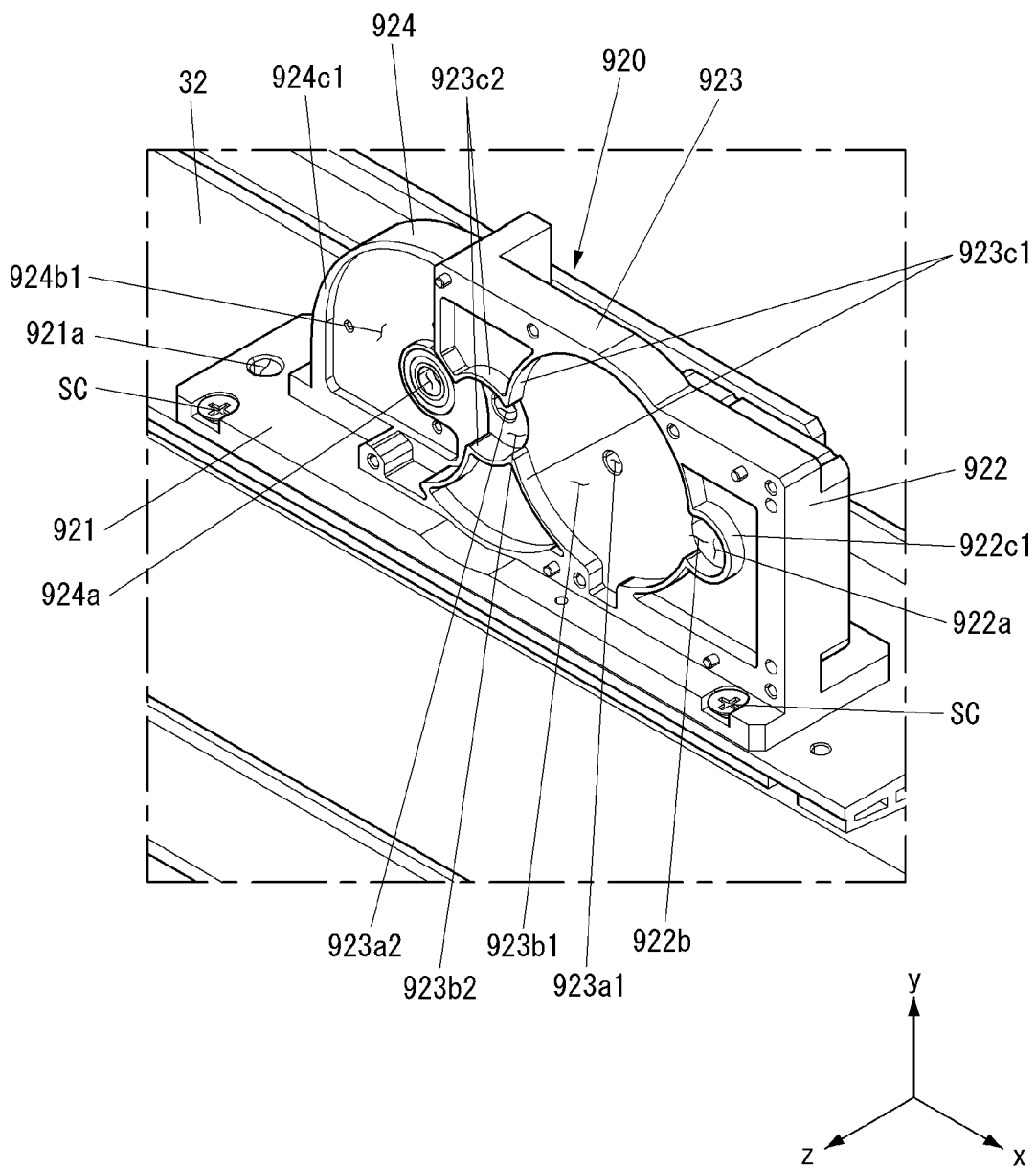

[FIG. 11]
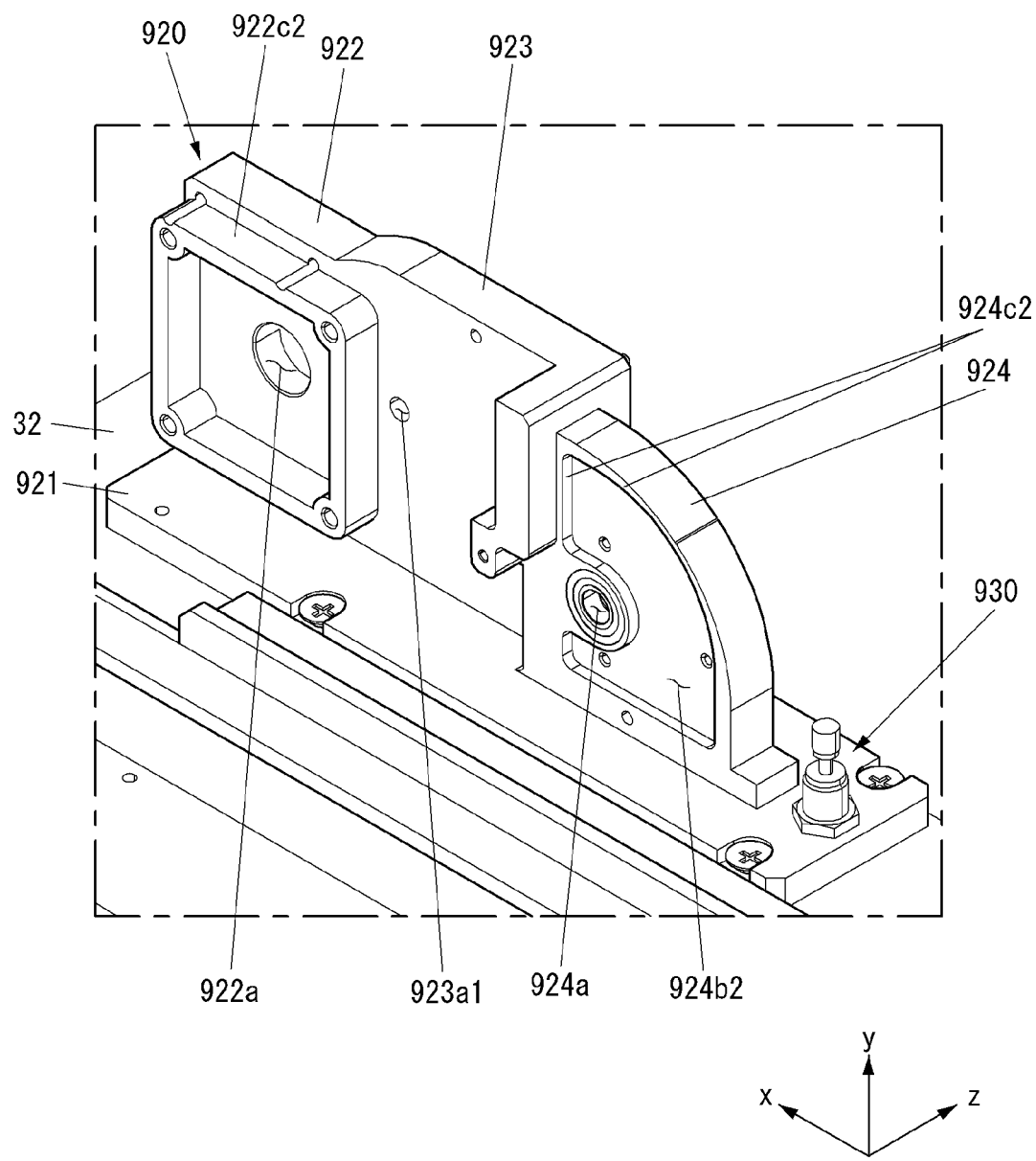

[FIG. 12]
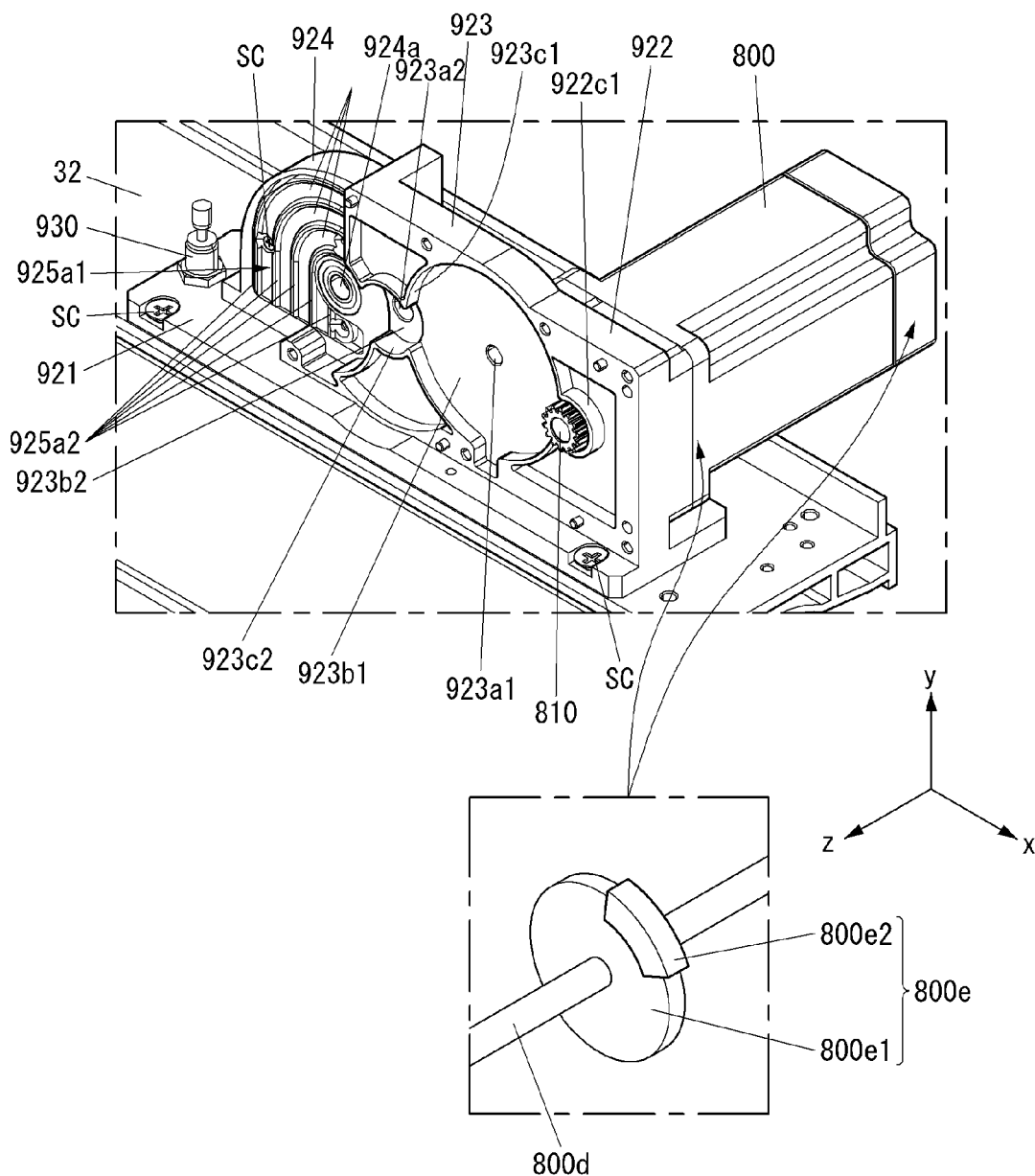

[FIG. 13]
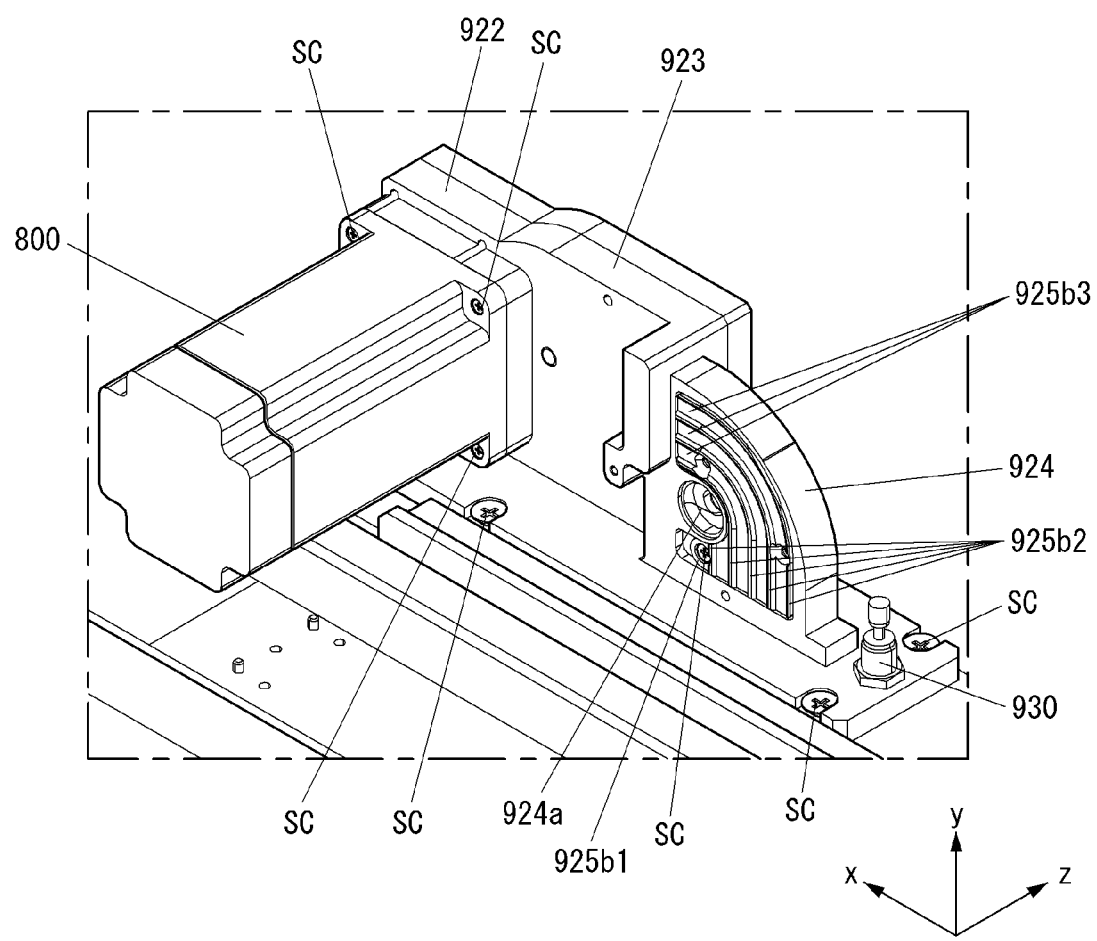

[FIG. 14]
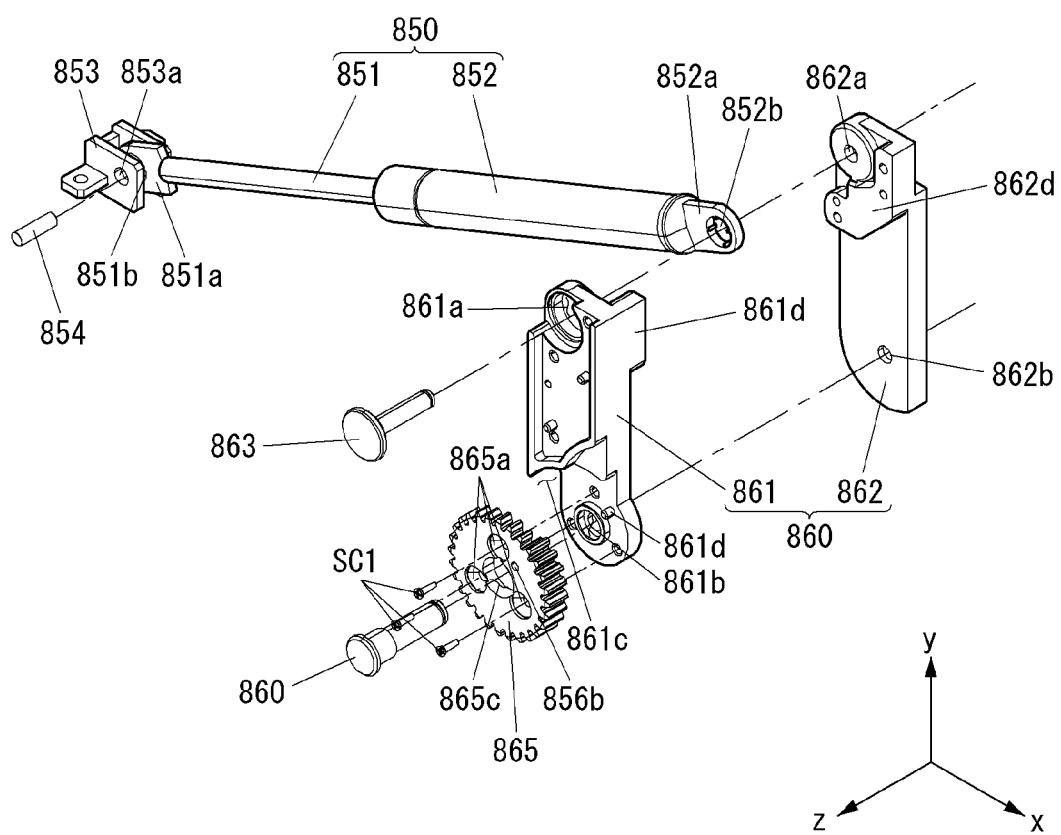

[FIG. 15]
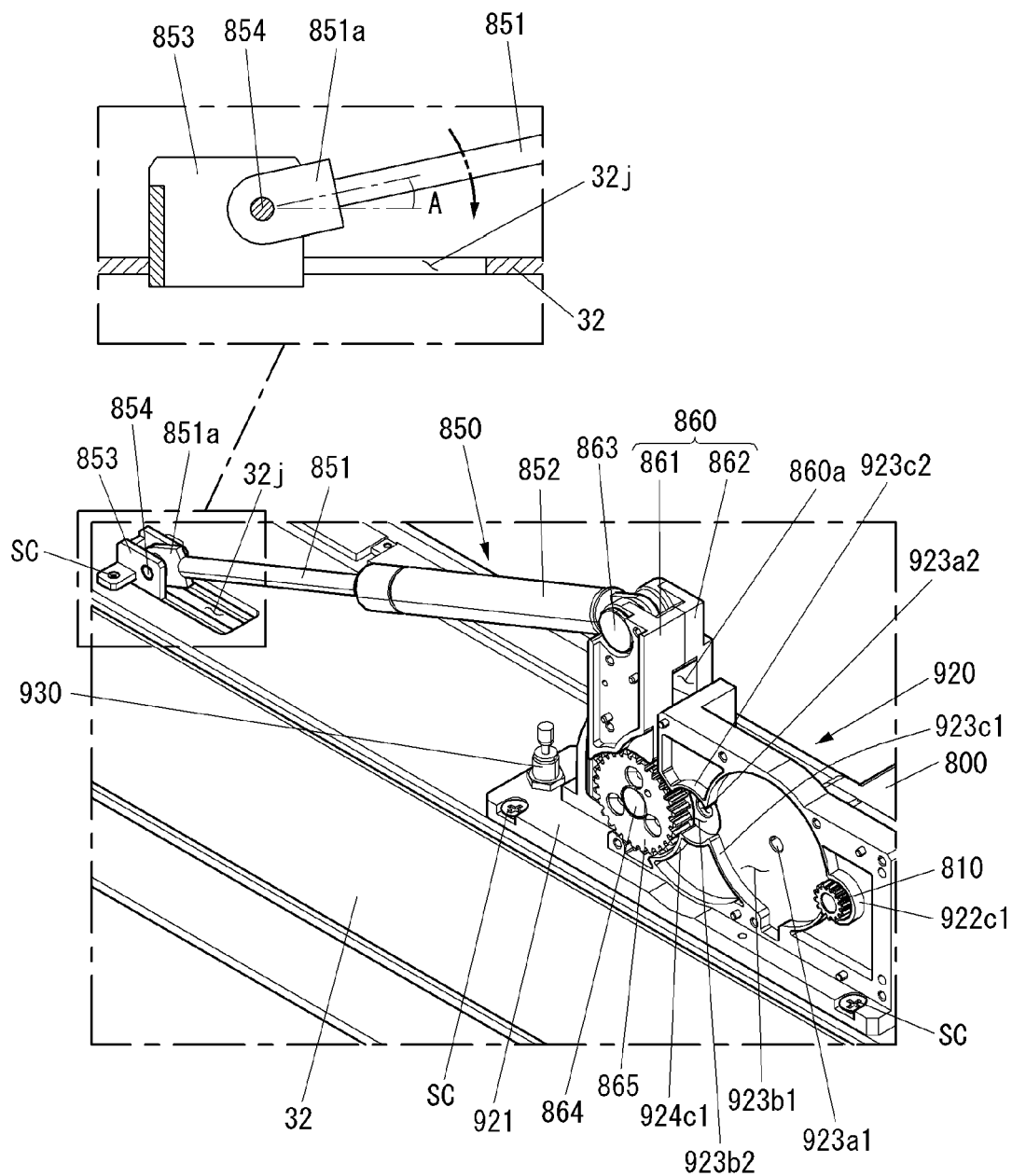

[FIG. 16]
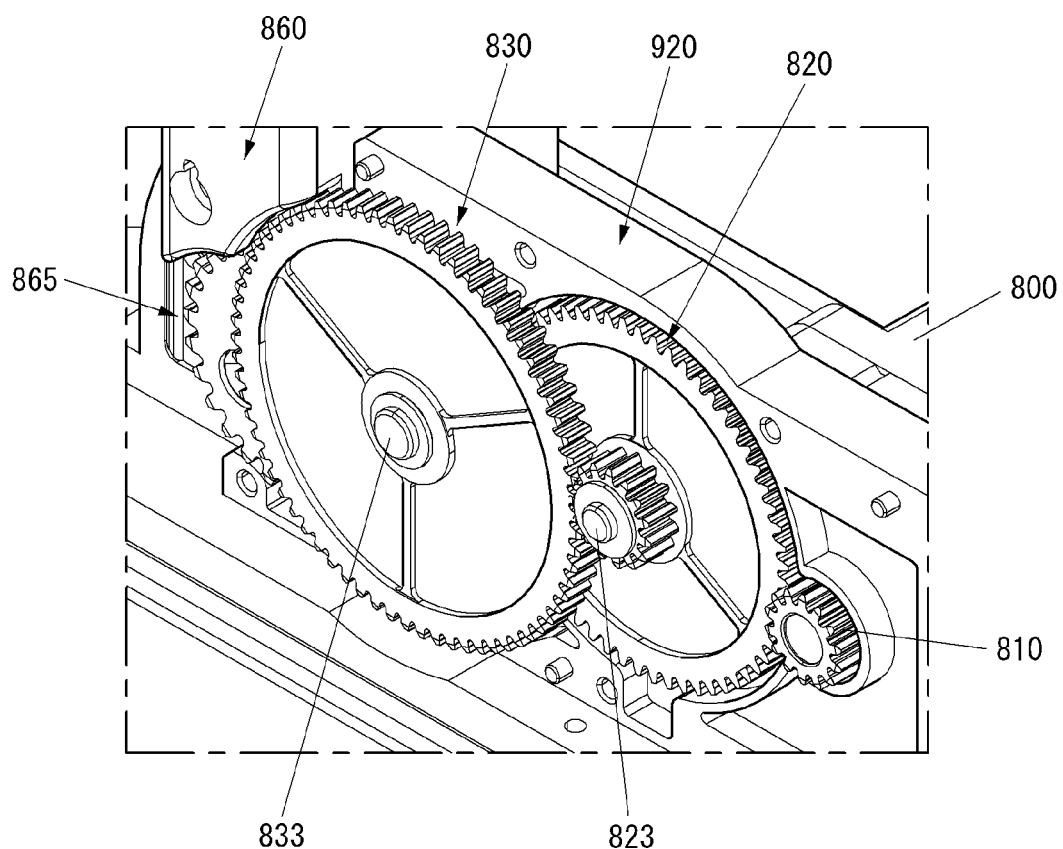

[FIG. 17]
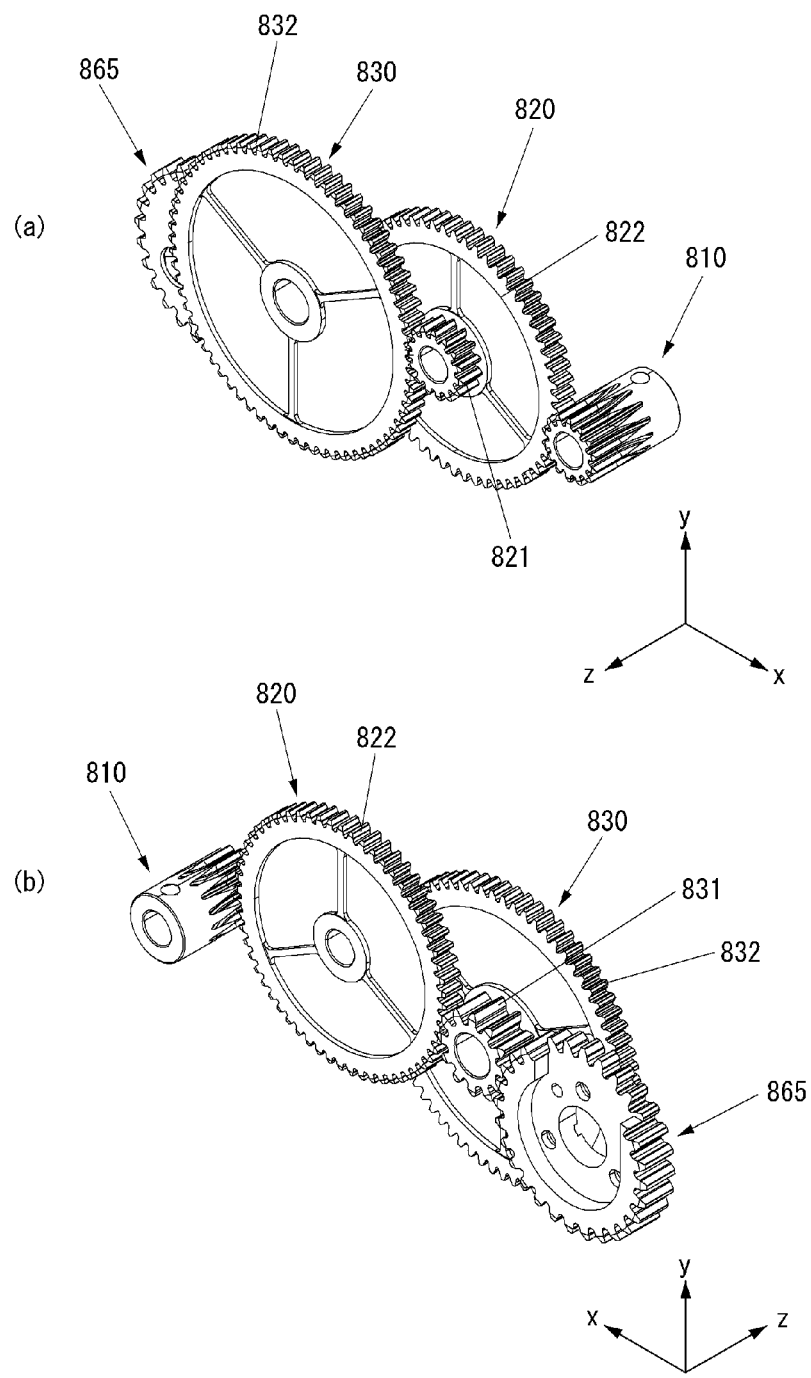

[FIG. 18]
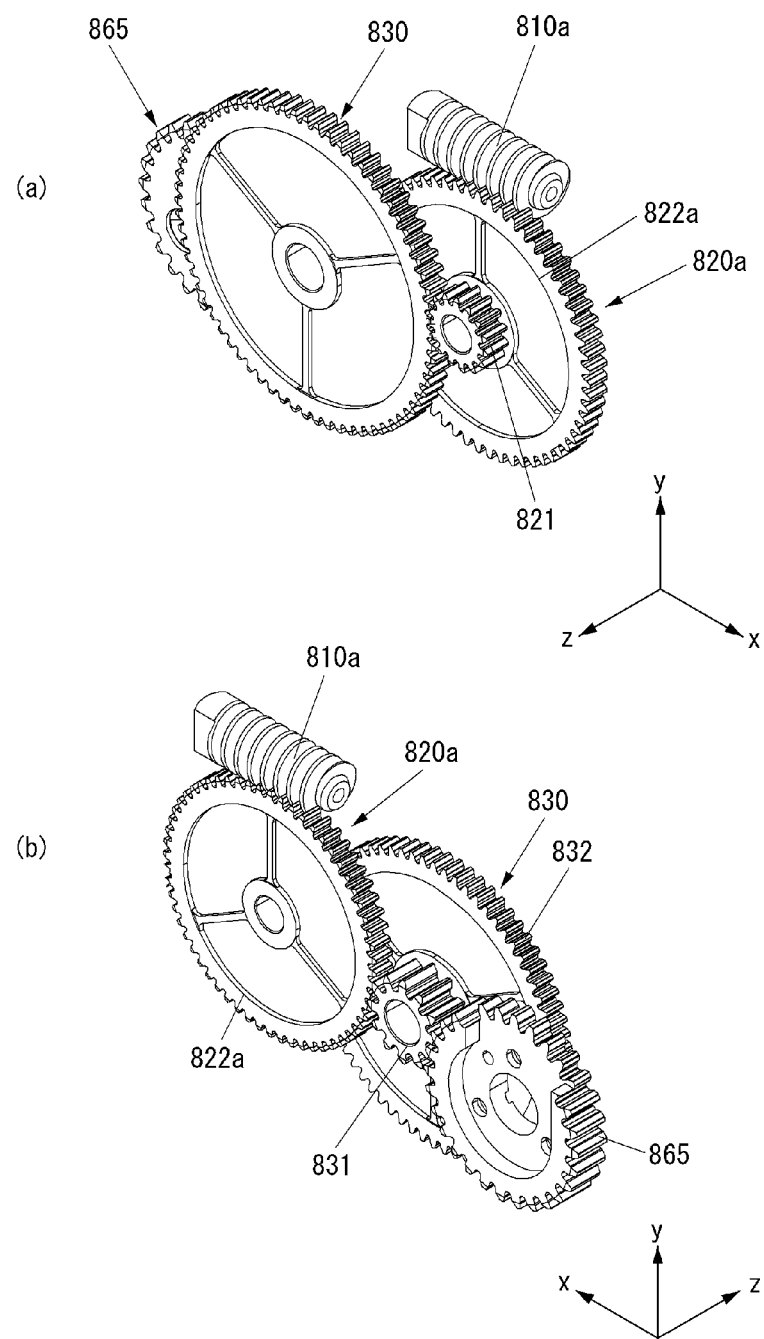

[FIG. 19]
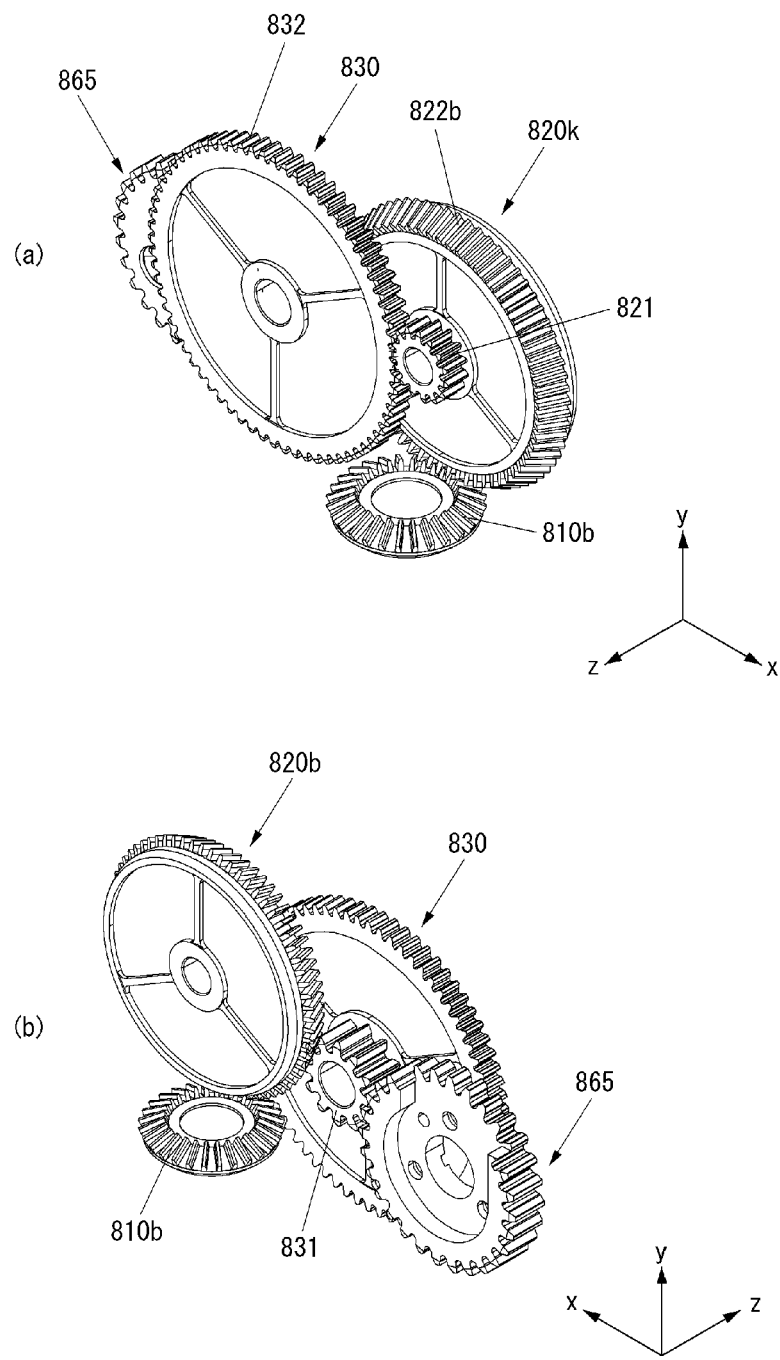

[FIG. 20]
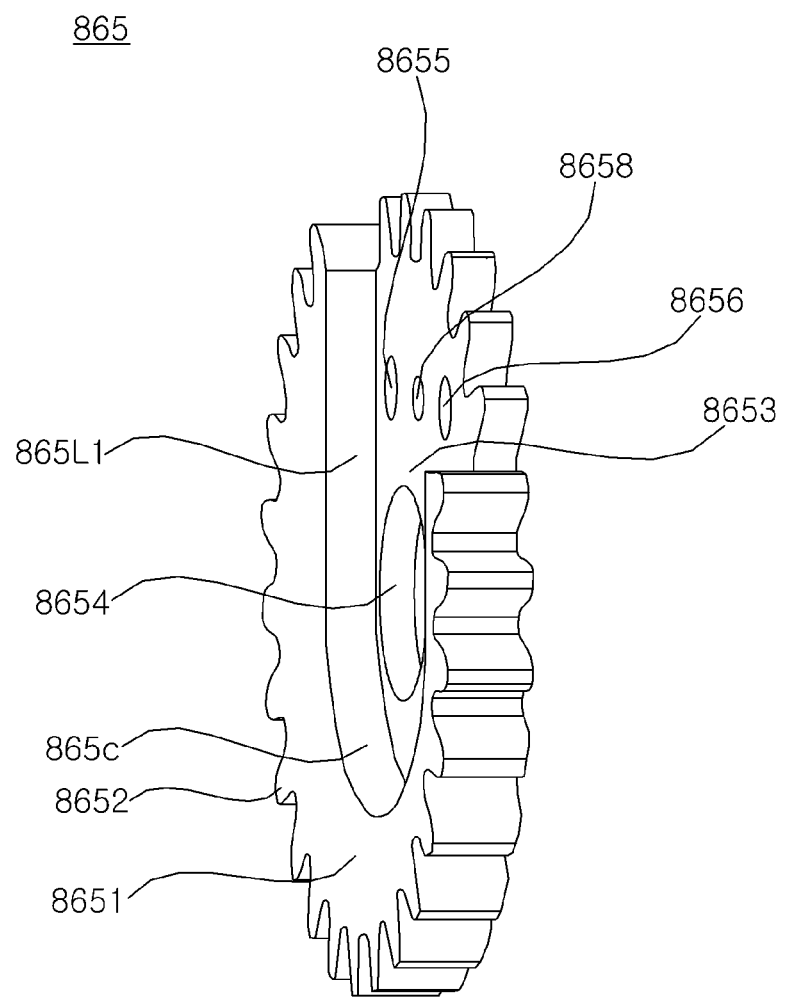

【FIG. 21】
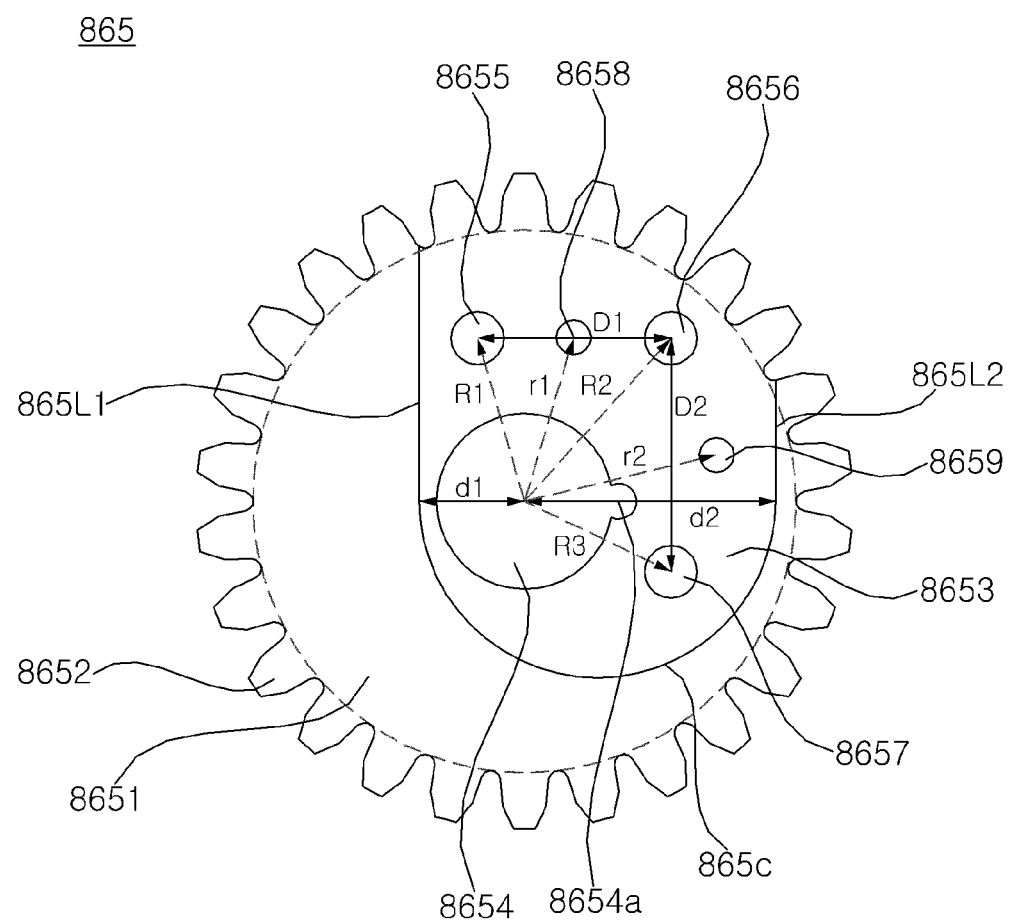

[FIG. 22]
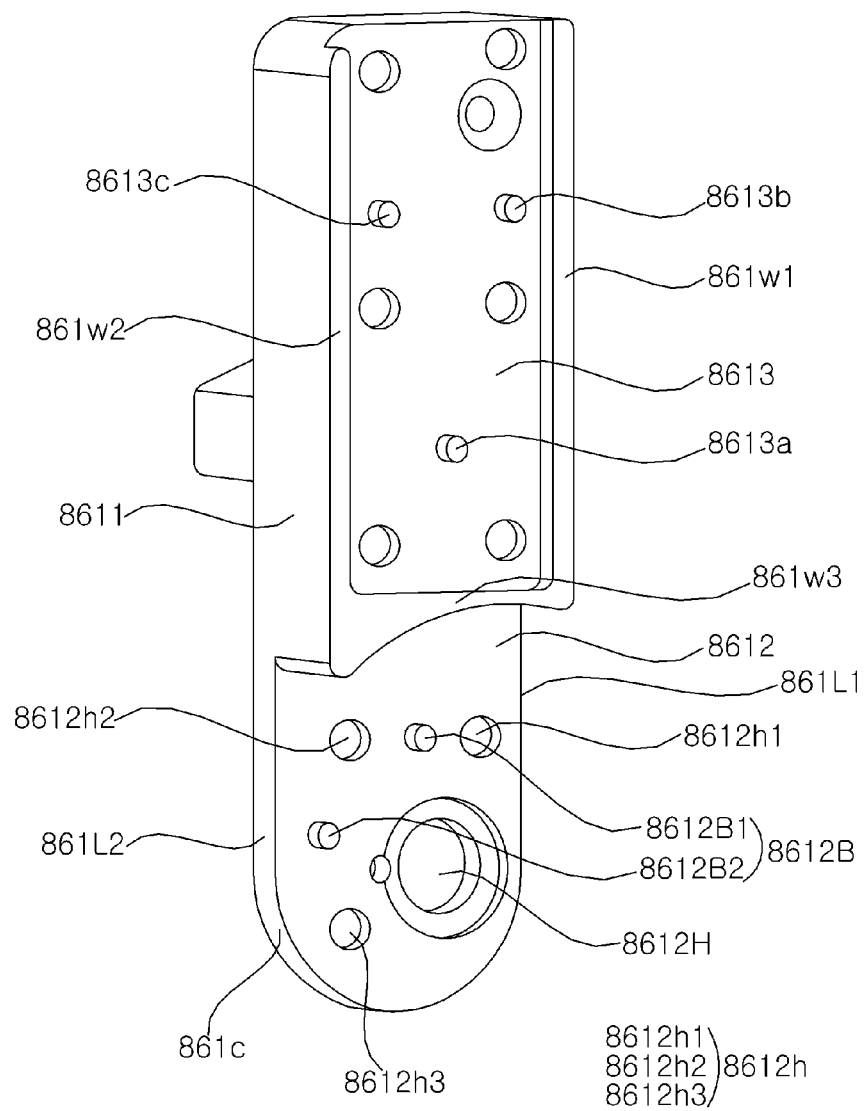

[FIG. 23]
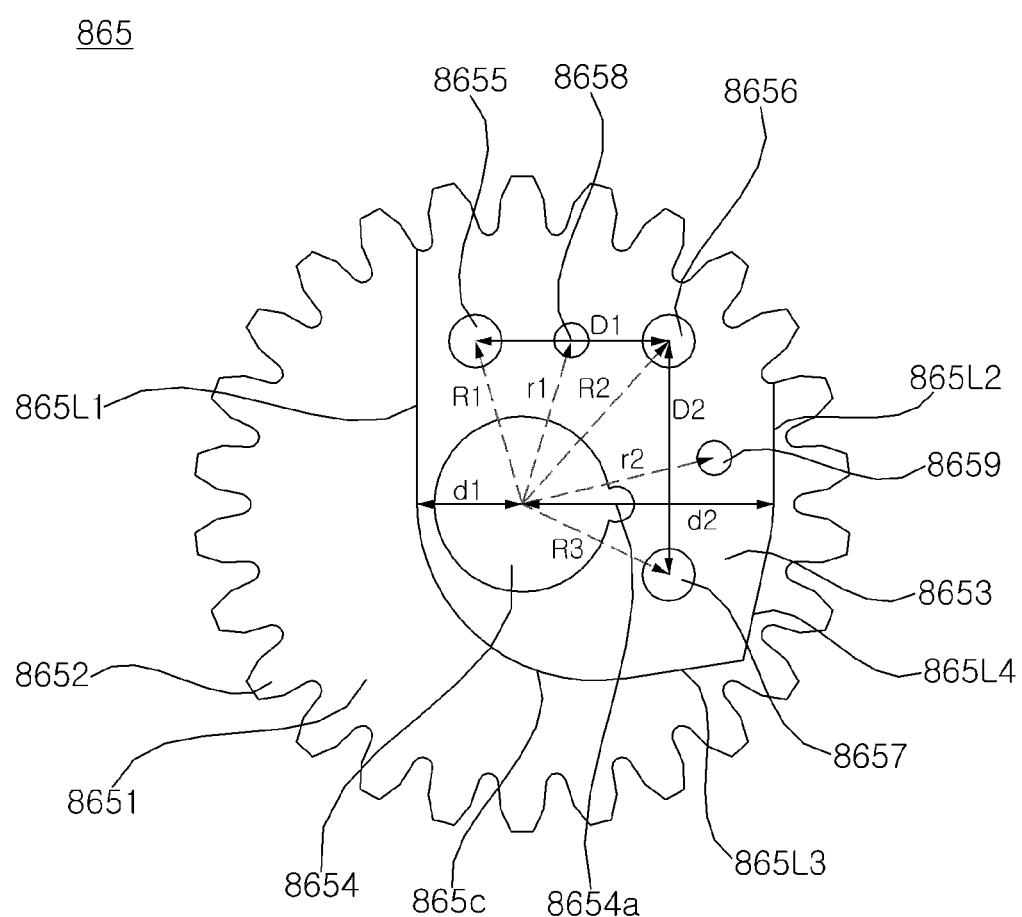

[FIG. 24]
861
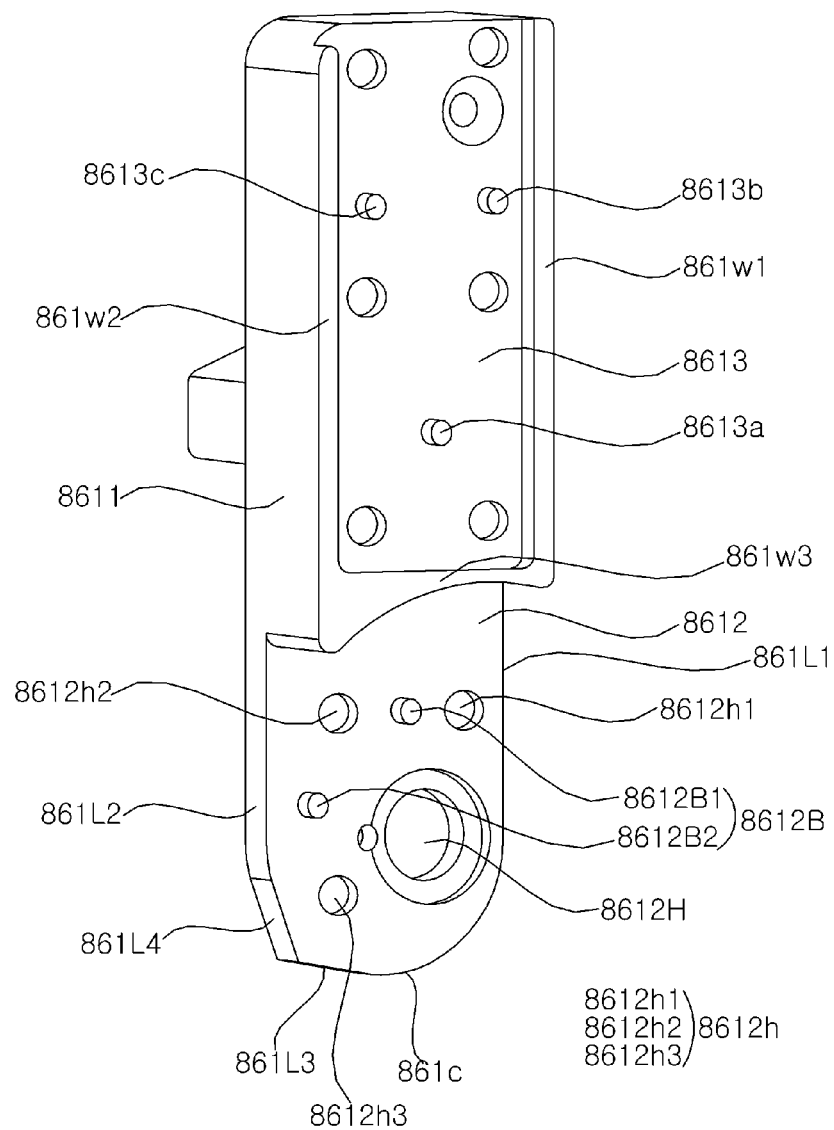

[FIG. 25]
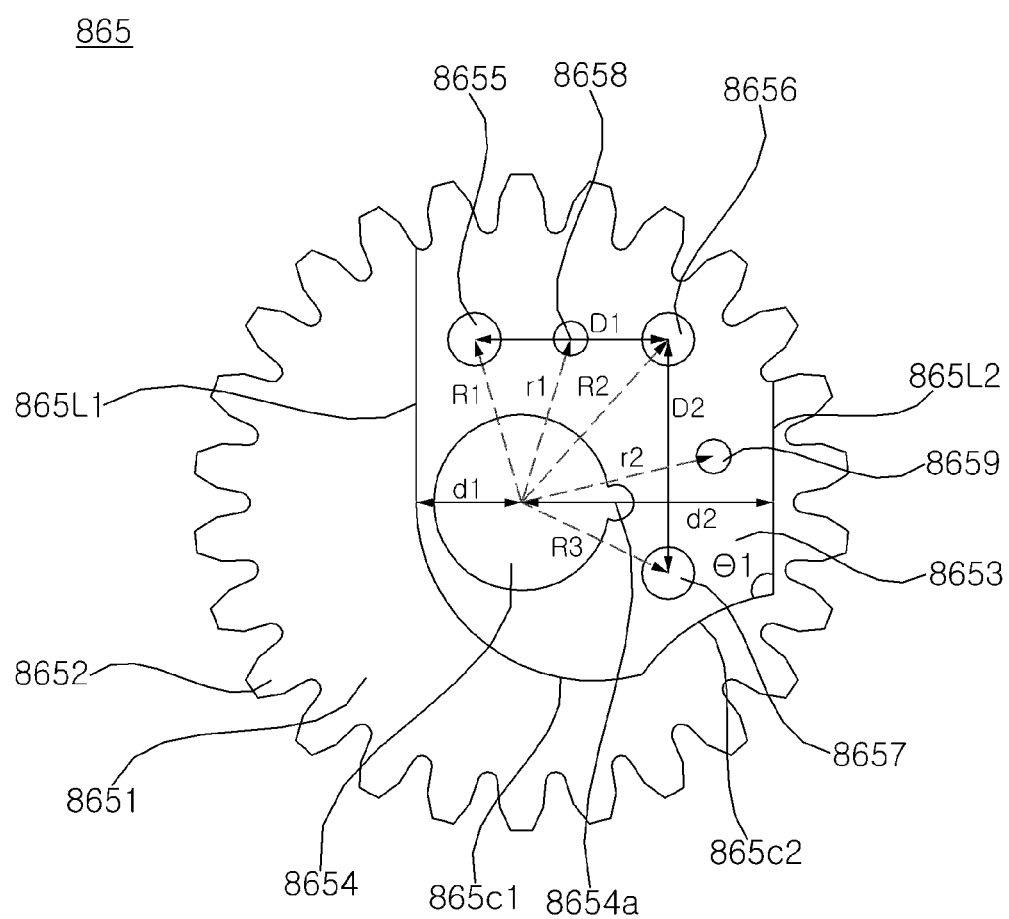

[FIG. 26]
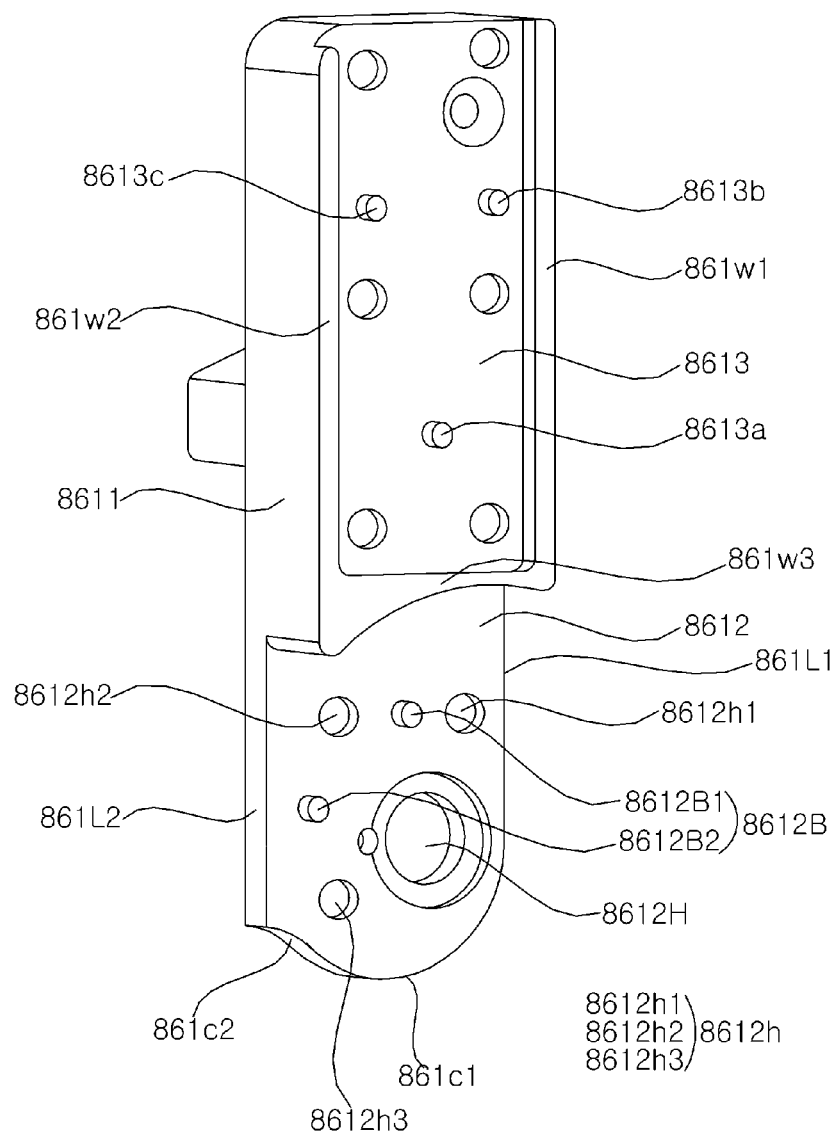

【FIG. 27】
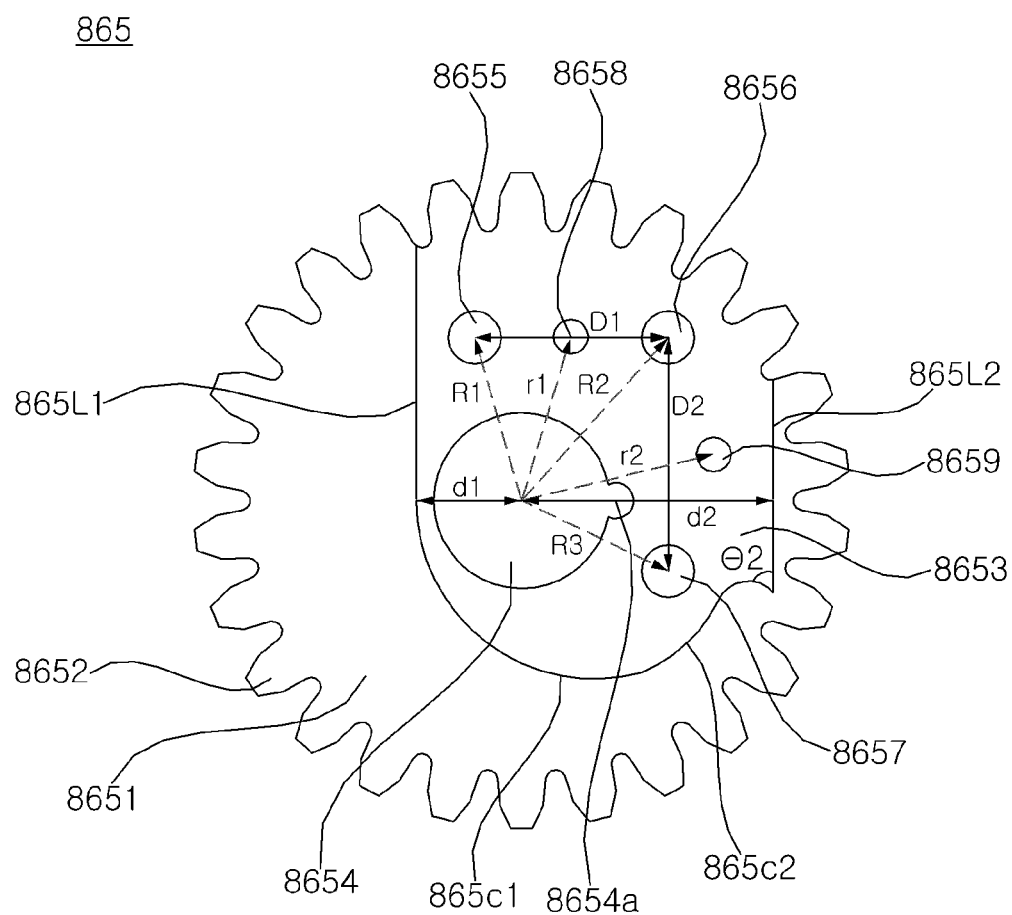

[FIG. 28]
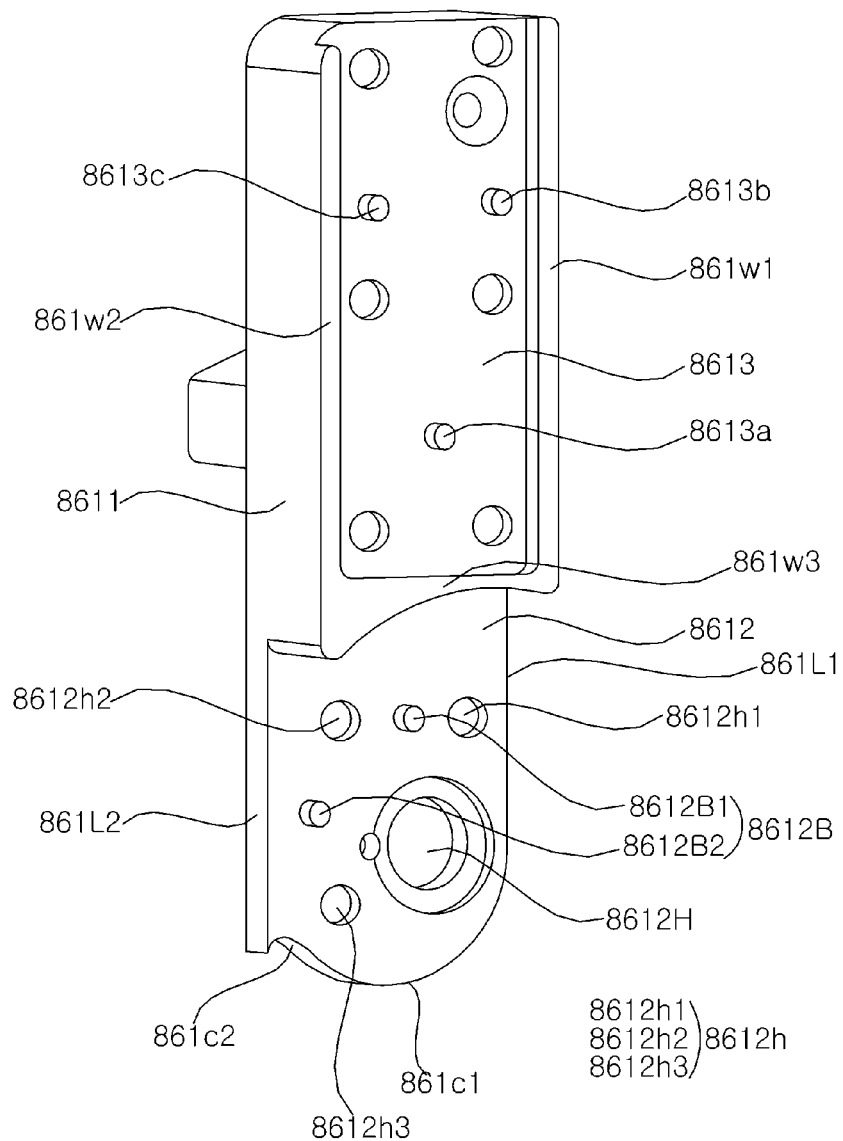

[FIG. 29]
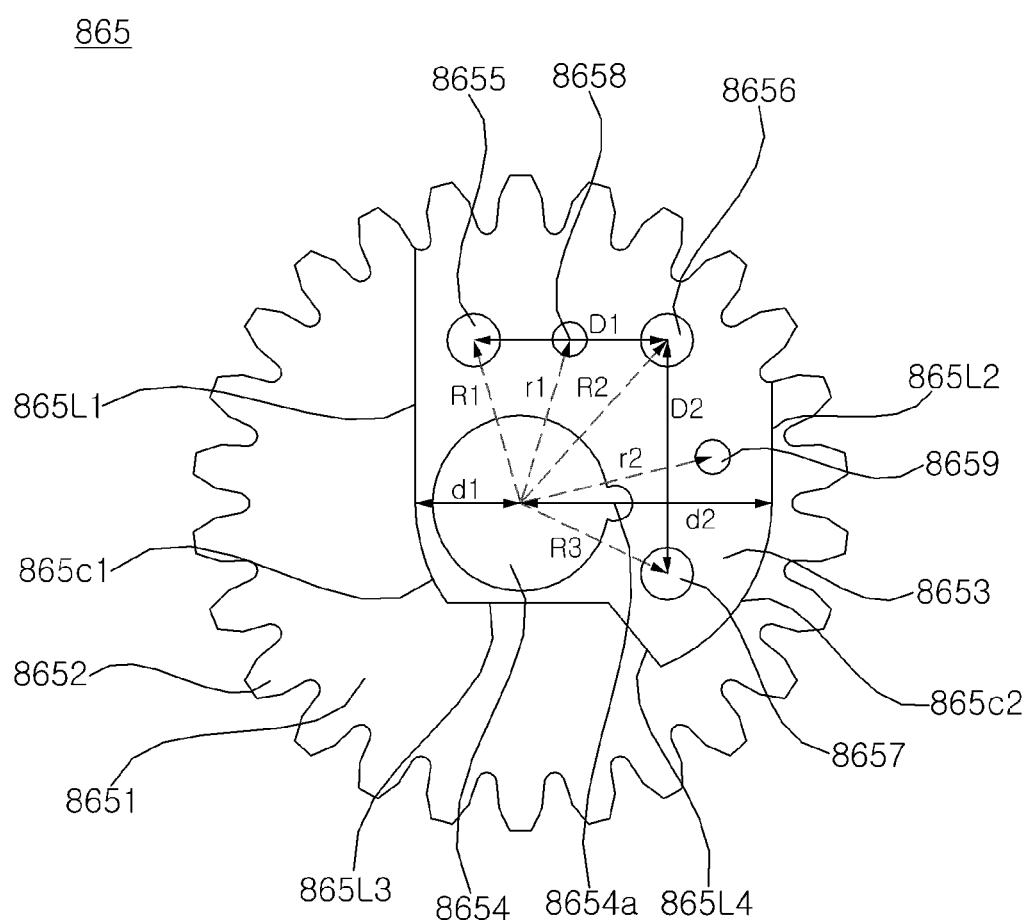

[FIG. 30]
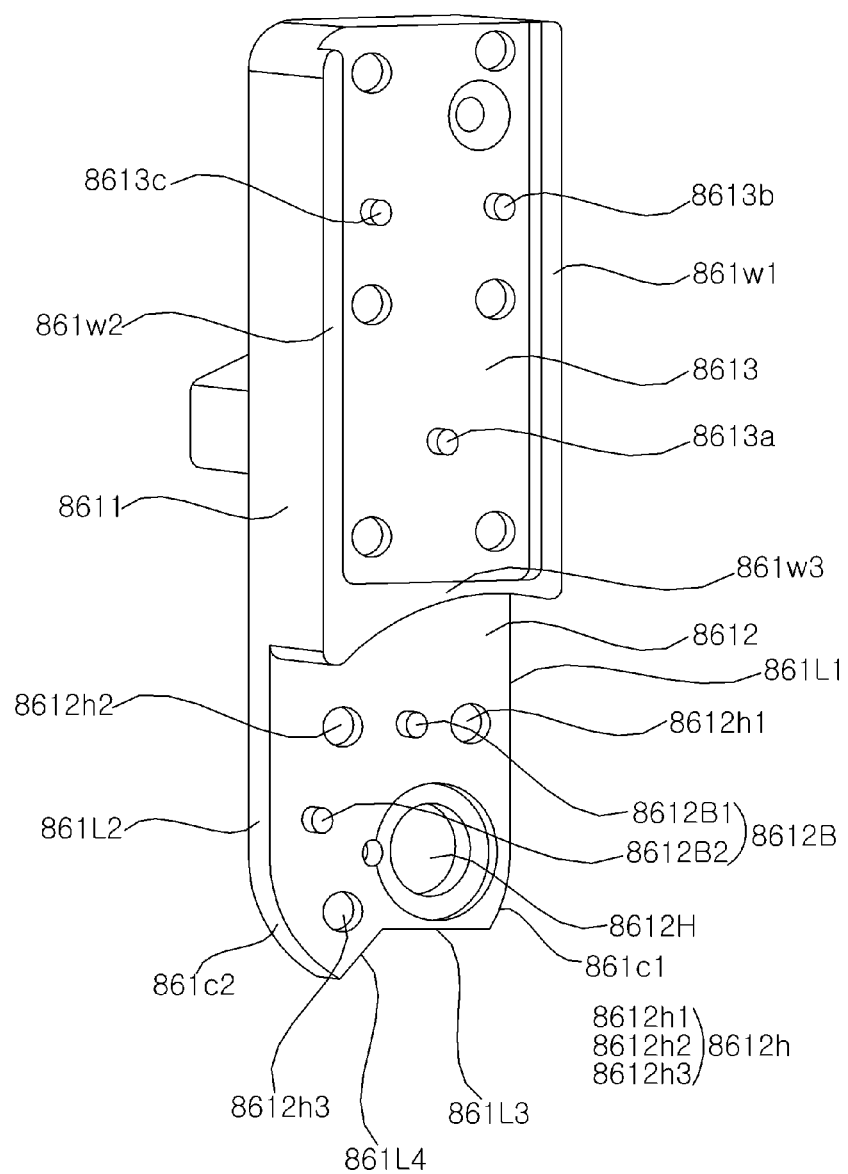

[FIG. 31]
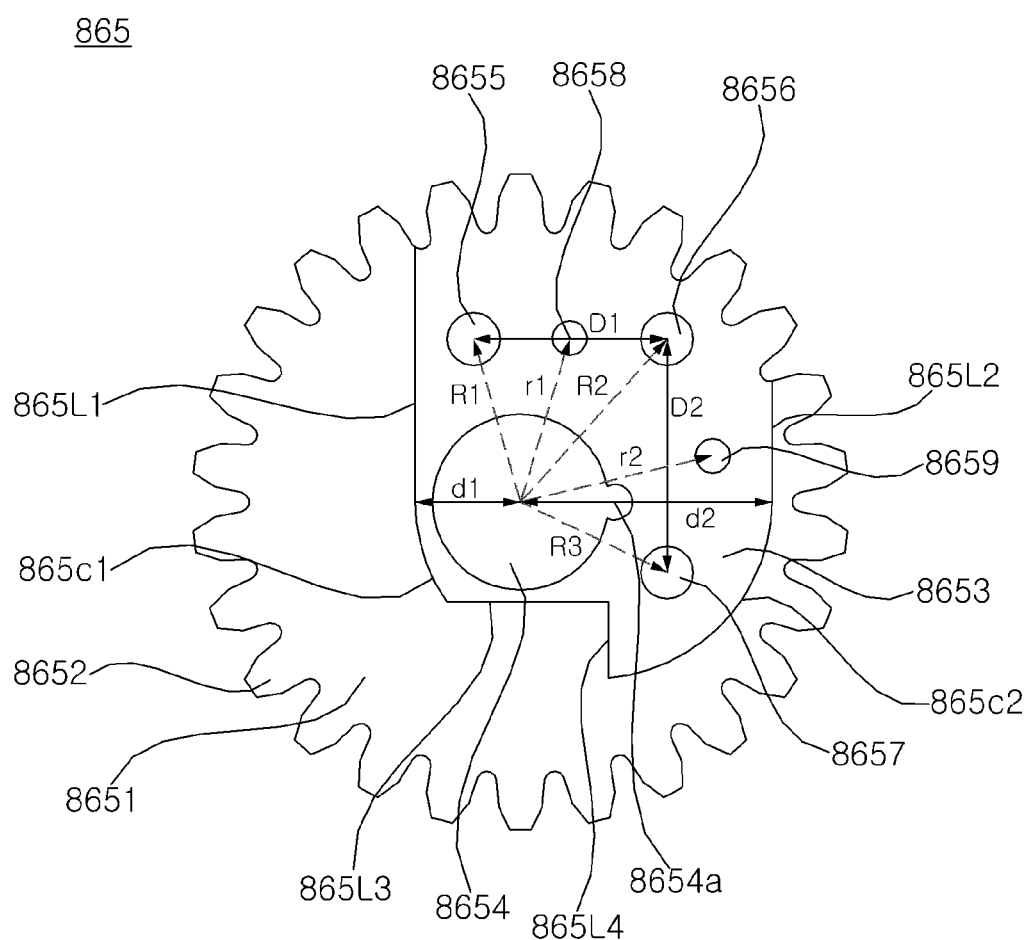

[FIG. 32]
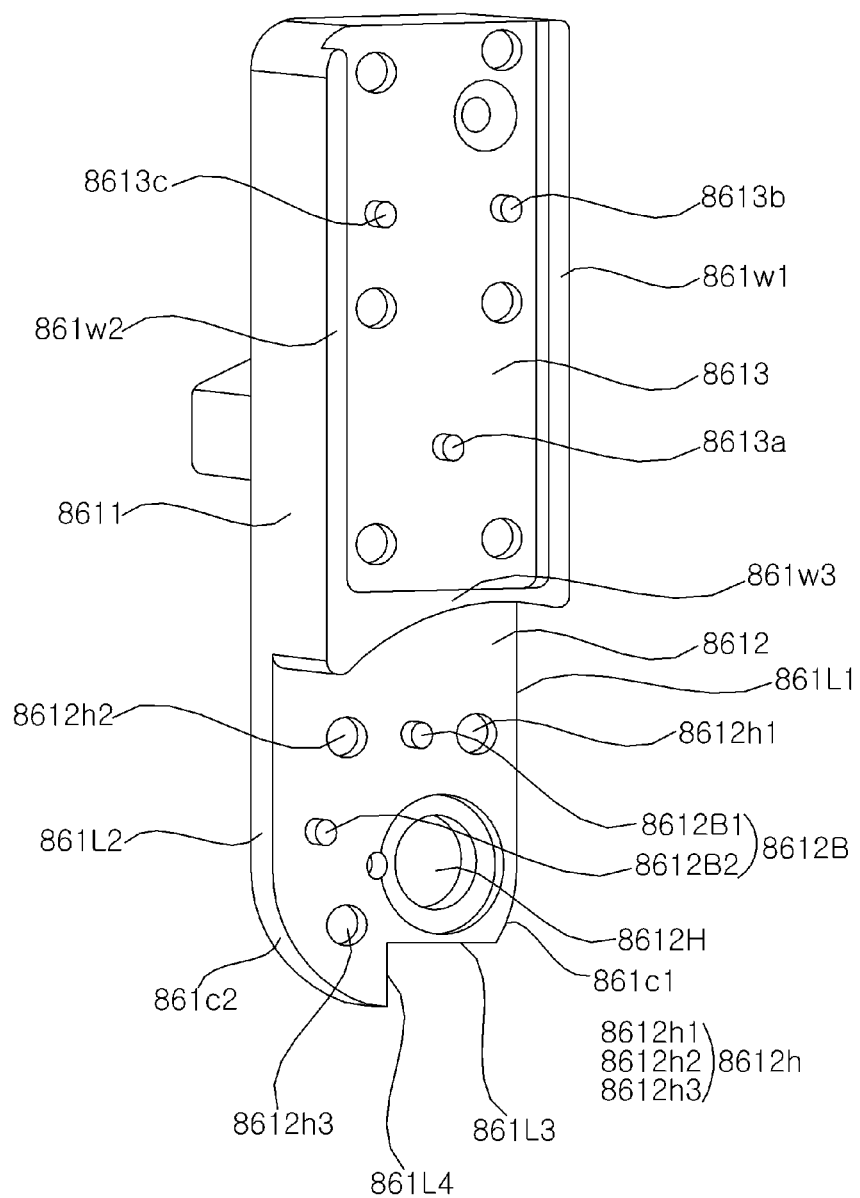

【FIG. 33】
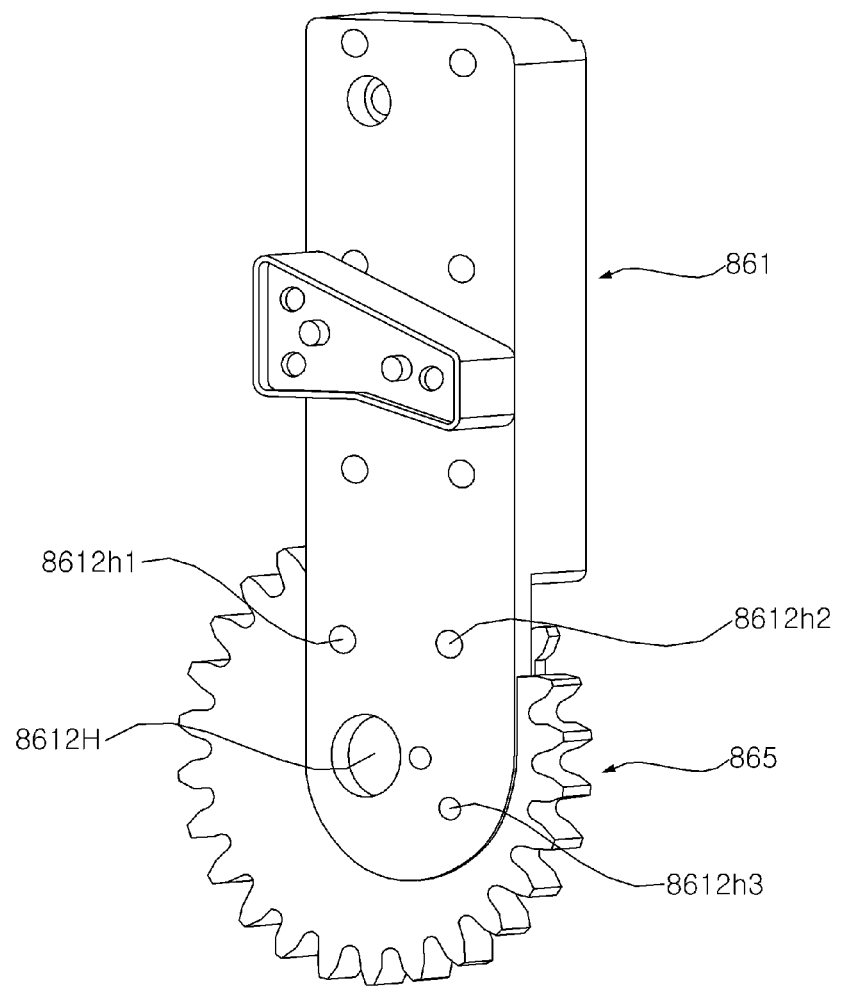

【FIG. 34】
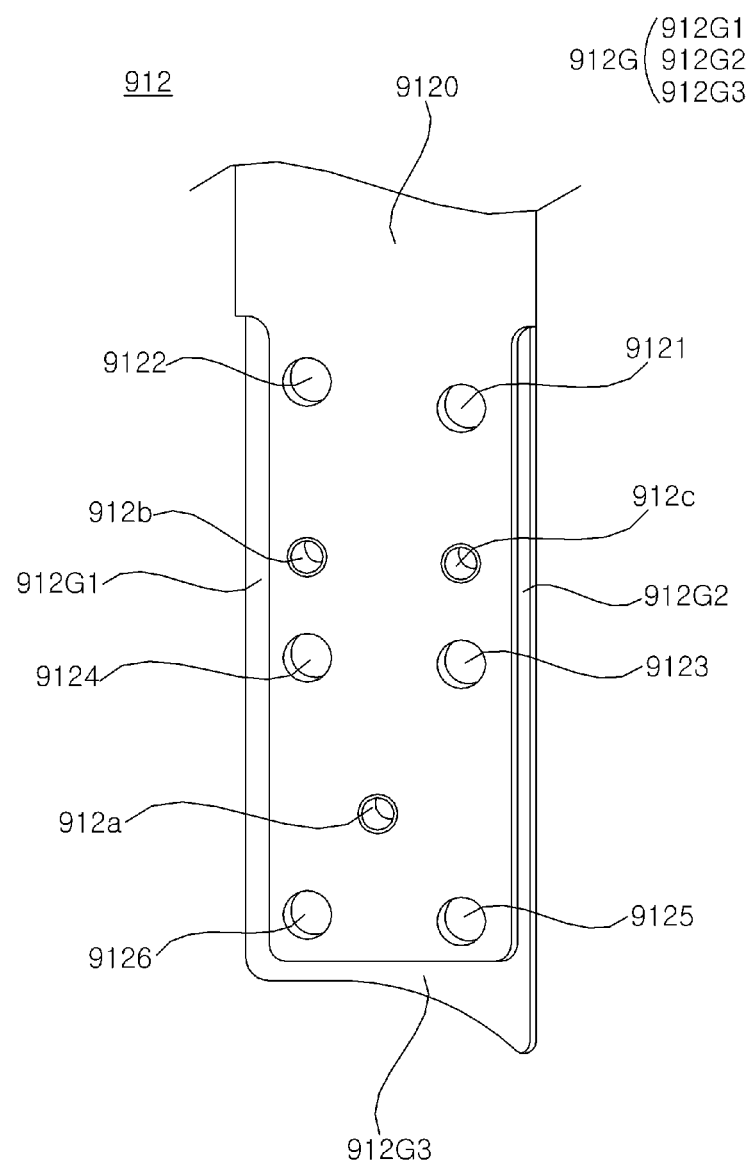

[FIG. 35]
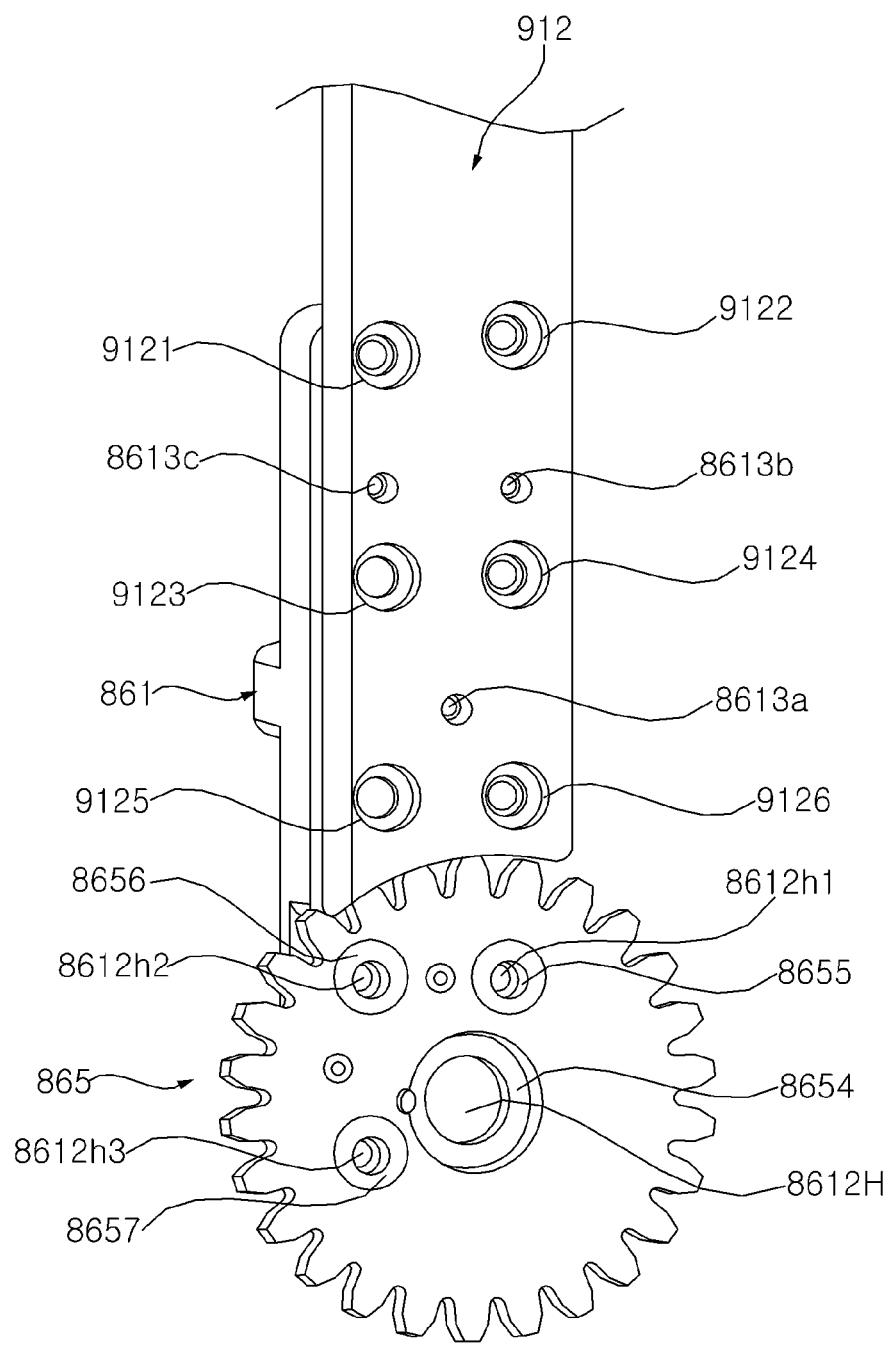

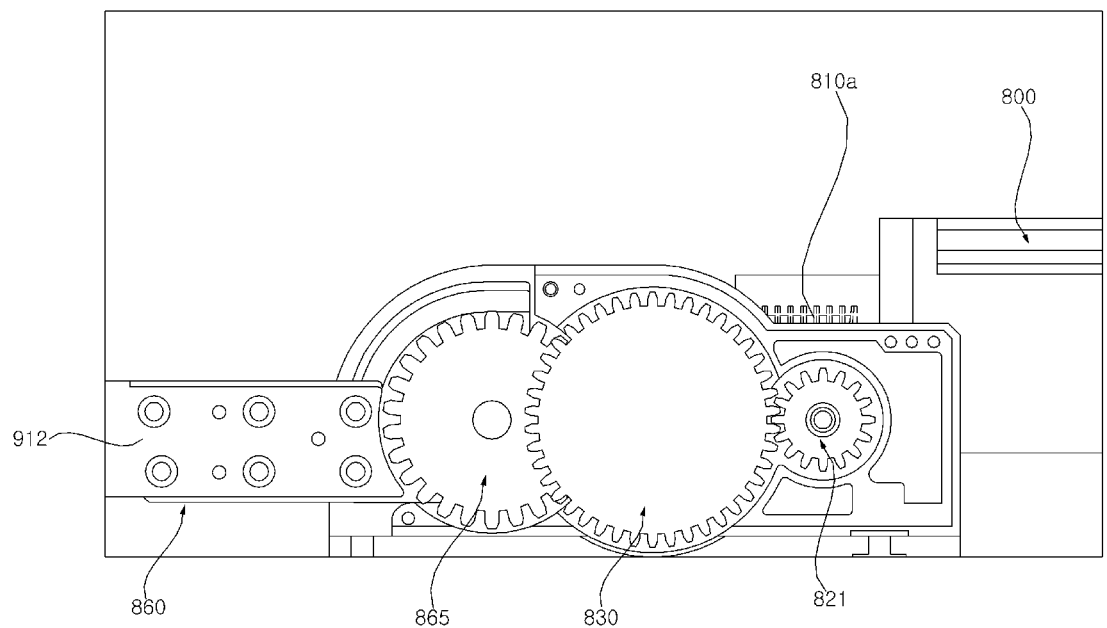
[FIG. 36]

[FIG. 37]
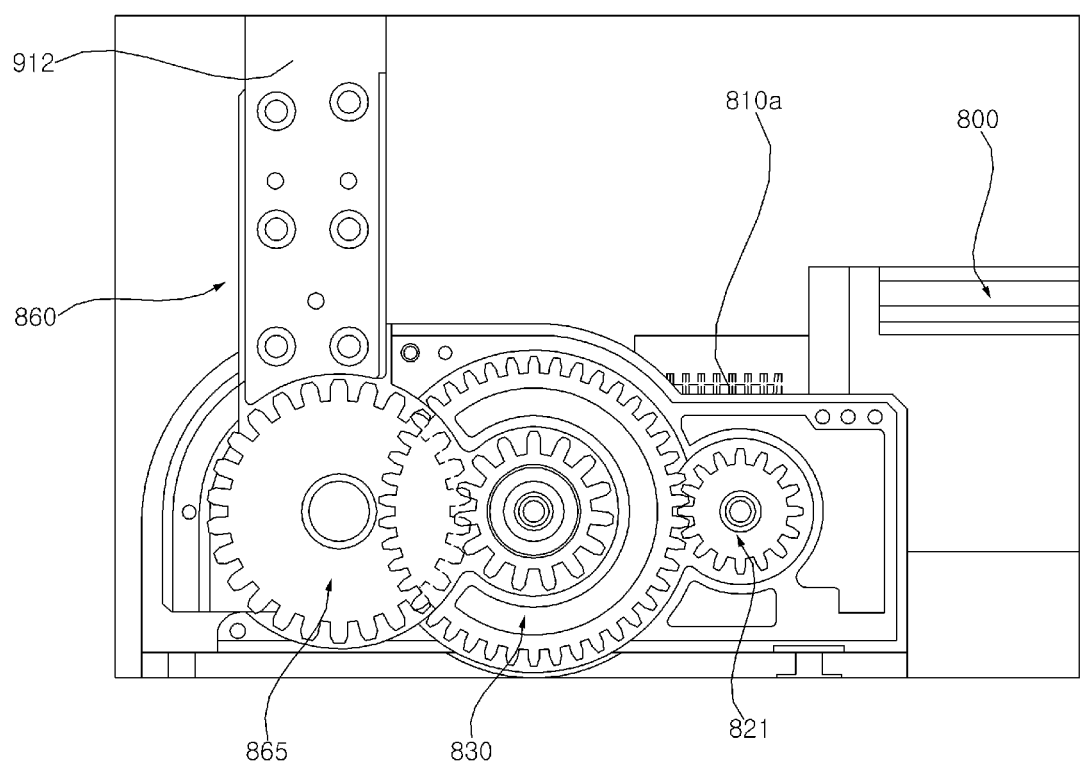

[FIG. 38]
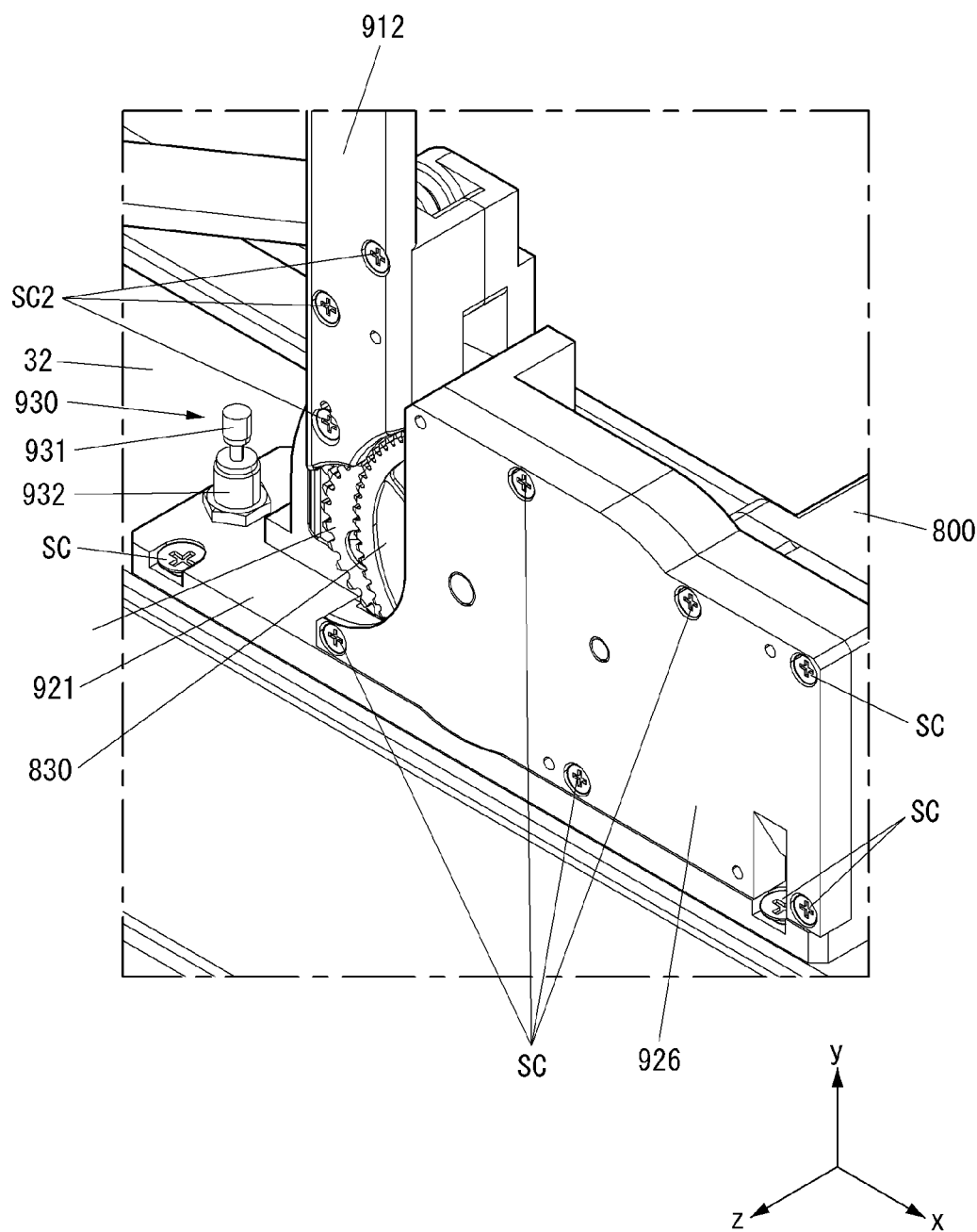

[FIG. 39]
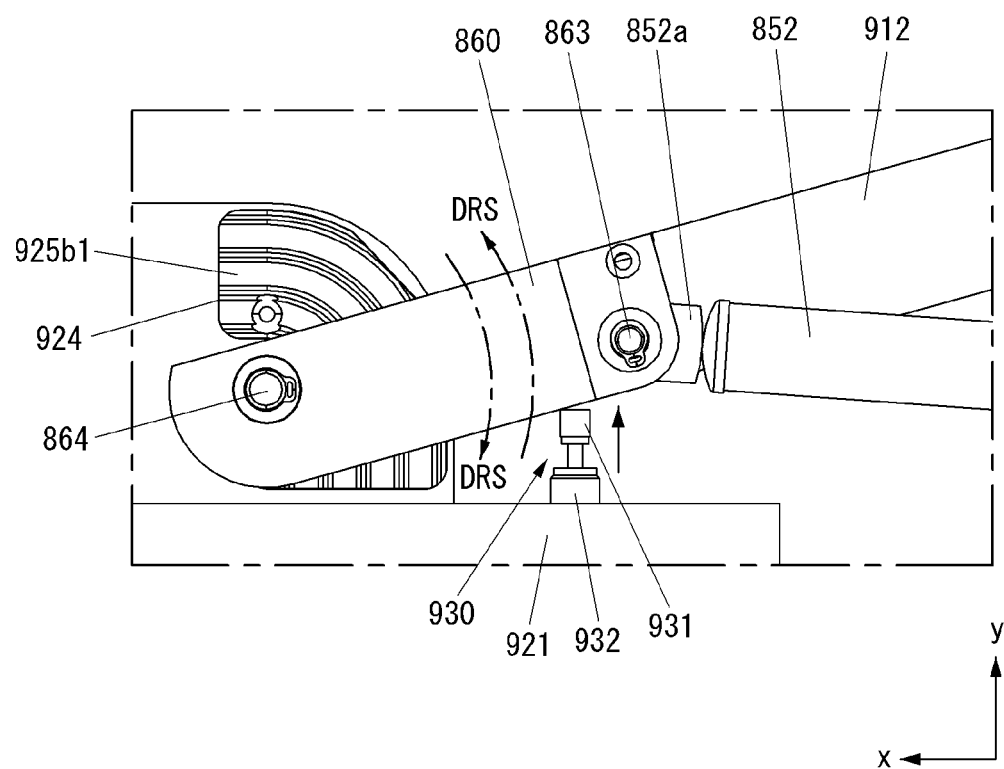

[FIG. 40]
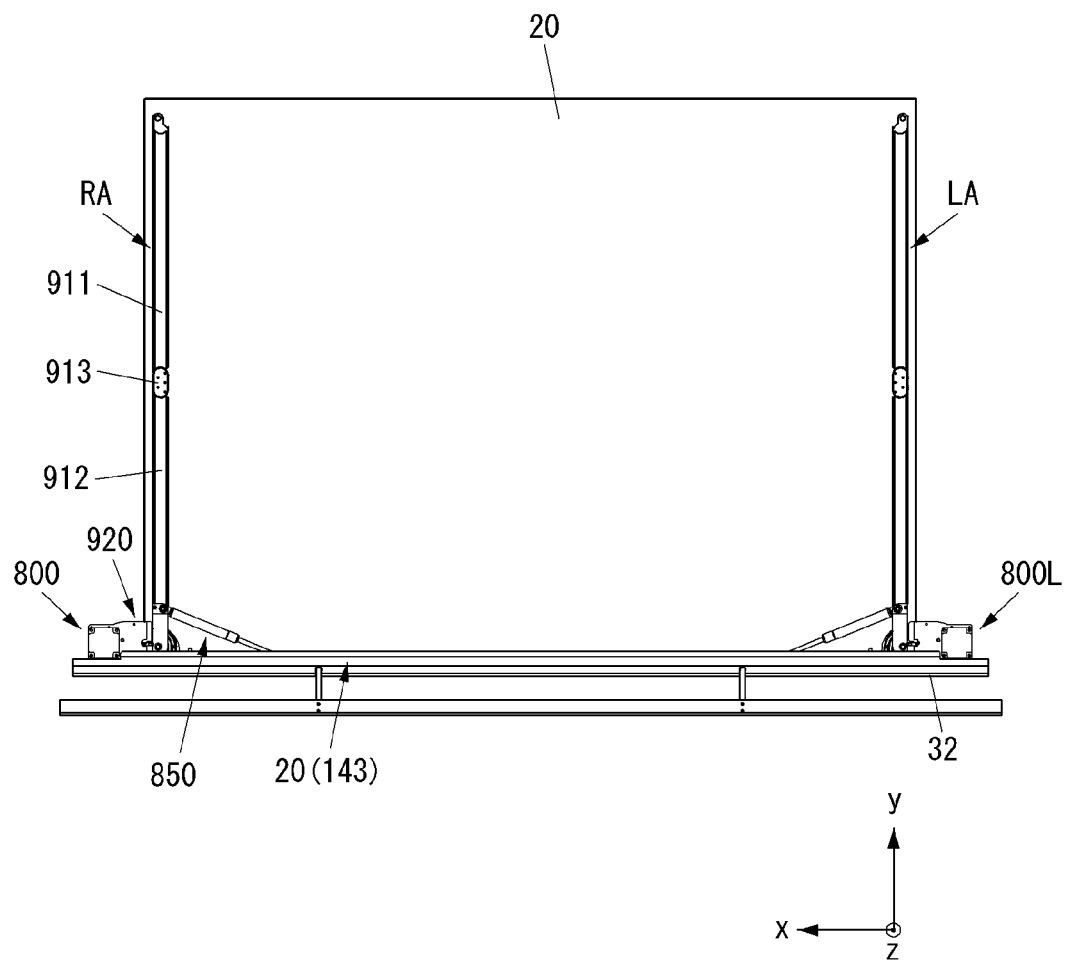

【FIG. 41】
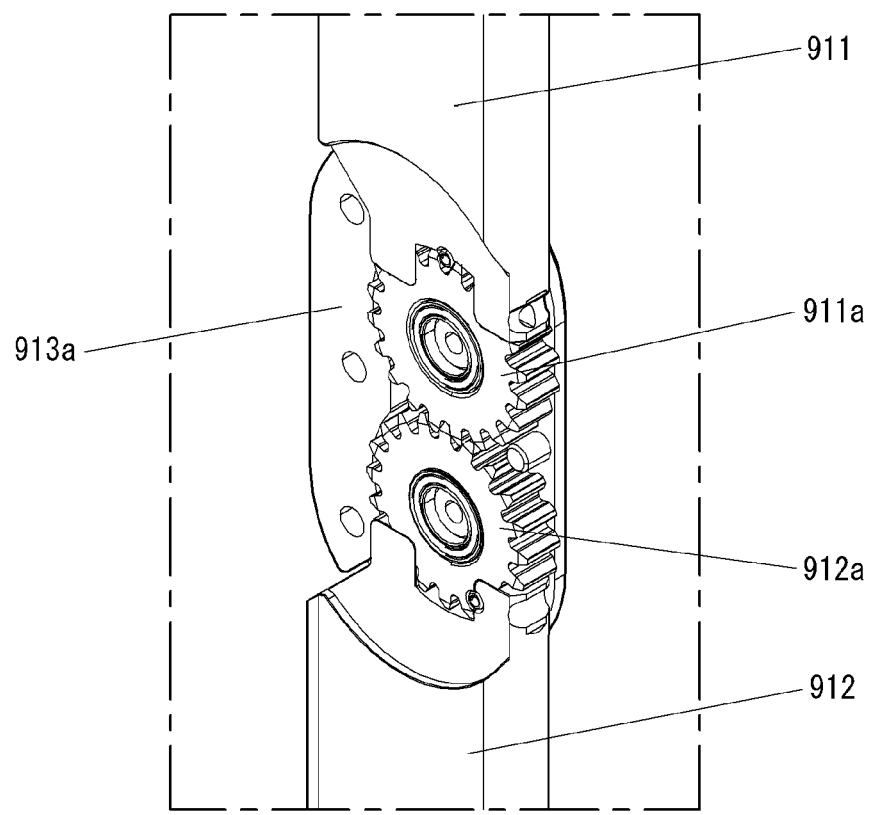

[FIG. 42]
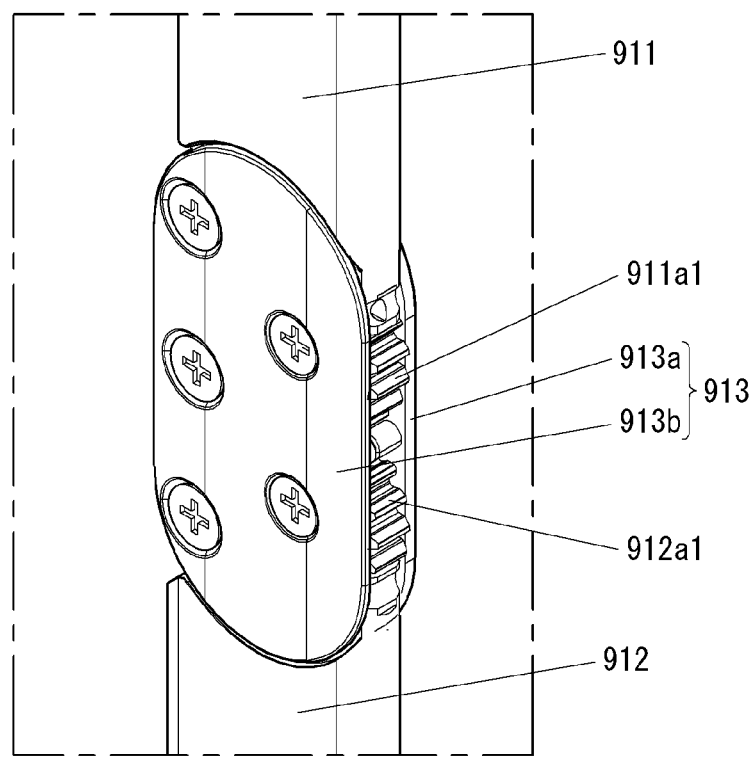

[FIG. 43]
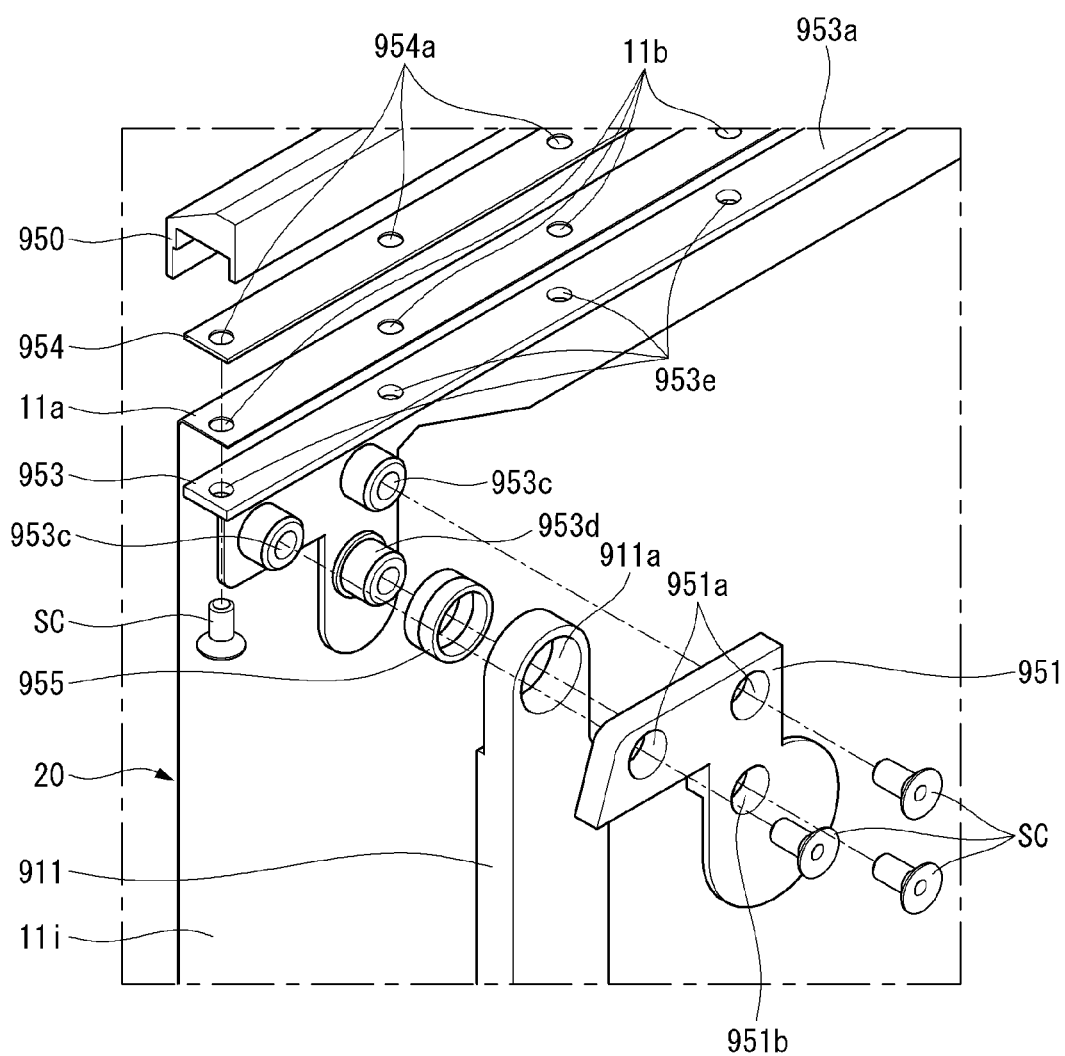

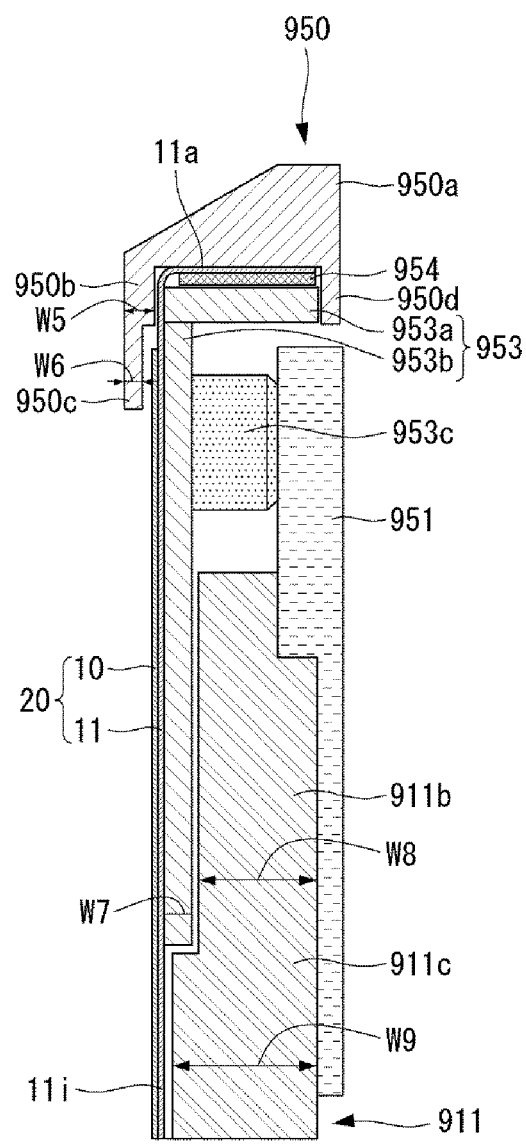
[FIG. 44]

[FIG. 45]
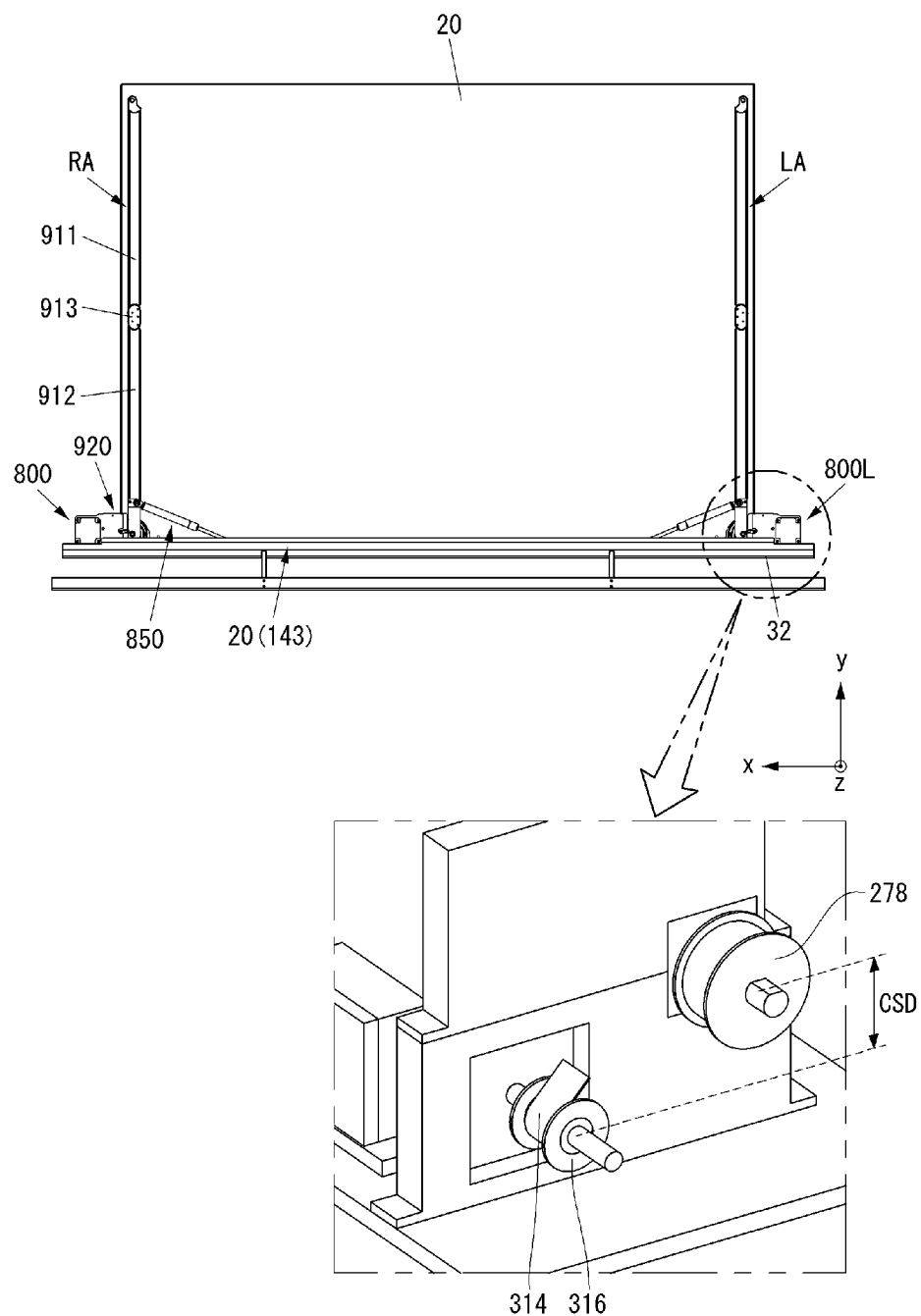

[FIG. 46]
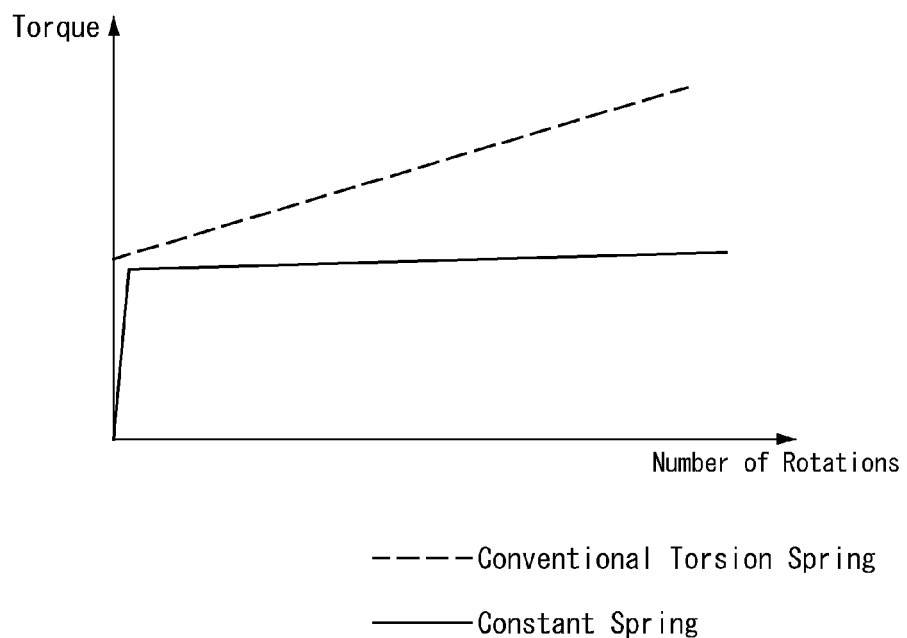

[FIG. 47]
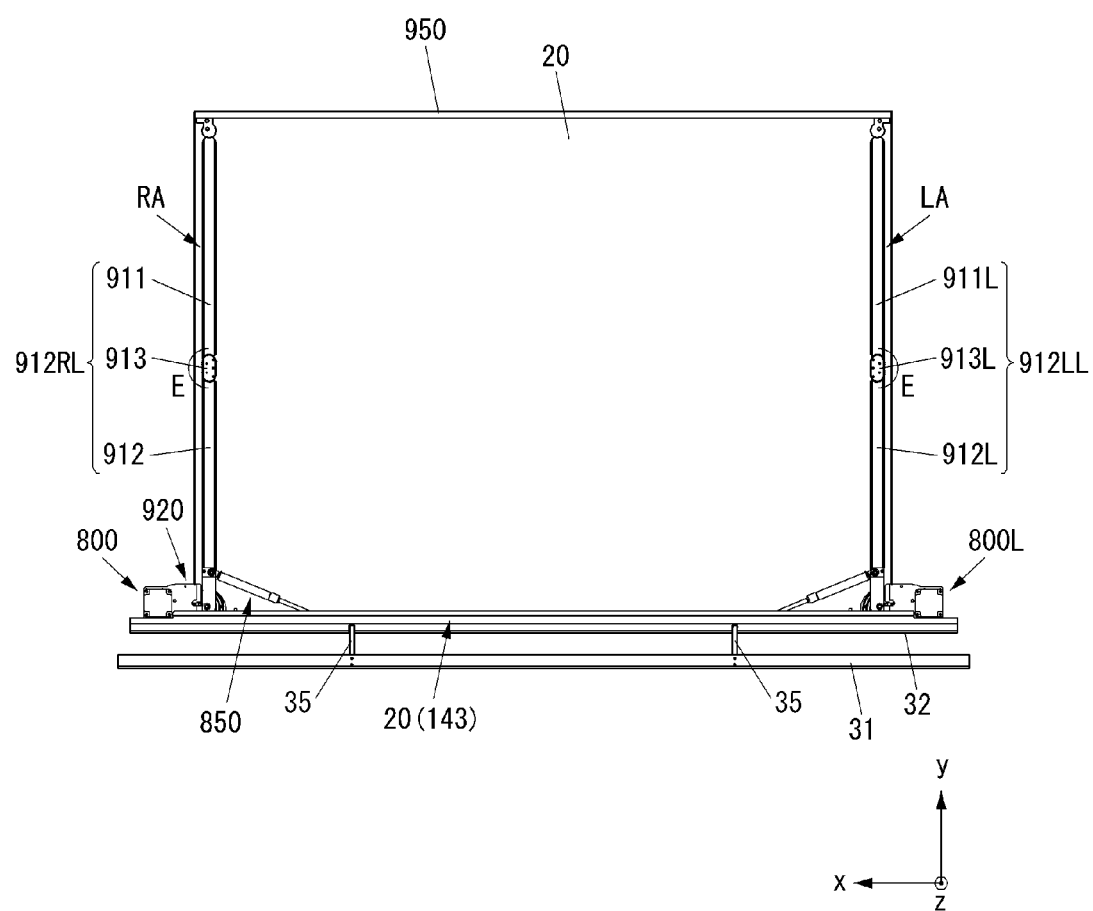

【FIG. 48】
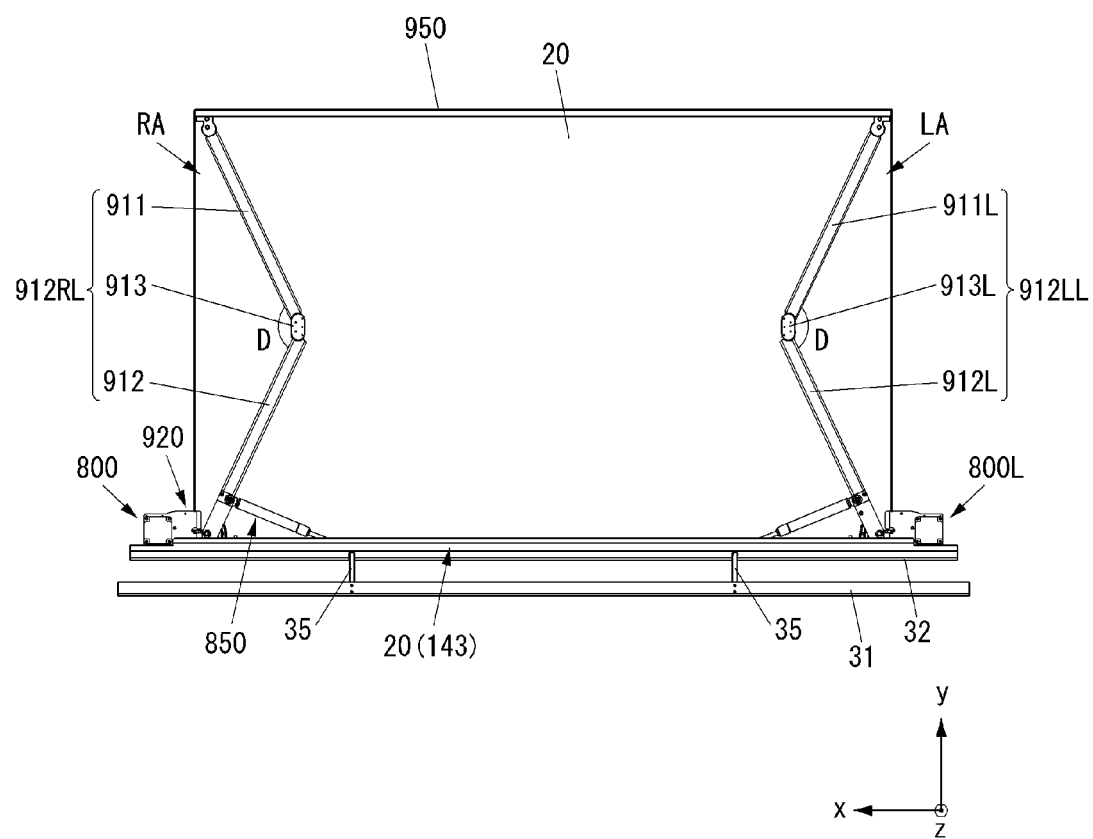

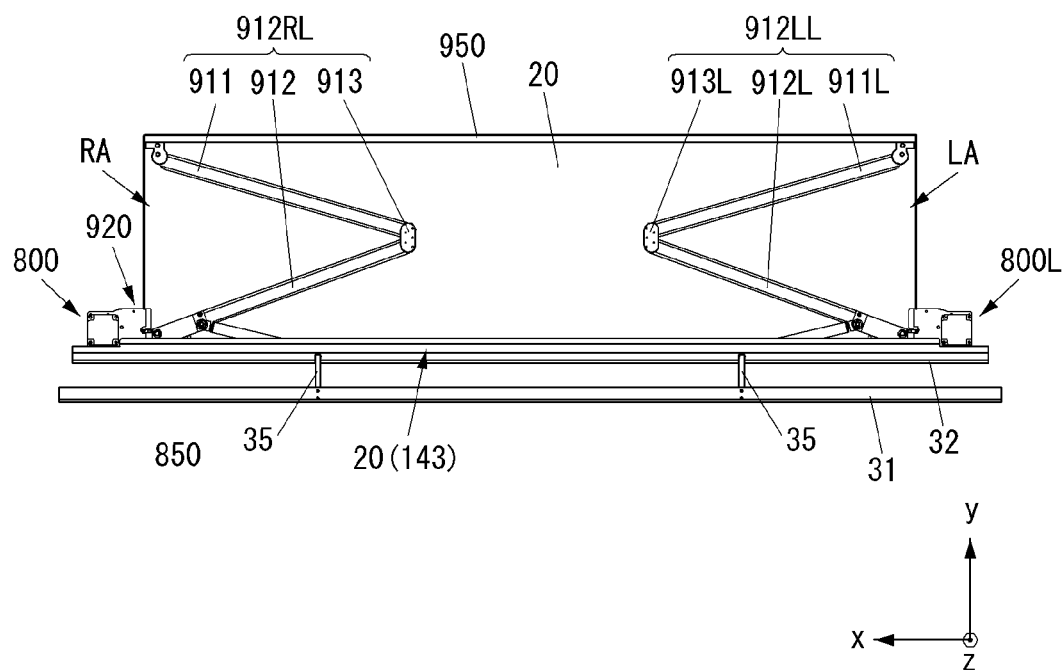
[FIG. 49]

[FIG. 50]
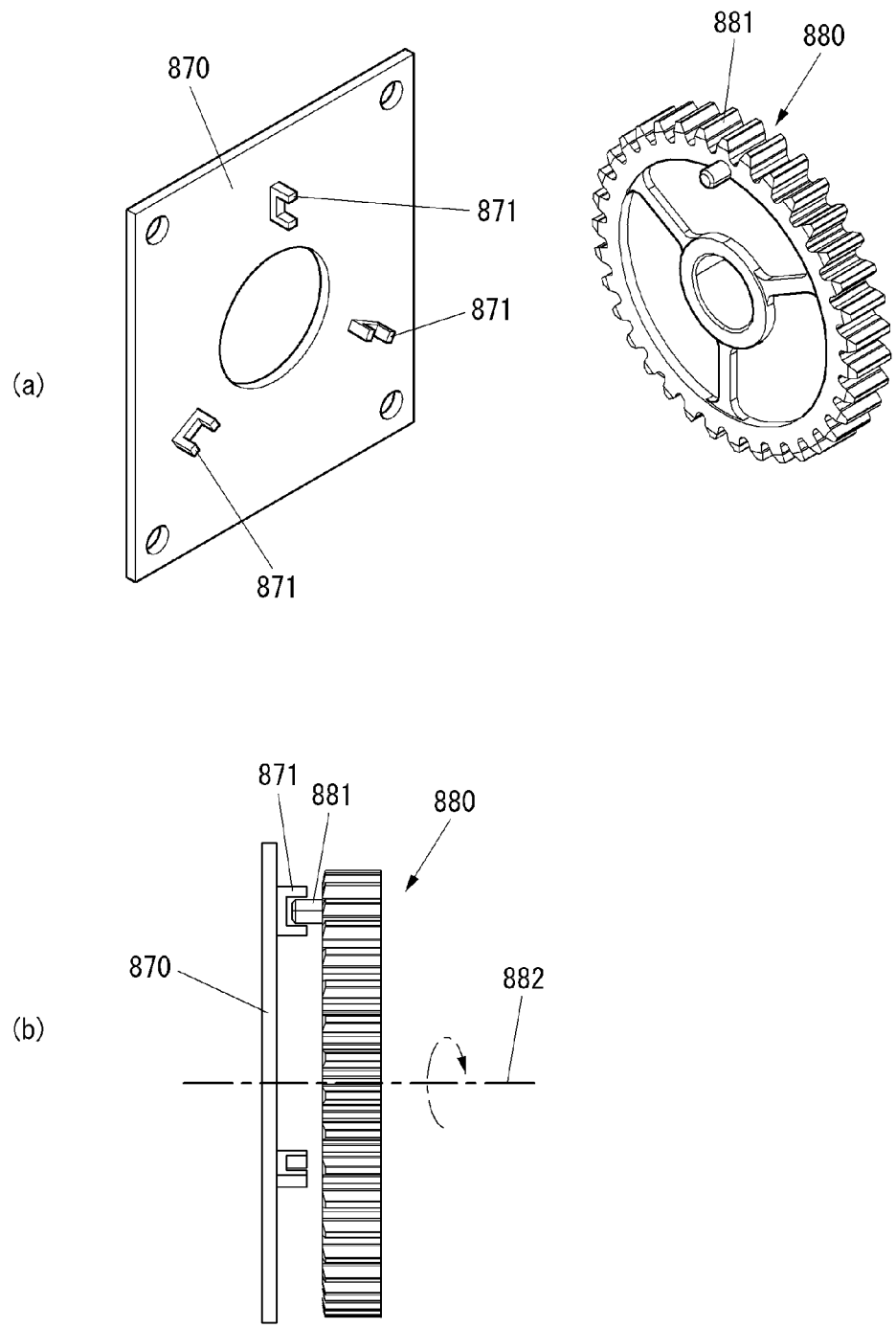

[FIG. 51]
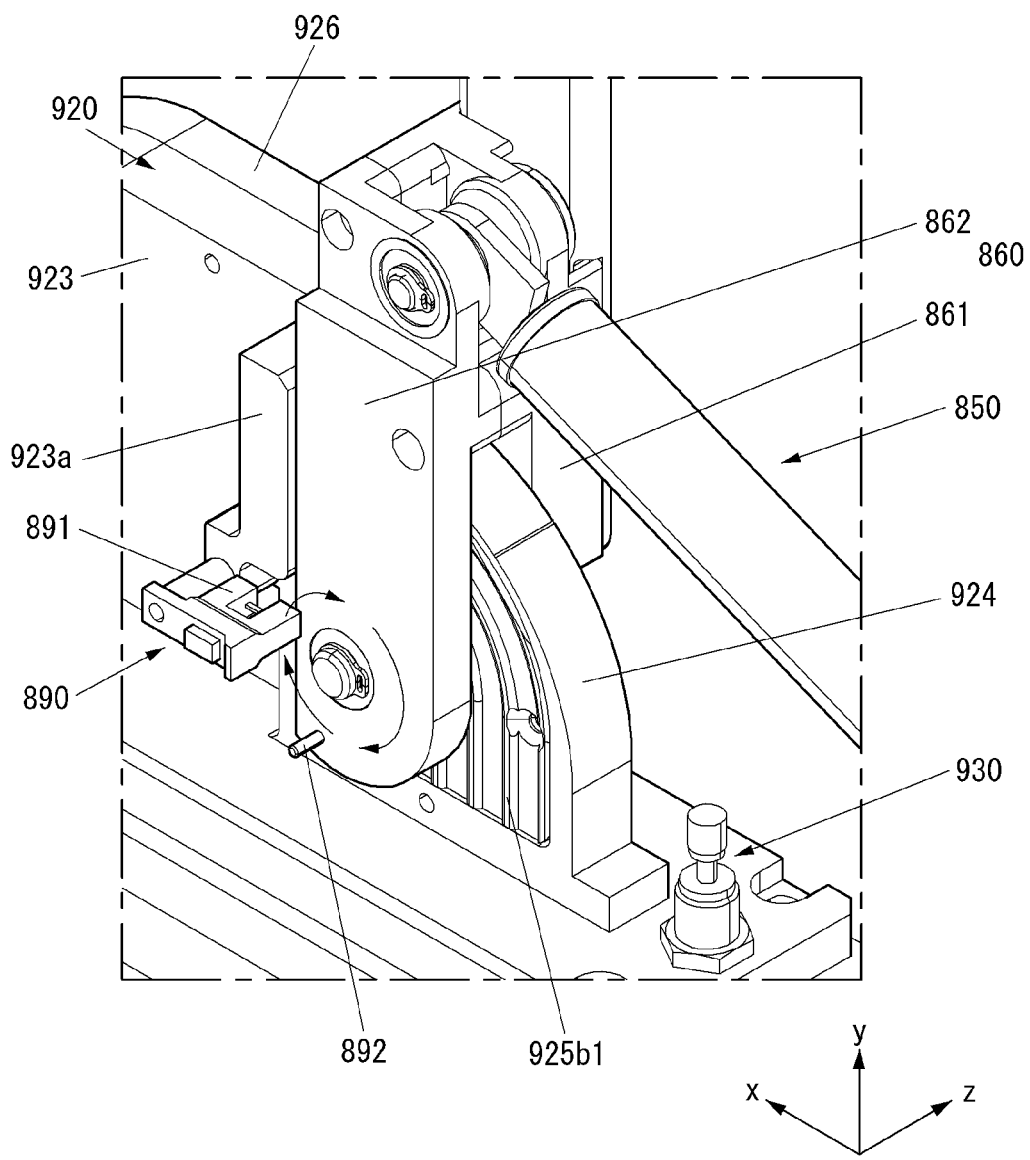

[FIG. 52]
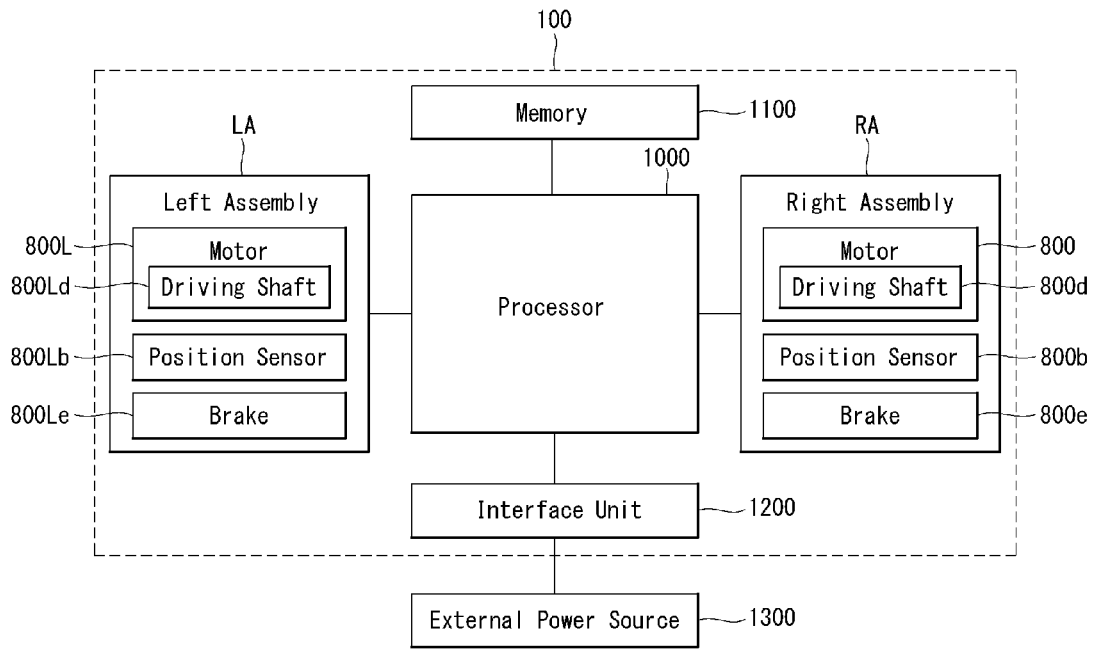
[FIG. 53]
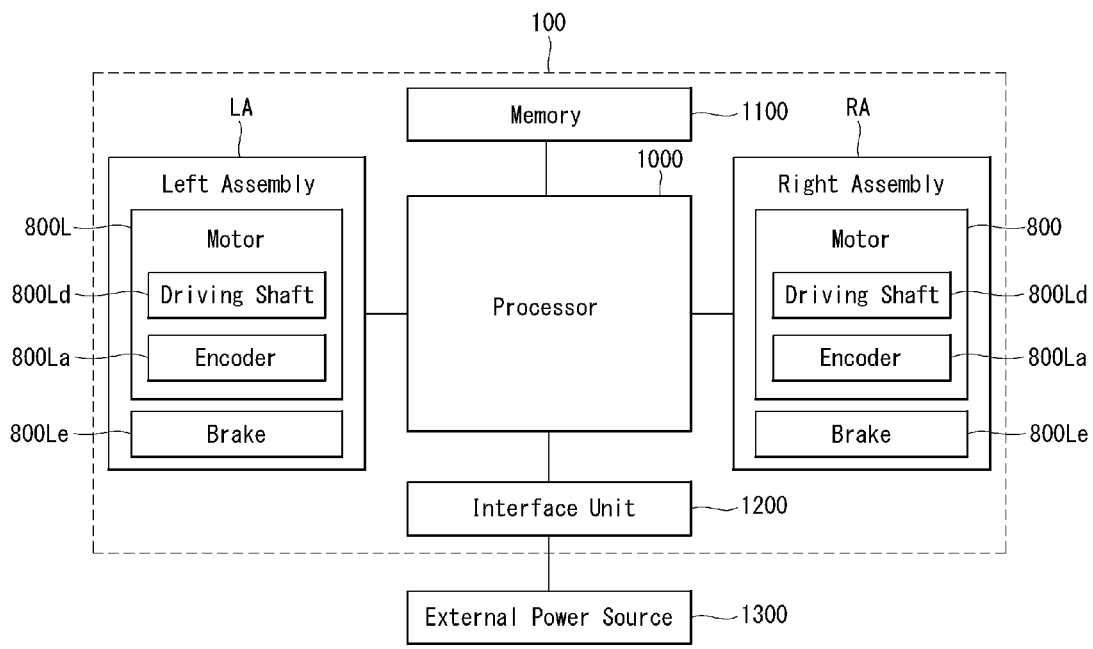

[FIG. 54]
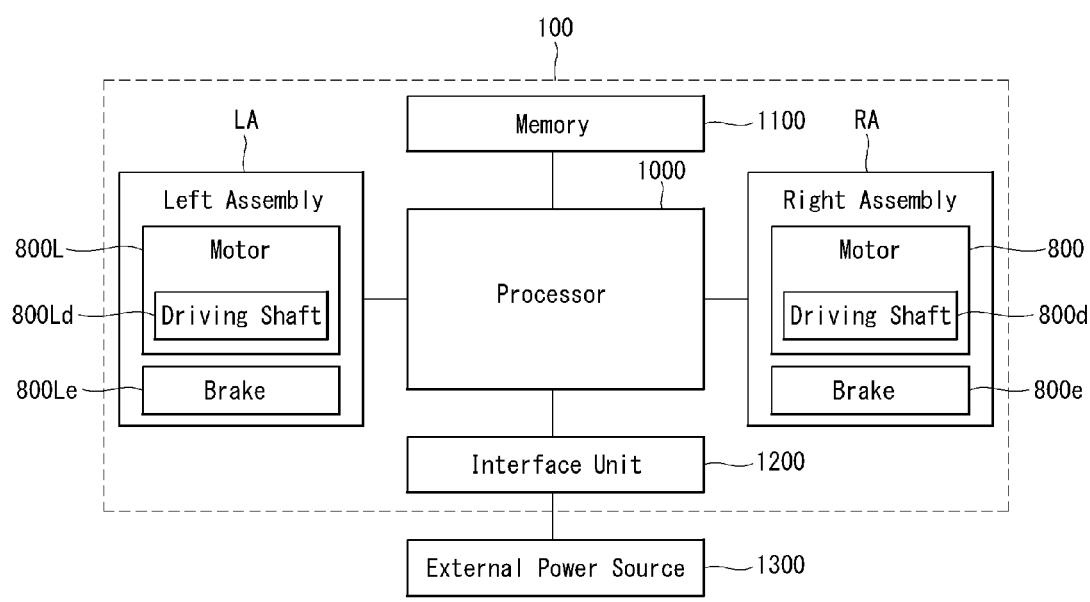

DISPLAY DEVICE

CROSS-REFERENCE TO RELATED APPLICATIONS

This application is the National Stage filing under 35 U.S.C. 371 of International Application No. PCT/KR2020/014014, filed on Oct. 14, 2020, which claims the benefit of earlier filing date and right of priority to Korean Application No. 10-2019-0138434, filed on Nov. 1, 2019, the contents of which are all hereby incorporated by reference herein their entirety.

TECHNICAL FIELD

The present disclosure relates to a display device.

BACKGROUND ART

With the development of the information society, there have been growing demands for various types of display devices, and in order to meet these demands, research has been conducted thereon and various display devices have been used recently, including a liquid crystal display (LCD), a plasma display panel (PDP), an electroluminescent display (ELD), a vacuum fluorescent display (VFD), and the like.

Among them, a display device using an organic light emitting diode (OLED) has excellent luminance and viewing angle characteristics in comparison with a liquid crystal display device, and requires no backlight unit, such that the OLED display device can be implemented as an ultrathin display device.

In addition, a flexible display panel may be bent or rolled around a roller. The flexible display panel may be used to implement a display device that is unrolled from or rolled around the roller as needed. In this case, it is a problem to stably roll or unroll the flexible display around the roller.

DISCLOSURE OF INVENTION

Technical Problem

It is an object of the present disclosure to solve the above and other problems.

It is another object of the present disclosure to provide a display device capable of providing a structure for firmly coupling a link and a gear that transmits torque to the link.

It is yet another object of the present disclosure to provide a display device capable of synchronizing operations of left and right foldable links for causing a display unit to be unrolled from a roller.

It is still another object of the present disclosure to provide a display device capable of synchronizing operations of left and right motors for driving a display unit.

It is still another object of the present disclosure to provide a display device capable of receiving torque for raising foldable links by using a plurality of gears.

It is still another object of the present disclosure to provide a display device including a gas spring for providing a force for raising foldable links.

Technical Solution

In accordance with an aspect of the present disclosure, the above and other objects can be accomplished by providing a display device including: a housing; a roller installed in the housing; a display unit rolled around or unrolled from the roller; a foldable link including a lower link having one side pivotally coupled to the housing, and an upper link having one side pivotally coupled to another side of the lower link and having another side pivotally coupled to an upper portion of the display unit; a motor installed adjacent to the lower link in the housing and configured to provide a driving force; a gear fixed to a driving shaft of the motor; and a link gear coupled to the lower link and engaged with the gear, wherein the lower link is eccentric to an axis of rotation of the link gear, to be coupled to the link gear.

In addition, according to another aspect of the present disclosure, the link gear may include: a body having a disk shape; and teeth formed on a circumference of the body, wherein the body may include: a flat part; a shaft hole formed at a center of rotation of the flat part; and a cut-out part having the shaft hole and formed by cutting out a portion of one surface of the flat part, wherein the cut-out part may be eccentric to the shaft hole.

In addition, according to another aspect of the present disclosure, the display device may further include a link for connecting the link gear with the lower link, wherein the link may include: a bar-shaped body; a lower link coupling part formed at an upper portion of the body; and a gear coupling part formed at a lower portion of the body, wherein the gear coupling part may have a shape corresponding to the cut-out part of the link gear, and is inserted or press-fit into the cut-out part of the link gear.

In addition, according to another aspect of the present disclosure, the gear coupling part may include: a first rectilinear part; a second rectilinear part parallel to the first rectilinear part; and a curved part connecting the first rectilinear part and the second rectilinear part, wherein a distance from the shaft hole to the first rectilinear part may be smaller than a distance from the shaft hole to the second rectilinear part.

In addition, according to another aspect of the present disclosure, the gear coupling part may include: a first rectilinear part; a second rectilinear part parallel to the first rectilinear part; a curved part connected to the first rectilinear part; a third rectilinear part connected to the curved part; and a fourth rectilinear part connecting the third rectilinear part with the second rectilinear part, and tilted with respect to the second rectilinear part, wherein the third rectilinear part may form an obtuse angle with respect to the fourth rectilinear part.

In addition, according to another aspect of the present disclosure, the gear coupling part may include: a first rectilinear part; a second rectilinear part parallel to the first rectilinear part; a first curved part connected to the first rectilinear part; and a second curved part connected to the second rectilinear part, wherein: the first curved part may be convex in a radial direction of the link gear; the second curved part may be concave in the radial direction of the link gear; and the first curved part and the second curved part may form an inflection point.

In addition, according to another aspect of the present disclosure, the second rectilinear part and the second curved part may form an acute angle.

In addition, according to another aspect of the present disclosure, the gear coupling part may include: a first rectilinear part; a second rectilinear part parallel to the first rectilinear part; a first curved part connected to the first rectilinear part; a second curved part connected to the second rectilinear part; a third rectilinear part connected to the first curved part; and a fourth rectilinear part connected to the second curved part, wherein: an extension of the fourth rectilinear part may pass through the shaft hole; and the third rectilinear part and the fourth rectilinear part may form an obtuse angle.

In addition, according to another aspect of the present disclosure, the third rectilinear part and the fourth rectilinear part may form a right angle.

In addition, according to another aspect of the present disclosure, the link gear may further include: a first support hole formed in the cut-out part and having a first distance from the shaft hole; and a second support hole formed in the cut-out part and having a second distance from the shaft hole, wherein the link may further include: a first support boss formed on the gear coupling part and inserted into the first support hole; and a second support boss formed on the gear coupling part and inserted into the second support hole, wherein the second distance may be greater than the first distance.

In addition, according to another aspect of the present disclosure, the link may include: a first fastening hole formed in the gear coupling part and having a first distance from the shaft hole; a second fastening hole formed in the gear coupling part and having a second distance from the shaft hole; and a third fastening hole formed in the gear coupling part and having a third distance from the shaft hole, wherein: the first distance may be greater than the third distance: and the second distance may be greater than the first distance.

In addition, according to another aspect of the present disclosure, the first fastening hole, the second fastening hole, and the third fastening hole may be arranged in an overall triangular shape; the first support hole may be disposed between the first fastening hole and the second fastening hole; and the second support hole may be disposed between the second fastening hole and the third fastening hole.

Advantageous Effects

The display device according to the present disclosure has the following effects.

According to at least one of the embodiments of the present disclosure, a structure for firmly coupling a link and a gear that transmits torque to the link may be provided.

According to at least one of the embodiments of the present disclosure, by using a lead screw, a display unit may be unrolled from a roller while maintaining bilateral symmetry of the display unit rolled around the roller.

According to at least one of the embodiments of the present disclosure, operations of left and right foldable links for causing a display unit to be unrolled from a roller may be synchronized.

According to at least one of the embodiments of the present disclosure, operations of left and right motors for driving a display unit may be synchronized.

According to at least one of the embodiments of the present disclosure, torque for raising foldable links may be received by using a plurality of gears.

According to at least one of the embodiments of the present disclosure, there is provided a display device including a gas spring for providing a force for raising foldable links.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 54 are diagrams according to embodiments of the present disclosure.

MODE FOR CARRYING OUT THE INVENTION

In the following description, the same or similar elements are designated by the same reference numerals, and a redundant description thereof will be omitted.

In the following description, even if an embodiment is described with reference to a specific figure, if necessary, a reference numeral not shown in the specific figure may be referred to, and the reference numeral not shown in the specific figure is used when the reference numeral is shown in the other figures.

In addition, terms, such as first, second, A, B, (a), (b), upper side, lower side, etc., may be used herein when describing components of the present disclosure. These terms are not used to define an essence, order or sequence of a corresponding component but are merely used to distinguish the corresponding component from other component (s).

Terms "module" and "unit" for elements used in the following description are given simply in view of the ease of the description, and do not have a distinguishing meaning or role.

It will be understood that, in the following description, when a first component is referred to as being "connected," "coupled," "mounted," "fastened," "contacted," or "joined" to a second component, the first component may be directly "connected," "coupled," "mounted," "fastened," "contacted," or "joined" to the second component, or a third component may also be "connected," "coupled," "mounted," "fastened," "contacted," or "joined" between the first and second components.

It will be noted that a detailed description of known arts will be omitted if it is determined that the detailed description of the known arts can obscure the embodiments of the present disclosure.

Further, the accompanying drawings are used to help easily understand various technical features and it should be understood that the embodiments presented herein are not limited by the accompanying drawings, and the present disclosure should be construed to extend to any alterations, equivalents and substitutes in addition to those which are particularly set out in the accompanying drawings.

It will be understood that terms, such as height, length, breadth, width, etc., as used herein may be used interchangeably, and do not have a distinguishing meaning or role.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside of the housing 30. The display 20 may display an image on a front surface.

A direction parallel to a longitudinal direction of the housing 30 may be referred to as a first direction DR1. The first direction DR1 may be parallel to a positive or negative x-axis direction. The positive x-axis direction may be referred to as a right direction. The negative x-axis direction may be referred to as a left direction. A direction in which the display unit 20 displays an image may be referred to as a positive z-axis direction, a forward direction or the front. A direction opposite to the direction in which the display unit 20 displays the image may be referred to as a negative z-axis direction, a rearward direction or the rear. A third direction DR3 may be parallel to the positive or negative z-axis direction. A direction parallel to a height direction of the display device 100 may be referred to as a second direction DR2. The first direction DR2 may be parallel to a positive or negative y-axis direction. The positive y-axis direction may be referred to as an upward direction. The negative y-axis direction may be referred to as a downward direction. A third direction DR3 may be a direction perpendicular to the first direction DR1 and/or the second direction DR2.

The first direction DR1 and the second direction DR2 may be collectively referred to as a horizontal direction. Also, the third direction DR2 may be referred to as a vertical direction.

A left-to-right direction LR may be parallel to the first direction DR1, and an up-down direction UD may be parallel to the second direction DR2.

Referring to FIG. 2, the entire display unit 20 may be located inside the housing 30. At least a portion of the display unit 20 may be located outside of the housing 30. A degree of exposure of the display unit 20 to the outside of housing 30 may be adjusted as needed.

Referring to FIG. 3, the display panel 10 may be flexible. For example, the display panel 10 may be an Organic Light Emitting Display (OLED). The display panel 10 will be described below by using the OLED as an example, but may also be applied to a Liquid Crystal Display Device (LCD), a Plasma Display Panel (PDP), and a Field Emission Display (FED).

The display panel 10 may have a front surface for displaying an image. The display panel 10 may have a rear surface disposed opposite the front surface. The front surface of the display panel 10 may be covered with a light-transmitting material. For example, the light-transmitting material may be glass, resin, or plastic.

A plate 11 may be coupled to the rear surface of the display panel 10. The plate 11 may be coupled, fastened, or attached to the rear surface of the display panel 10. The plate 11 may include a metal material. The plate 11 may be referred to as a module cover 11, a cover 11, a display panel cover 11, or a panel cover 11.

A resin layer 14 may be coupled to a rear surface of the plate 11. The resin layer 14 may cover the plate 11. The plate 11 may not be exposed to the outside by the resin layer 14.

Referring to FIG. 4, the plate 11 may include a plurality of holes 12. The plate 11 may include a region in which the holes 12 are formed, and regions 11f, 11g, and 11h in which the holes 12 are not formed. The regions 11f, 11g, and 11h, in which the holes 12 are not formed, may surround the region in which the holes 12 are formed. The regions 11f, 11g, and 11h, in which the holes 12 are not formed, may protect edges of the display panel 10. The holes 12 may also be referred to as openings 12.

The first region 11g in which the holes 12 are not formed, the region in which the holes 12 are formed, and the second region 11h in which the holes 12 are not formed may be sequentially located along the leftward-rightward direction LR of the plate 11. A width in the leftward-rightward direction LR of the first region 11g may be a2. A width in the leftward-rightward direction LR of the region in which the holes 12 are formed may be a1. A width in the leftward-rightward direction LR of the second region 11h may be a3.

A third region 11f in which the holes 12 are not formed and the region in which the holes 12 are formed may be sequentially located along the up-down direction UD of the plate 11. A height in the up-down direction UD of the third region 11f may be b2. A height in the up-down direction UD of the region in which the holes are formed may be b1.

The third region 11f in which the holes 12 are not formed may be coupled to an instrument. For example, the instrument may be an upper bar. The upper bar may be coupled to a link.

The holes 12 may pass through the plate 11. The holes 12 may be formed by perforating the plate 11. The holes 12 may be slits 12a and 12b. The slits 12a and 12b may have an elongated shape along the leftward-rightward direction LR of the plate 11. The holes 12 may include a relatively long slit 12a and a relatively short slit 12b.

The relatively long slit 12a may have a breadth d8 and a width d9. The relatively short slit 12b may have a breadth d10 and the width d9.

The slits 12a and 12b may be spaced apart from each other in the leftward-rightward direction LR. The neighboring slits 12a and 12b may be disposed with a predetermined distance d2 therebetween.

The slits 12a and 12b may be spaced apart from each other in the up-down direction UD. The neighboring slits 12a and 12b may be disposed with a predetermined distance d1 therebetween.

As the distances d1 and d2 between the slits 12a and 12b decrease, the plate 11 may be easily rolled or unrolled. As the distances d1 and d2 between the slits 12a and 12b increase, elasticity of the plate 11 may increase.

The display panel 10 may have a very small thickness. The display panel 10 may be easily wrinkled due to the small thickness. The display panel 10 may be easily damaged by an external impact due to the small thickness.

The plate 11 may be fixed to the display panel 10 to enhance rigidity of the display panel 10. The plate 11 may support the display 10 to prevent the display panel 10 from being wrinkled.

The plate 11 may be a metal material having high rigidity. The plate 11 is preferably made of a material having high elasticity. Having the slits 12a and 12b, the plate 11 may be rolled around or unrolled from a roller 143. As the plate 11 has the slits 12a and 12b, permanent deformation of the plate 11 may not occur even when the plate 11 is rolled around or unrolled from the roller 143.

An adhesive layer 13 may be formed on the rear surface of the display panel. The display panel 10 may be fixed to the plate 11 by the adhesive layer 13. The display panel 10, the adhesive layer 13, and the plate 12 may be integrally formed with each other to form the display unit, and may be rolled around or unrolled from the roller 143.

The slits 12a and 12b may be arranged in rows and columns. Odd-numbered rows r1, r3, r5, r7, r9, r11, r13, r15, r17, r19, r21, r23, and r25 may be formed by the relatively long slits 12a. The slits 12a in the odd-numbered rows r1, r3, r5, r7, r9, r11, r13, r15, r17, r19, r21, r23, and r25 may form columns t1, t2, t3, t4, t5, t6, t7, and t8.

Even-numbered rows r2, r4, r6, r8, r10, r12, r14, r16, r18, r20, r22, and r24 may be formed by the relatively short slits 12b and the relatively long slits 12a. The slits 12a and 12b in the even-numbered rows may form columns. The slits 12a in the even-numbered rows r2, r4, r6, r8, r10, r12, r14, r16, r18, r20, r22, and r24 form columns s1, s2, s3, s4, s5, s6, s7, s8, and s9.

The relatively short slits 12b and the relatively long slits 12a may be alternately arranged along the up-down direction UD. The relatively short slits 12*b* may be disposed on both sides of the even-numbered rows r2, r4, r6, r8, r10, r12, r14, r16, r18, r20, r22, and r24 in the left-to-right direction LR.

A straight line 11 connecting a center c221 of a first slit 12*b*221 in the twenty-second row r22 and a center c222 of a second slit 12*a*222 in the twenty-second row r22 may pass through centers of the rest of the slits in the twenty-second row r22.

A straight line 12 connecting a center c231 of a first slit 12*b*231 in the twenty-third row r23 and a center c232 of a second slit 12*a*232 in the twenty-third row r23 may pass through centers of the rest of the slits in the twenty-third row r23.

A straight line 13 connecting a center c241 of a first slit 12*b*241 in the twenty-fourth row r24 and a center c242 of a second slit 12*a*242 in the twenty-fourth row r24 may pass through centers of the rest of the slits in the twenty-fourth row r24.

A straight line 14 connecting a center c251 of a first slit 12*b*251 in the twenty-fifth row r25 and a center c252 of a second slit 12*a*252 in the twenty-fifth row r25 may pass through centers of the rest of the slits in the twenty-fifth row r25.

A straight line 15 connecting a center c221 of an eleventh slit 12*b*221 in the first column sl of the even-numbered rows r2, r4, r6, r8, r10, r12, r14, r16, r18, r20, r22, and r24 and a center c241 of a twelfth slit 12*b*241 in the first column sl may pass through centers of the rest of the slits in the first column s21.

A straight line 16 connecting a center c231 of a twelfth slit 12*b*231 in the first column tl of the odd-numbered rows rl, r3, r5, r7, r9, r11, r13, r15, r17, r19, r21, r23, and r25 and a center c251 of a thirteenth slit 12*a*251 in the first column tl may pass through centers of the rest of the slits in the first column tl.

A straight line 17 connecting a center c222 of an eleventh slit 12*b*222 in the second column s2 of the even-numbered rows r2, r4, r6, r8, r10, r12, r14, r16, r18, r20, r22, and r24 and a center c242 of a twelfth slit 12*b*242 in the second column s2 may pass through centers of the rest of the slits in the second column s2.

A straight line 18 connecting a center c232 of a twelfth slit 12*b*232 in the second column t2 of the odd-numbered rows r1, r3, r5, r7, r9, r11, r13, r15, r17, r19, r21, r23, and r25 and a center c252 of a thirteenth slit 12*b*252 in the second column t2 may pass through centers of the rest of the slits in the second column t2.

Referring to FIGS. 5 and 6, a first resin layer 14 and the plate 11 may be coupled to each other through a lamination process. The plate 11 may be placed on the first resin layer 14. The plate 11 and the first resin layer 14 may be heated by a heating device. The first resin layer 14 may be partially melted. The melted first resin layer 14 may be adhered to the plate 11. The melted first resin layer 14 may fill the holes 12 of the plate 11. The plate 11 may be accommodated in the first resin layer 14.

When the heated plate 11 and the first resin layer 14 are cooled, the plate 11 and the first resin layer 14 may be integrally formed. A front surface of a coupling body of the plate 11 and the first resin layer 14 may be flat.

Referring to FIGS. 7 and 8, the adhesive layer 13 may be formed on a rear surface of the display panel 10. The adhesive layer may fix the display panel 10 to the plate 11. As the front surface of the coupling body of the plate 11 and the first resin layer 13 is flat, the adhesive layer 13 may fix the display panel 10 to the first resin layer 14.

The first resin layer 14 may be made of a material having high ductility. For example, the first resin layer 14 may be made of urethane or rubber.

The display panel 10, the adhesive layer 13, the plate 11, and the first resin layer 14 may be integrally formed to form the display unit, and may be rolled around or unrolled from the roller 143.

Referring to FIG. 9, a lower end of the display panel 10 may be connected to the roller 143. The display panel 10 may be rolled around or unrolled from the roller 143.

A front surface of the display panel 10 may be coupled to a plurality of source PCBs 120. The plurality of source PCBs 120 may be spaced apart from each other.

A source chip-on film (COF) 123 may connect the display panel 10 and the source PCBs 120. The source COF 123 may be located on the front surface of the display panel 10.

The roller 143 may include a first part 331 and a second part 337. The first part 331 and the second part 337 may be fastened by a screw. A timing controller board 105 may be mounted in the roller 143.

The source PCBs 120 may be electrically connected to the timing controller board 105. The timing controller board 105 may transmit digital video data and a timing control signal to the source PCBs 120.

A cable 117 may electrically connect the source PCBs 120 and the timing controller board 105. For example, the cable 117 may be a flexible flat cable (FFC). The cable 117 may pass through a hole 331*a*. The hole 331*a* may be formed in a seating part 379 or the first part 331. The cable 117 may be disposed between the display panel 10 and the second part 337.

The seating part 379 may be formed on an outer circumference of the first part 331. The seating part 379 may be formed as a stepped portion formed on the outer circumference of the first part 331. The seating part 379 may form a space B. When the display unit 20 is rolled around the roller 143, the source PCBs 120 may be accommodated in the seating part 379. As the source PCBs 120 are accommodated in the seating part 379, the source PCBs 120 may not be twisted or bent, and durability may be improved.

The cable 117 may electrically connect the timing controller board 105 and the source PCBs 120.

Referring to FIG. 10, a base 32 may have a plate shape. The base 32 may be elongated in the x-axis direction.

A fastening part 921 may be installed on an upper surface of the base 32. The fastening part 921 may have a plate shape. The fastening part 921 may be fixed to the upper surface of the base 32. The fastening part 921 may be fastened to the base 32 by a fastening member SC.

A link mount 924 may be formed on an upper surface of fastening part 921. The link mount 924 may be integrally formed with the fastening part 921. The link mount 924 may include a hole 924*a*. The hole 924*a* may pass through the link mount 924 in the z-axis direction. The link mount 924 may include a wall 924*c*1 protruding in the z-axis direction. The wall 924*c*1 may form a receiving space 924*b*1. The wall 924*c*1 may be formed along a circumference of the hole 924*a*.

A gear mount 923 may be formed on the upper surface of the fastening part 921. The gear mount 923 may be integrally formed with the fastening part 921. The gear mount 923 may be located on the right side of the link mount 924. The gear mount 923 may be integrally formed with the link mount 924. The gear mount 923 may include holes 923*a*1 and 923*a*2. The holes 923*a*1 and 923*a*2 may pass through the gear mount 923 in the z-axis direction. The first hole 923*a*1 may be located on the right side of the second holes 923*a*2.

The gear mount 923 may include walls 923c1 and 923c2 protruding in the positive z-axis direction. The first wall 923c1 may form a first receiving space 923b1. The first wall 923c1 may be formed along a circumference of the first hole 923a1. The second wall 923c2 may form a second receiving space 923b2. The second wall 923c2 may be formed along a circumference of the second hole 923a2. The first receiving space 923b1 may be located on the right side of the second receiving space 923b2.

A motor mount 922 may be formed on the upper surface of the fastening part 921. The motor mount 922 may be integrally formed with the fastening part 921. The motor mount 922 may be located on the right side of the gear mount 923. The motor mount 922 may be integrally formed with the gear mount 923. The motor mount 922 may include a hole 922a. The hole 922a may pass through the motor mount 922 in the z-axis direction. The motor mount 922 may include a wall 922c1 protruding in the positive z-axis direction. The wall 922c1 may form a receiving space 922b. The wall 922c1 may be formed along a circumference of the hole 922a.

The walls 922c1, 923c1, 923c2, and 924c1 may be connected to each other. The receiving spaces 922b, 923b1, 923b2, and 924b1 may communicate with each other. The hole 921a may be formed on the upper surface of the fastening part 921. The hole 921a may pass through the fastening part 921 in the y-axis direction. The hole 921a may be located on the left side of the link mount 924. The hole 921a, the link mount 924, the gear mount 923, and the motor mount 922 may be sequentially located in the x-axis direction.

Referring to FIG. 11, the motor mount may include a wall protruding in the negative z-axis direction. The wall may be formed along a circumference of a hole.

The link mount 924 may include a wall 924c2 protruding in the negative z-axis direction. The wall 924c may form a receiving space 924b2. The wall 924c2 may be formed along a circumference of the hole 924a.

A shock absorber 930 may be formed in the hole 921a. The shock absorber 930 may be referred to as a pusher 930, a lifter 930, an absorber 930, or a damper 930.

Referring to FIG. 12, a motor 800 may be fastened to a rear surface of the motor mount 922. The motor 800 may be fixed to a motor mount 920. A driving shaft 800d of the motor 800 may be inserted into a hole 922a. The driving shaft 800d may be referred to as a rotating shaft 800d. The driving shaft 800d of the motor 800 may be coupled to a gear 810. As the driving shaft 800d is rotated, the gear 810 may be rotated together with the driving shaft 800d. The gear 810 may be located in the receiving space 922b. The wall 922c1 may surround the gear 810.

A guide plate 925a1 may be fastened to a front surface of the link mount 924 by the fastening member SC. The guide plate 925a1 may be fixed to the receiving space 924b1. The guide plate 925a1 may include a plurality of guides 925a2. The guide plate 925a1 may include a guide groove 925a3 formed between neighboring guides 925a2. Lubricating oil may be coated over the guide plate 925a1.

A brake 800e may be installed inside the motor 800 or at the front of the motor 800 or at the rear of the motor 800. In the case where the brake 800e is located at the rear of the motor 800, the driving shaft 800d may pass through the motor 800, and the motor 800 may be installed at the driving shaft 800d. The brake 800e may include a disk 800e1 and a caliper 800e2. The disk 800e1 may be coupled to the driving shaft 800d. Alternatively, the disk 800e1 may be integrally formed with the driving shaft 800d. By holding the disk 800e1, the caliper 800e2 may brake rotation of the disk 800e1. The caliper 800e2 may include a pad that comes into contact with or is separated from the disk 800e1. The pad comes into contact with the disk 800e1 and generates a frictional force, thereby braking the rotation of the disk 800e1.

Referring to FIG. 13, the motor 800 may be fastened to a wall 922c2 by the fastening member SC. A guide plate 925b1 may be fastened to a rear surface of the link mount 924 by the fastening member SC. The guide plate 925b1 may be fixed to the receiving space 924b2. The guide plate 925b1 may include a plurality of guides 925b2. The guide plate 925b1 may include a guide groove 925b3 formed between neighboring guides 925b2.

Referring to FIG. 14, a gas spring 850 may include a cylinder 852 and a piston 851. The piston 951 may linearly reciprocate along the cylinder 852. The piston 851 may be moved into the cylinder 852 or may be moved out of the cylinder 852. The cylinder 852 may contain gas. The gas may be sealed by the cylinder 852 and the piston 851. When the piston 851 is pushed into the cylinder 852, the gas may be compressed. When the gas is compressed, the gas may provide a restoring force to the piston 851. The restoring force may be an expanding force of gas. When the gas is compressed, the gas may push the piston 851. The gas spring 850 may be replaced with an oil hydraulic cylinder, a pneumatic cylinder or an air cylinder, or an actuator. The piston 851 may have a coupling part 851a formed at one end thereof. The coupling part 851a may have a hole 851b. The mount 853 may have a hole 853a. The coupling part 851a may be coupled to the mount 853. A rotating shaft 854 may pass through the hole 853a. The rotating shaft 854 may be fixed to the mount 853. Alternatively, the rotating shaft 854 may be rotated with respect to the mount 853. The piston 851 may be rotated with respect to the rotating shaft 854. Alternatively, the piston 851 may be fixed to the rotating shaft 854, and may be rotated together with the rotating shaft 854 with respect to the mount 853. The other end of the piston 851 may be located inside the cylinder 852. The cylinder 852 may include a coupling part 852a formed at one end thereof. The coupling part 852a may have a hole 852b.

A link 860 may include a first part 861 and a second part 862. The first part 861 may have a bar shape. The first part 861 may have a hole 861a formed at one end thereof. The first part 861 may have a hole 861b formed at the other end thereof. The first part 861 may include a stepped portion 861c formed on a circumference of the hole 861b. The first part 861 may include a protruding part 861d protruding in the negative z-axis direction. The protruding portion 861d may be adjacent to the hole 861b.

The stepped portion 861c may have a plurality of holes 865a. The plurality of holes 865a may surround the hole 865c. A gear 865 may be fastened to the stepped portion 861c by a fastening member SC1. The gear 865 may be fixed to the stepped portion 861c. The plurality of coupling parts SC1 may pass through the gear 865 and may be coupled to the plurality of holes 865a. The gear 865 may have a hole 861c. The stepped portion 861c may include a protrusion 861d protruding in the positive z-axis direction. The protrusion 861d may be inserted into the hole 856b. The protrusion 861d may guide a coupling position of the gear 865.

The second part 862 may have a bar shape. The second part 862 may have a hole 862a formed at one end thereof. The second part 862 may have a hole 862b formed at the other end thereof. The second part 862 may include a protruding portion 862d protruding in the positive z-axis direction. The protrusion 862d may be adjacent to the hole 862b.

The first part 861 and the second part 862 may be fastened to each other by a fastening member. The first part 861 and the second part 862 may face each other. The holes 861a and 862a may face each other. The protruding parts 861d and 862d may come into contact with each other. A rotating shaft 863 may pass through the holes 861a, 852b, and 862a. The rotating shaft 863 may pass through the first part 861, the coupling part 852a, or the second part 862. The link 860 may rotate or pivot with respect to the rotating shaft 863. Alternatively, the rotating shaft 863 may be fixed to the link 860. The cylinder 852 may be rotated with respect to the rotating shaft 863. Alternatively, the cylinder 852 may be fixed to the rotating shaft 863 and may be rotated together with the rotating shaft 863 with respect to the link 860. The rotating shaft 864 may pass through the holes 865c, 861b, and 862b. The rotating shaft 864 may be referred to as a pivot shaft 864. The rotating shaft 864 may pass through the gear 865, the first part 861, or the second part 862. The link 860 may rotate with respect to the rotating shaft 864. Alternatively, the rotating shaft 864 may be fixed to the link 860. The first part 861 and the second part 862 may be integrally formed with each other. The pivot shaft 864 of the link 860 may coincide or align with the rotating shaft 864 of the second part 862.

Referring to FIG. 15, a gap 860a may be formed between the first part 861 and the second part 862. The link mount 924 or the guide plates 925a1 and 925b1 may be disposed in the gap 860a. The rotating shaft 864 may pass through the link mount 924 or the guide plates 925a1 and 925b1. The rotating shaft 864 may pass through the hole 924a. The link 860 may rotate with respect to the rotating shaft 864. The link 860 may rotate or pivot with respect to the link mount 924. The guide plate may guide rotation or pivot of the link. Lubricating oil may be coated over the guide plate 925b1. The Lubricating oil may reduce friction between the guide plates 925a1 and 925b1 and the link 860.

A hole 32j may be formed on the upper surface of the base 32. The hole 32j may be located on the left side of the mount 920. The hole 32j may pass through the base 32 in the y-axis direction. The mount 853 may be disposed in the hole 32j. At least a portion of the mount 853 may be disposed in the hole 32j. The mount 853 may be installed or fixed to the base 32 by the fastening member SC. The piston 851 may rotate or pivot with respect to the base 32.

If an angle A formed between the piston 851 and the base 32 decreases, at least a portion of the coupling part 851a or at least a portion of the piston 851 may be disposed in the hole 32j.

Referring to FIG. 16, the gears 810, 820, 830, and 865 may be spur gears. The gear 820 may be mounted on the gear mount 923. The gear 820 may be received in the receiving space 923b1. The wall 923c1 may surround the gear 820. The rotating shaft 823 may be inserted into the hole 923a1. The rotating shaft 823 may be rotated with respect to the gear mount 923. Alternatively, the rotating shaft 823 may be fixed to the gear mount 923. The gear 820 may be coupled to the rotating shaft 823. The gear 820 may be rotated with respect to the rotating shaft 823. Alternatively, the gear 820 may be fixed to the rotating shaft 823. Alternatively, the gear 820 may be integrally formed with the rotating shaft 823. The gear 820 may be a double gear. The gear 820 may include a primary gear 821 and a secondary gear 822. The rotating shaft 823 of the primary gear 821 may be the same as the rotating shaft 823 of the secondary gear 822. The primary gear 821 and the secondary gear 822 may be integrally formed with each other. The secondary gear 822 may have a greater diameter than the primary gear 821. The secondary gear 822 may have a greater number of teeth than the primary gear 821. The secondary gear 822 may be engaged with the gear 810. The secondary gear 822 may be received in the receiving space 923b1. The wall 923c1 may surround the secondary gear 822.

The gear 830 may be mounted on the gear mount 923. The gear 830 may be received in the receiving space 923b2. The wall 923c2 may surround the gear 830. A rotating shaft 833 may be inserted into the hole 923a2. The rotating shaft 833 may be rotated with respect to the gear mount 923. Alternatively, the rotating shaft 833 may be fixed to the gear mount 923. The gear 830 may be coupled to the rotating shaft 833. The gear 830 may be rotated with respect to the rotating shaft 833. Alternatively, the gear 830 may be fixed to the rotating shaft 833. Alternatively, the gear 830 may be integrally formed with the rotating shaft 833. The gear 830 may be a double gear. The gear 830 may include a primary gear 831 (see FIG. 17) and a secondary gear 832. The rotating shaft 833 of the primary gear 831 may be the same as the rotating shaft 833 of the secondary gear 832. The primary gear 831 and the secondary gear 832 may be integrally formed with each other. The secondary gear 832 may have a greater diameter than the primary gear 831. The secondary gear 832 may have a greater number of teeth than the primary gear 831. The secondary gear 832 may be engaged with the gear 820. The secondary gear 832 may be engaged with the primary gear 821. The primary gear 831 may be received in the receiving space 923b2. The wall 923c2 may surround the primary gear 831.

Referring to FIG. 17, a torque output from the motor 800 may be transferred to the fourth gear 865 through the first gear 810, the second gear 820, and the third gear 830. As the torque is transferred to the fourth gear 865, the link 860 fastened to the fourth gear 865 may rotate or pivot.

The first gear 810 may be engaged with the secondary gear 822 of the second gear 820. The secondary gear 822 may have a greater number of teeth than the first gear 810. For example, the number of teeth of the first gear 810 may be 14, and the number of teeth of the second gear 822 may be 60. A gear reduction ratio, a gear ratio, or a reduction ratio between the first gear 810 and the second gear 822 may be 4.29. Alternatively, the gear reduction ratio between the first gear 810 and the second gear 822 may be 3 to 6.

The primary gear 821 of the second gear 820 may be engaged with the secondary gear 832 of the third gear 830. The secondary gear 832 may have a greater number of teeth than the primary gear 821. For example, the number of teeth of the primary gear 821 may be 15, and the number of teeth of the secondary gear 832 may be 70. The gear reduction ratio between the primary gear 821 and the secondary gear 832 may be 4.67. Alternatively, the gear reduction ratio between the primary gear 821 and the secondary gear 832 may be 3 to 6.

The primary gear 831 of the third gear 830 may be engaged with the fourth gear 865. The fourth gear 865 may have a greater number of teeth than the primary gear 831. For example, the number of teeth of the fourth gear 865 may be 26, and the number of teeth of the primary gear 831 may be 12. The gear reduction ratio between the fourth gear 865 and the primary gear 831 may be 2.17. Alternatively, the gear reduction ratio between the fourth gear 865 and the primary gear 831 may be 1.5 to 3.

The gear reduction ratios between the gears from the first gear 810 to the fourth gear 865 may be obtained by multiplying the gear reduction ratio of the second gear 820 to the first gear 810, the gear reduction ratio of the third gear 830 to the second gear 820, and the gear reduction ratio of the fourth gear 865 to the third gear 830. For example, the gear reduction ratio between the gears from the first gear 810 to the fourth gear 865 may be 4.29*4.67*2.17=43.33. By amplifying the torque of the motor 800, the first gear 810 to the fourth gear 865 may rotate or pivot the link 860.

For example, the first gear 810 may have a diameter of 11.5 mm, the primary gear 821 of the second gear 820 may have a diameter of 11.5 mm, the secondary gear 822 of the second gear 820 may have a diameter of 57.5 mm, the primary gear 831 of the third gear 830 may have a diameter of 14.25 mm, and the secondary gear 832 of the third gear 830 may have a diameter of 67.5 mm, and the fourth gear 865 may have a diameter of 39 mm.

For example, the first gear 810 may have a diameter of 14 mm, the primary gear 821 of the second gear 820 may have a diameter of 14 mm, the secondary gear 822 of the second gear 820 may have a diameter of 60 mm, the primary gear 831 of the third gear 830 may have a diameter of 18 mm, and the secondary gear 832 of the third gear 830 may have a diameter of 70 mm, and the fourth gear 865 may have a diameter of 42 mm.

For example, the first gear 810 may have a diameter of 16 mm, the primary gear 821 of the second gear 820 may have a diameter of 16 mm, the secondary gear 822 of the second gear 820 may have a diameter of 62 mm, the primary gear 831 of the third gear 830 may have a diameter of 21 mm, the secondary gear 832 of the third gear 830 may have a diameter of 72 mm, and the fourth gear 865 may have a diameter of 45 mm.

Referring to FIG. 18, the first gear 810a may be a worm gear. A secondary gear 822a of a second gear 820a may be a worm wheel gear. By applying the worm gear and the worm wheel gear, the gear reduction ratio between a first gear 810a and the secondary gear 822a may greatly increase. In this case, the gear reduction ratio may refer to an RPM of the first gear 810a when the secondary gear 822a rotates once. By applying a bevel gear, the motor 800 may be mounted in a direction parallel to the x-axis.

Referring to FIG. 19, the first gear 810b and the secondary gear 822b of the second gear 820b may be bevel gears. By applying the worm gear and the worm wheel gear, the motor 800 may be mounted in a direction parallel to the x-axis.

Referring to FIGS. 20 and 21, the gear 865 may be referred to as a link gear 865. The link gear 865 may have bodies 8651 and 8653 and teeth 8652. The bodies 8651 and 8653 may have a disk shape. The bodies 8651 and 8653 may have a flat part 8651 and a cut-out part 8653. The cut-out part 8653 may be formed by cutting out a portion of the flat part 8651. A portion of a circumference of the flat part 8651 is recessed into the cut-out part 8653 to form a gulf. For example, the link gear 865 may be a metal having a high carbon content and may be heat treated.

The bodies 8651 and 8653 may have a shaft hole 8654 formed by passing through the center of the bodies 8651 and 8653. The shaft hole 8654 may be formed in a center region of the bodies 8651 and 8653, and a portion 8654a of the hole 8654 may protrude toward the teeth 8652 in a diameter direction of the bodies 8651 and 8653. The cut-out part 8653 may be formed around the shaft hole 8654. The cut-out part 8653 may be eccentric to a center of the shaft hole 8654. In addition, the cut-out part 8653 may be eccentric to a center of the flat part 8651.

The cut-out part 8653 may have rectilinear parts 865L1 and 865L2 and a curved part 865C. The rectilinear parts 865L1 and 865L2 may include a first rectilinear part 865L1 and a second rectilinear part 865L2. The first rectilinear part 865L1 may be parallel to the second rectilinear part 865L2. The curved part 865C may connect the first rectilinear part 865L1 and the second rectilinear part 865L2 at one end of the first rectilinear part 865L1 and at one end of the second rectilinear part 865L2. The shaft hole 8654 may be located within the first rectilinear part 865L1, the curved part 865C, and the second rectilinear part 865L2. The shaft hole 8654 may be closer to the first rectilinear part 865L1 than the second rectilinear part 865L2.

A distance d1 from the first rectilinear part 865L1 to the center of the shaft hole 8654 may be smaller than a distance d2 from the second rectilinear part 865L2 to the center of the shaft hole 8654. For example, the distance d1 from the first rectilinear part 865L1 to the center of the shaft hole 8654 may be one-half or less of a radius of the flat part 8651. In another example, the distance d2 from the second rectilinear part 865L2 to the center of the shaft hole 8654 may be four-fifths or more of the radius of the flat part 8651. Accordingly, by providing the gears 810, 820, and 830 (see FIG. 16), damage to the link gear 865 caused by a repetitive force applied to the link gear 865 may be prevented.

Support holes 8658 and 8659 may be formed in the cut-out part 8653. The support holes 8658 and 8659 may include a first support hole 8658 and a second support hole 8659. The first support hole 8658 may be formed adjacent to the first rectilinear part 865L1 and the second support hole 8659 may be formed adjacent to the second rectilinear part 865L2. The first support hole 8658 may be closer to the shaft hole 8654 than the second support hole 8659. A distance r1 from the first support hole 8658 to the shaft hole 8654 may be 90 percent or less of a distance r2 from the second support hole 8659 to the shaft hole 8654. Accordingly, a force for raising and lowering the link 860 (see FIG. 16) fixed to the support holes 8658 and 8659 may be transferred effectively.

Fastening holes 8655, 8656, and 8657 may be formed in the cut-out part 8653. The fastening holes 8655, 8656, and 8657 may include a first fastening hole 8655, a second fastening hole 8656, and a third fastening hole 8657. The fastening holes 8655, 8656, and 8657 may be arranged in an overall triangular shape. The shaft hole 8654 may be formed by being superimposed on a long side of a triangle. A distance R1 from the first fastening hole 8655 to the center of the shaft hole 8654 may be greater than a distance R3 from the third fastening hole 8657 to the center of the shaft hole 8654. A distance R2 from the second fastening hole 8656 to the center of the shaft hole 8654 may be greater than the distance R1 from the first fastening hole 8655 to the center of the shaft hole 8654. Accordingly, a force for raising and lowering the link 860 (see FIG. 16) fixed to the support holes 8658 and 8659 may be transferred effectively.

A straight line connecting the first fastening hole 8655 and the second fastening hole 8656 may intersect the first rectilinear part 865L1. A straight line connecting the second fastening hole 8656 and the third fastening hole 8657 may be parallel to the second rectilinear part 865L2. In addition, a distance D1 between the first fastening hole 8655 and the second fastening hole 8656 may be smaller than a distance D2 between the second fastening hole 8656 and the third fastening hole 8657. Accordingly, a force for raising and lowering the link 860 (see FIG. 16) fixed to the support holes 8655, 8656, and 8657 may be transferred effectively.

The first support hole 8658 may be formed between the first fastening hole 8655 and the second fastening hole 8656, and the second support hole 8659 may be formed between the second fastening hole 8656 and the third fastening hole 8657. For example, the first support hole 8658 may be located between the first fastening hole 8655 and the second fastening hole 8656 on the straight line connecting the first fastening hole 8655 and the second fastening hole 8656. In another example, the second support hole 8659 may be located between the second fastening hole 8656 and the third fastening hole 8657 at a position adjacent to the straight line connecting the second fastening hole 8656 and the third fastening hole 8657. Accordingly, a force for raising and lowering the link 860 (see FIG. 16) fixed to the support holes 8655, 8656, and 8657 may be transferred effectively.

Referring to FIGS. 22 and 33, the first part 861 of the link 860 may include a body 8611, a gear coupling part 8612, and a lower link coupling part 8613. For example, the link 860 may include aluminum. The gear coupling part 8612 and the lower link coupling part 8613 may be formed on one side of the body 8611. The gear coupling part 8612 may be located under the lower link coupling part 8613. The gear coupling part 8612 may be formed by cutting out a portion of a lower part of the body 8611. For example, a thickness of the gear coupling part 8612 may correspond to a thickness of the link gear 865, and may be one-half or less of a thickness of the body 8611.

The gear coupling part 8612 may have a shape corresponding to the cut-out part 8653 of the link gear 865. The gear coupling part 8612 may be inserted or press-fit into the cut-out part 8653 of the link gear 8612. The gear coupling part 8612 may include a first rectilinear part 861L1, a second rectilinear part 861L2, and the curved part 861C. The first rectilinear part 861L1 of the gear coupling part 8612 may come into contact or may be in close contact with the first rectilinear part 861L1 of the link gear 865, and the second rectilinear part 861L2 of the gear coupling part 8612 may come into contact or may be in close contact with the second rectilinear part 865L2 of the link gear 865. The curved part 861C of the gear coupling part 8612 may come into contact or may be in close contact with the curved part 865C of the link gear 865.

The lower link coupling part 8613 may be formed by cutting out one surface of the body 8611. The lower link coupling part 8613 may form a step with one surface of body 8611. Walls 861W1, 861W2, and 861W3 may be formed on the left and right sides and the lower side of the lower link coupling part 8613. For example, the walls 861W1, 861W2, and 861W3 may have an overall U-shape. Support bosses 8613a, 8613b, and 8613c may be formed in the lower link coupling part 8613. The Support bosses 8613a, 8613b, and 8613c may be arranged in the overall triangular shape.

Support bosses 8612B may be formed in the gear coupling part 8612. The support bosses 8612B may protrude from a surface of the gear coupling part 8612 at positions corresponding to the support holes 8658 and 8659. The fastening holes 8612h may be formed in the gear coupling part 8612. The fastening holes 8612h may pass through the gear coupling part 8612 at positions corresponding to the fastening holes 8655, 8656, and 8657 of the link gear 865. A shaft hole 8612H, having a shape corresponding to the shaft hole 8654 of the link gear 865, may pass through the gear coupling part 8612.

Referring to FIGS. 23, 24, and 33, the first rectilinear part 865L1 of the link gear 865 may be parallel to the second rectilinear part 865L2 of the link gear 865. A fourth rectilinear part 865L4 of the link gear 865 may extend from a lower end of the second rectilinear part 865L2 of the link gear 865. The fourth rectilinear part 865L4 of the link gear 865 may be tilted with respect to the second rectilinear part 865L2 of the link gear 865.

The curved part 865C of the link gear 865 may be rounded toward the fourth rectilinear part 865L4 of the link gear 865 at a lower end of the first rectilinear part 865L1 of the link gear 865. A third rectilinear part 865L3 of the link gear 865 may connect the curved part 865C of the link gear 865 and the fourth rectilinear part 865L4 of the link gear 865. The third rectilinear part 865L3 of the link gear 865 may form an obtuse angle with respect to the fourth rectilinear part 865L4 of the link gear 865.

The first rectilinear part 861L1 of the gear coupling part 8612 may be parallel to the second rectilinear part 861L2 of the gear coupling part 8612. The fourth rectilinear part 861L4 of the gear coupling part 8612 may extend from a lower end of the second rectilinear part 861L2 of the gear coupling part 8612. The fourth rectilinear part 861L4 of the gear coupling part 8612 may be tilted with respect to the second rectilinear part 861L2 of the gear coupling part 8612.

The curved part 861C of the gear coupling part 8612 may be rounded toward the fourth rectilinear part 861L4 of the gear coupling part 8612 at the lower end of the first rectilinear part 861L1 of the gear coupling part 8612. The third rectilinear part 861L3 of the gear coupling part 8612 may connect the curved part 861C of the gear coupling part 8612 and the fourth rectilinear part 861L4 of the gear coupling part 8612. The third rectilinear part 861L3 of the gear coupling part 8612 may form an obtuse angle with respect to the fourth rectilinear part 861L4 of the gear coupling part 8612.

The gear coupling part 8612 may have a shape corresponding to the cut-out part 8653 of the link gear 865. The gear coupling part 8612 may be inserted or press-fit into the cut-out part 8653 of the link gear 8612. The first rectilinear part 861L1 of the gear coupling part 8612 may come into contact or may be in close contact with the first rectilinear part 861L1 of the link gear 865, and the second rectilinear part 861L2 of the gear coupling part 8612 may come into contact or may be in close contact with the second rectilinear part 865L2 of the link gear 865. The third rectilinear part 861L3 of the gear coupling part 8612 may come into contact or may be in close contact with the third rectilinear part 865L3 of the link gear 865, and the fourth rectilinear part 861L4 of the gear coupling part 8612 may come into contact or may be in close contact with the fourth rectilinear part 865L4 of the link gear 865. The curved part 861C of the gear coupling part 8612 may come into contact or may be in close contact with the curved part 865C of the link gear 865.

Accordingly, a torque provided by the link gear 865 may be transferred effectively to the link 860 (see FIG. 16), thereby allowing for smooth raising and lowering of the link 860.

Referring to FIGS. 25, 26, and 33, the first rectilinear part 865L1 of the link gear 865 may be parallel to the second rectilinear part 865L2 of the link gear 865. A length of the first rectilinear part 865L1 may be smaller than a length of the second rectilinear part 865L2. A first curved part 865C1 of the link gear 865 may be rounded toward the second rectilinear part 865L2 of the link gear 865 at the lower end of the first rectilinear part 865L1 of the link gear 865. The first curved part 865C1 of the link gear 865 may be rounded convexly in a radial direction of the link gear 865.

The second curved part 865C2 of the link gear 865 may be rounded toward the first curved part 865C1 of the link gear 865 at the lower end of the second rectilinear part 865L2 of the link gear 865. The second curved part 865C2 of the link gear 865 may be rounded concavely in a radial direction of the link gear 865. The first curved part 865C1 and the second curved part 865C2 may form an inflection point. The second curved part 865C2 of the link gear 865 and the second rectilinear part 865L2 of the link gear 865 may form an angle theta1. For example, the angle theta1 may be 90 degrees.

The first rectilinear part 861L1 of the gear coupling part 8612 may be parallel to the second rectilinear part 861L2 of the gear coupling part 8612. A length of the first rectilinear part 861L1 may be smaller than a length of the second rectilinear part 861L2. A first curved part 861C1 of the gear coupling part 8612 may be rounded toward the second rectilinear part 861L2 of the gear coupling part 8612 at the lower end of the first rectilinear part 861L1 of the gear coupling part 8612. The first curved part 861C1 of the gear coupling part 8612 may be rounded convexly outwardly from the gear coupling part 8612 in a length direction of the gear coupling part 8612.

A second curved part 861C2 of the gear coupling part 8612 may be rounded toward the first curved part 861C1 of the gear coupling part 8612 at the lower end of the second rectilinear part 861L2 of the gear coupling part 8612. The second curved part 861C2 of the gear coupling part 8612 may be rounded concavely inwardly from the gear coupling part 8612 in a length direction of the gear coupling part 8612. The first curved part 861C1 and the second curved part 861C2 may form an inflection point.

The gear coupling part 8612 may have a shape corresponding to the cut-out part 8653 of the link gear 865. The gear coupling part 8612 may be inserted or press-fit into the cut-out part 8653 of the link gear 865. The first rectilinear part 861L1 of the gear coupling part 8612 may come into contact or may be in close contact with the first rectilinear part 861L1 of the link gear 865, and the second rectilinear part 861L2 of the gear coupling part 8612 may come into contact or may be in close contact with the second rectilinear part 865L2 of the link gear 865. The first curved part 861C1 of the gear coupling part 8612 may come into contact or may be in close contact with the first curved part 865C1 of the link gear 865. The second curved part 861C2 of the gear coupling part 8612 may come into contact or may be in close contact with the second curved part 865C2 of the link gear 865.

Accordingly, a torque provided by the link gear 865 may be transferred effectively to the link 860 (see FIG. 16), thereby allowing for smooth raising and lowering of the link 860.

Referring to FIGS. 27, 28, and 33, the first rectilinear part 865L1 of the link gear 865 may be parallel to the second rectilinear part 865L2 of the link gear 865. A length of the first rectilinear part 865L1 may be smaller than a length of the second rectilinear part 865L2. The first curved part 865C1 of the link gear 865 may be rounded toward the second rectilinear part 865L2 of the link gear 865 at the lower end of the first rectilinear part 865L1 of the link gear 865. The first curved part 865C1 of the link gear 865 may be rounded convexly in a radial direction of the link gear 865.

The second curved part 865C2 of the link gear 865 may be rounded toward the first curved part 865C1 of the link gear 865 at the lower end of the second rectilinear part 865L2 of the link gear 865. The second curved part 865C2 of the link gear 865 may be rounded concavely in a radial direction of the link gear 865. The first curved part 865C1 and the second curved part 865C2 may form an inflection point. The second curved part 865C2 of the link gear 865 and the second rectilinear part 865L2 of the link gear 865 may form an angle theta1. For example, the angle theta1 may be an acute angle.

The first rectilinear part 861L1 of the gear coupling part 8612 may be parallel to the second rectilinear part 861L2 of the gear coupling part 8612. A length of the first rectilinear part 861L1 may be smaller than a length of the second rectilinear part 861L2. The first curved part 861C1 of the gear coupling part 8612 may be rounded toward the second rectilinear part 861L2 of the gear coupling part 8612 at the lower end of the first rectilinear part 861L1 of the gear coupling part 8612. The first curved part 861C1 of the gear coupling part 8612 may be rounded convexly outwardly from the gear coupling part 8612 in a length direction of the gear coupling part 8612.

The second curved part 861C2 of the gear coupling part 8612 may be rounded toward the first curved part 861C1 of the gear coupling part 8612 at the lower end of the second rectilinear part 861L2 of the gear coupling part 8612. The second curved part 861C2 of the gear coupling part 8612 may be rounded concavely inwardly from the gear coupling part 8612 in a length direction of the gear coupling part 8612. The first curved part 861C1 and the second curved part 861C2 may form an inflection point.

The gear coupling part 8612 may have a shape corresponding to the cut-out part 8653 of the link gear 865. The gear coupling part 8612 may be inserted or press-fit into the cut-out part 8653 of the link gear 865. The first rectilinear part 861L1 of the gear coupling part 8612 may come into contact or may be in close contact with the first rectilinear part 861L1 of the link gear 865, and the second rectilinear part 861L2 of the gear coupling part 8612 may come into contact or may be in close contact with the second rectilinear part 865L2 of the link gear 865. The first curved part 861C1 of the gear coupling part 8612 may come into contact or may be in close contact with the first curved part 865C1 of the link gear 865. The second curved part 861C2 of the gear coupling part 8612 may come into contact or may be in close contact with the second curved part 865C2 of the link gear 865.

Accordingly, a torque provided by the link gear 865 may be transferred effectively to the link 860 (see FIG. 16), thereby allowing for smooth raising and lowering of the link 860.

Referring to FIGS. 29, 30, and 33, the first rectilinear part 865L1 of the link gear 865 may be parallel to the second rectilinear part 865L2 of the link gear 865. The first curved part 865C1 of the link gear 865 may be rounded toward the second rectilinear part 865L2 of the link gear 865 at the lower end of the first rectilinear part 865L1 of the link gear 865. The second curved part 865C2 of the link gear 865 may be rounded toward the first rectilinear part 865L1 of the link gear 865 at the lower end of the second rectilinear part 865L2 of the link gear 865. An arc of the second curved part 865C2 may be greater than an arc of the first curved part 865C1.

The third rectilinear part 865L3 of the link gear 865 may connect the first curved part 865C1 of the link gear 865 and the fourth rectilinear part 865L4 of the link gear 865. The fourth rectilinear part 865L3 of the link gear 865 may connect the second curved part 865C2 of the link gear 865 and the third rectilinear part 865L3 of the link gear 865. The third rectilinear part 865L3 of the link gear 865 may form an obtuse angle with respect to the fourth rectilinear part 865L4 of the link gear 865.

The first rectilinear part 861L1 of the gear coupling part 8612 may be parallel to the second rectilinear part 861L2 of the gear coupling part 8612. The first curved part 861C1 of the gear coupling part 8612 may be rounded toward the second rectilinear part 861L2 of the gear coupling part 8612 at the lower end of the first rectilinear part 861L1 of the gear coupling part 8612. The second curved part 861C2 of the gear coupling part 8612 may be rounded toward the first rectilinear part 861L1 of the gear coupling part 8612 at the lower end of the second rectilinear part 861L2 of the gear coupling part 8612. A length of an arc of the second curved part 861C2 may be greater than a length of the first curved part 861C1.

The third rectilinear part 861L4 of the gear coupling part 8612 may extend from a lower end of the first curved part 861C1 of the gear coupling part 8612. The fourth rectilinear part 861L4 of the gear coupling part 8612 may extend from a lower end of the second curved part 861C2 of the gear coupling part 8612. The third rectilinear part 861L3 of the gear coupling part 8612 may connect the first curved part 861C1 of the gear coupling part 8612 and the fourth rectilinear part 861L4 of the gear coupling part 8612. The fourth rectilinear part 861L4 of the gear coupling part 8612 may connect the second curved part 861C2 of the gear coupling part 8612 and the third rectilinear part 861L3 of the gear coupling part 8612. The third rectilinear part 861L3 of the gear coupling part 8612 may form an obtuse angle with respect to the fourth rectilinear part 861L4 of the gear coupling part 8612.

The gear coupling part 8612 may have a shape corresponding to the cut-out part 8653 of the link gear 865. The gear coupling part 8612 may be inserted or press-fit into the cut-out part 8653 of the link gear 8612. The first rectilinear part 861L1 of the gear coupling part 8612 may come into contact or may be in close contact with the first rectilinear part 861L1 of the link gear 865, and the second rectilinear part 861L2 of the gear coupling part 8612 may come into contact or may be in close contact with the second rectilinear part 865L2 of the link gear 865. The third rectilinear part 861L3 of the gear coupling part 8612 may come into contact or may be in close contact with the third rectilinear part 865L3 of the link gear 865, and the fourth rectilinear part 861L4 of the gear coupling part 8612 may come into contact or may be in close contact with the fourth rectilinear part 865L4 of the link gear 865. The first curved part 861C1 of the gear coupling part 8612 may come into contact or may be in close contact with the first curved part 865C1 of the link gear 865. The second curved part 861C2 of the gear coupling part 8612 may come into contact or may be in close contact with the second curved part 865C2 of the link gear 865.

Accordingly, a torque provided by the link gear 865 may be transferred effectively to the link 860 (see FIG. 16), thereby allowing for smooth raising and lowering of the link 860.

Referring to FIGS. 31 to 33, the first rectilinear part 865L1 of the link gear 865 may be parallel to the second rectilinear part 865L2 of the link gear 865. The first curved part 865C1 of the link gear 865 may be rounded toward the second rectilinear part 865L2 of the link gear 865 at the lower end of the first rectilinear part 865L1 of the link gear 865. The second curved part 865C2 of the link gear 865 may be rounded toward the first rectilinear part 865L1 of the link gear 865 at the lower end of the second rectilinear part 865L2 of the link gear 865. An arc of the second curved part 865C2 may be greater than an arc of the first curved part 865C1.

The third rectilinear part 865L3 of the link gear 865 may connect the first curved part 865C1 of the link gear 865 and the fourth rectilinear part 865L4 of the link gear 865. The fourth rectilinear part 865L3 of the link gear 865 may connect the second curved part 865C2 of the link gear 865 and the third rectilinear part 865L3 of the link gear 865. For example, the third rectilinear part 865L3 of the link gear 865 may form a right angle with respect to the fourth rectilinear part 865L4 of the link gear 865.

The first rectilinear part 861L1 of the gear coupling part 8612 may be parallel to the second rectilinear part 861L2 of the gear coupling part 8612. The first curved part 861C1 of the gear coupling part 8612 may be rounded toward the second rectilinear part 861L2 of the gear coupling part 8612 at the lower end of the first rectilinear part 861L1 of the gear coupling part 8612. The second curved part 861C2 of the gear coupling part 8612 may be rounded toward the first rectilinear part 861L1 of the gear coupling part 8612 at the lower end of the second rectilinear part 861L2 of the gear coupling part 8612. A length of an arc of the second curved part 861C2 may be greater than a length of the first curved part 861C1.

The third rectilinear part 861L4 of the gear coupling part 8612 may extend from a lower end of the first curved part 861C1 of the gear coupling part 8612. The fourth rectilinear part 861L4 of the gear coupling part 8612 may extend from a lower end of the second curved part 861C2 of the gear coupling part 8612. The third rectilinear part 861L3 of the gear coupling part 8612 may connect the first curved part 861C1 of the gear coupling part 8612 and the fourth rectilinear part 861L4 of the gear coupling part 8612. The fourth rectilinear part 861L4 of the gear coupling part 8612 may connect the second curved part 861C2 of the gear coupling part 8612 and the third rectilinear part 861L3 of the gear coupling part 8612. For example, the third rectilinear part 861L3 of the gear coupling part 8612 may form a right angle with respect to the fourth rectilinear part 861L4 of the gear coupling part 8612.

The gear coupling part 8612 may have a shape corresponding to the cut-out part 8653 of the link gear 865. The gear coupling part 8612 may be inserted or press-fit into the cut-out part 8653 of the link gear 8612. The first rectilinear part 861L1 of the gear coupling part 8612 may come into contact or may be in close contact with the first rectilinear part 861L1 of the link gear 865, and the second rectilinear part 861L2 of the gear coupling part 8612 may come into contact or may be in close contact with the second rectilinear part 865L2 of the link gear 865. The third rectilinear part 861L3 of the gear coupling part 8612 may come into contact or may be in close contact with the third rectilinear part 865L3 of the link gear 865, and the fourth rectilinear part 861L4 of the gear coupling part 8612 may come into contact or may be in close contact with the fourth rectilinear part 865L4 of the link gear 865. The first curved part 861C1 of the gear coupling part 8612 may come into contact or may be in close contact with the first curved part 865C1 of the link gear 865. The second curved part 861C2 of the gear coupling part 8612 may come into contact or may be in close contact with the second curved part 865C2 of the link gear 865.

Accordingly, a torque provided by the link gear 865 may be transferred effectively to the link 860 (see FIG. 16), thereby allowing for smooth raising and lowering of the link 860.

Referring to FIGS. 22, 34, and 35, a lower link 912 may include a plate 9120 and a coupling groove 912G. The plate 9120 may be elongated. For example, the plate 9120 may include aluminum.

The coupling groove 912G may include a first coupling groove 912G1, a second coupling groove 912G2, and a third coupling groove 912G3. The first coupling groove 912G1 may be formed along one long side of the plate 9120 at a recessed edge of the plate 9120. The second coupling groove 912G2 may be disposed parallel to the first coupling groove 912G1, and may be formed along the other long side of the plate 9120 at a recessed edge of the plate 9120. The third coupling groove 912G3 may connect one end of the first coupling groove 912G1 and one end of the second coupling groove 912G2. For example, the coupling groove 912G may have an overall U-shape. Boss holes 912a, 912b, and 913c may pass through the plate 9120. Positions of the boss holes 912a, 912b, and 912c may be formed in an overall triangular shape.

The lower link 912 may be fastened to a lower link coupling part 8613 of the first part 861 of the link 860. The plate 9120 may be inserted or press-fit into the lower link coupling part 8613 of the plate 9120. A first wall 861W1 may be inserted into the first coupling groove 912G1, a second wall 861W2 may be inserted into the second coupling groove 912G2, and a third wall 861W3 may be inserted into the third coupling groove 912G3. The support bosses 8613a, 8613b, and 8613c may be inserted or press-fit into the boss holes 912a, 912b, and 912c. In addition, a screw is coupled to the fastening holes 9121, 9122, 9123, 9124, 9125, and 9126, such that the lower link 912 may be firmly coupled to the first part 861 of the link 860.

The link gear 865 may be fastened to the gear coupling part 8612 of the first part 861 of the link 860. The support bosses 8612B are inserted or press-fit into the support holes 8658 and 865, and the screw is coupled to the fastening holes 8656, 8657, and 8658, such that the link gear 865 may be firmly coupled to the gear coupling part 8612 of the first part 861 of the link 860.

Referring to FIGS. 36 and 37, a mechanism is illustrated in which the lower link 912 is coupled to the link 860 and the link gear 865, to be raised (FIG. 37) and lowered (FIG. 36). Even when a force is repeatedly applied by the gear 830 engaged with the link gear 865, damage to the link gear 865 may be prevented, and raising (referred to as unfolding) of the lower link 912 and/or lowering (referred to as folding) may be smoothly performed.

Referring to FIG. 38, the lower link 912 may be fastened to a front surface of the link 860 by a fastening member SC2. The lower link 912 may be fixed to the front surface of the link 860. Alternatively, the lower link 912 and the link 860 may be integrally formed with each other. A cover 926 may be fastened to a front surface of the mount 920 by the fastening member SC. The cover 926 may cover the gears 810, 820, 830, and 885.

Referring to FIG. 39, the shock absorber 930 may include a cylinder 932 and a piston 931. The piston 931 may be moved up and down in the y-axis direction. When the link 860 rotates in a direction -DRS closer to a coupling part 921, the piston 931 may come into contact with the link 860. When the link 860 rotates in the direction-DRS closer to the coupling part 921, the shock absorber 930 may function as a damper for absorbing shock. When the link 860 and the piston 931 comes into contact with each other, the shock absorber 930 may provide a restoring force RF1 to the link 860. The restoring force RF1 may act in the positive y-axis direction. When the link 860 and the piston 931 comes into contact with each other, the shock absorber 930 may provide the restoring force RF1 so that the link 860 may rotate in a direction DRS away from the coupling part 921. When the link 860 and the piston 931 does not come into contact with each other, the shock absorber 930 may have a maximum height HE1 (see FIG. 38) from the base 32.

When the piston 931 is inserted into the cylinder 932 to the maximum, a height HE2 of the shock absorber 930 from the base 32 may be minimum. The shock absorber 930 may limit an angle of rotation or pivot of the link 860. When the link 860 comes into contact with the piston 931 and the piston 931 has a minimum height HE, an angle B formed between the gas spring 850 and the base 32 may be minimum. When the link 860 comes into contact with the piston 931 and the piston 931 has the minimum height, an angle C formed between the link 860 and the base 32 may be minimum. The gas spring 850 may provide a restoring force RF2 to the link 860. As the lower link 912 and an upper link 911 are folded, the shock absorber 930 may come into contact with the lower link 912. Alternatively, as the lower link 912 and the upper link 911 are folded, the lower link 912 may push the shock absorber 930.

Referring to FIG. 40, a right assembly RA may include the mount 920, the cover 926, the motor 800, the gears 810, 820, 830, and 865, the gas spring 850, the shock absorber 930, or a link 912RL. The link 912RL may include the lower link 912, the upper link 911, or a joint 913. The link 912RL may be referred to as a foldable link 912RL, a lift 912RL, a lift assembly 912RL, a foldable lift 912RL, and a foldable lift assembly 912RL.

The left assembly LA may include the same components as the right assembly RA. The left assembly LA and the right assembly RA may be symmetrical to each other. The left assembly LA may include a mount 920L, a cover 926L, a motor 800L, a gear, a gas spring 850L, a shock absorber 930L, or a link 912LL. The link 912LL may include a lower link 912L, an upper link 911L, or a joint 913L. The link 912LL may be referred to as a foldable link 912LL, a lift 912LL, a lift assembly 912LL, a foldable lift 912LL, and a foldable lift assembly 912LL. The links 912RL and 912LL may be folded or unfolded.

A first base 31 may have a plate shape. The first base 31 may face a second base 32. The first base 31 may be disposed under the second base 32. A supporter 35 may be disposed between the first base 31 and the second base 32. The supporter 35 may be fastened to the first base 31 by a fastening member. The supporter 35 may be fastened to the second base 32 by the fastening member. The roller 143 may be installed on the first base 31. The roller 143 may be disposed between the first base 31 and the second base 32. A portion of the display unit 20 may be rolled around the roller 143, and the portion of the display unit 20 may be unrolled from the roller 143. The display unit 20, unrolled from the roller 143, may extend upwardly.

Referring to FIG. 41, a gear 912a may be formed at an upper end of the upper link 912. Alternatively, the gear 912a may be coupled to the upper end of the upper link 912. Alternatively, the gear 912a may be fixed to the upper end of the upper link 912. Alternatively, the gear 912a may be integrally formed with the upper link 912. The gear 911a may be formed at a lower end of the lower link 911. Alternatively, the gear 911a may be coupled to the lower end of the lower link 911. Alternatively, the gear 911a may be fixed to the lower end of the lower link 911. Alternatively, the gear 911a may be integrally formed with the lower link 911. The gears 912a and 911a may be engaged with each other. The gears 911a and 912a may be rotated with respect to a first part 913a of the joint 913. The upper link 912 may be referred to as an arm 912. The lower link 911 may be referred to as an arm 911.

Referring to FIG. 42, a second part 913b may be fastened to the first part 913a by the fastening member SC. The second part 913b may be fixed to the first part 913a. The gears 911a and 912a may be rotated with respect to the first part 913a or the second part 913b.

Referring to FIG. 43, an upper portion of the display unit 20 may be bent rearwardly. The upper portion of the display unit 20 may be a plate 11 which is not coupled to the display panel 10. The rearwardly bent upper portion of the plate 11 may be referred to as a bending part 11a or a first part 11a. A portion connected to the bending part 11a may be referred to as a second part 11i. A top case 950 may be disposed over the bending part 11a. A gasket 954 may be disposed between the top case 950 and the bending part 11a. A lower bar 953 may be disposed under the bending part 11a. The lower bar 953 may be referred to as a bar 953.

The lower bar 953 may include a horizontal part 953a and a vertical part 953b. The gasket 954 may have a hole 954a. The bending part 11a may have a hole 11b. The horizontal part 953a may have a hole 953e. The hole 954a of the gasket 954, the hole 11b of the bending part 11a, and the hole 953e of the vertical part 953a may face each other. The fastening member SC may be fastened to the top case 950 by passing through the hole 953e of the horizontal part 953a, the hole 11b of the bending part 11a, and the hole 954a of the gasket 954. The vertical part 953b may be disposed perpendicular to the horizontal part 953a. The vertical part 953b may support the plate 11. The vertical part 953b may face a link bracket 951. The vertical part 953b may include a first coupling part 953c and a second coupling part 953d which protrude rearwardly. The second coupling part 953d may be inserted into the bearing 955. The bearing 955 may be referred to as a ring bearing 955. The bearing 955 may be inserted into a hole 911a of the first arm 911. The link bracket 951 may have a first hole 951a and a second hole 951b. The fastening member SC may pass through the first thole 951a and may be fastened to the first coupling part 953c. The fastening member SC may pass through the second hole 951b and may be fastened to the second coupling part 953d. The link bracket 951 may be fixed to the lower bar 953 by the first hole 951a, the first coupling part 953c, and the fastening member SC. The first arm 911 may be pivotally coupled to the lower bar 953 by the second coupling part 953d, the bearing 955, the second hole 951b, and the fastening member SC. In this structure, wrinkles W or creases W of the display unit 20 may be reduced. The upper link 911a may rotate or pivot with respect to the second coupling part 953d or the link bracket 951.

Referring to FIG. 44, a rear wall 950d may extend downwardly from the first part 950a. The rear wall 950d may be referred to as a second part 950d. The rear wall 950d may cover the bending part 11a, the gasket 954, or the horizontal part 953a. A first front wall 950b may extend downwardly from the first part 950a. The first front wall 950b may be referred to as a third part 950c. The first front wall 950b may cover the upper portion of the plate 11 or the second part 11i. A second front wall 950c may extend downwardly from the first front wall 950b. The second front wall 950c may be referred to as a fourth part 950c. The second front wall 950c may cover the upper portion of the display panel 10. The second front wall 950c may cover the wrinkles W or creases W formed on the upper portion of the display panel 10. A thickness W5 of the first front wall 950b may be greater than a thickness W6 of the second front wall 950c. The thickness W5 of the first front wall 950b may be substantially equal to a sum of the thickness W6 of the second front wall 950c and a thickness of the display panel 10.

The first arm 911 may include a first part 911b facing the vertical part 953b, and a second part 911c facing the plate 11. A thickness W9 of the second part 911c may be substantially equal to a sum of a thickness W7 of the vertical part 953b and a thickness W8 of the first part 911b. As the second part 911c comes into contact with or is disposed adjacent to the display unit 20, the display unit 20 may be supported stably.

Referring to FIG. 45, the roller 143 may be installed on a mount 36. The mount 36 may be installed on the base 31. The mount 36 may be installed at one end and the other end in a longitudinal direction (x-axis direction) of the roller 143. The roller 143 may be disposed between the mounts 36. The roller 143 may rotate with respect to the mount 36. A hub 278 may be installed on the mount 36. The mount 36 may be disposed between the roller 143 and the hub 278. The hub 278 may be coupled or fixed to one end of the roller 143. The hub 278 may be integrally formed with the roller 143. The hub 278 may rotate as the roller 143 rotates. A rotation speed of the roller 143 may be equal to a rotation speed of the hub 278.

The rotating shaft 315 may be installed on the mount 36. The rotating shaft 315 may rotate with respect to the mount 36. The spring 314 may be wound around the rotating shaft 315. The spring 314 may be a constant force spring. The spring 314 may be wound around the rotating shaft 315 a plurality of times. One end of the spring 314 may be fixed to the rotating shaft 315. The other end of the spring 314 may be fixed to the hub 278. The spring 314 may extend toward the hub 278 and may be wound around or unwound from the hub 278. The spring 314 may be wound around or unwound from the rotating shaft 315 and may provide a restoring force to the hub 278. The restoring force may be a force of the spring 314 to be wound around the rotating shaft 315. A guide 316 may guide the spring 314 to be wound around or unwound from the rotating shaft 315. When the spring 314 is wound around or unwound from the rotating shaft 315, a rotation direction of the rotating shaft 315 may be the same as a rotation direction of the hub 278.

The rotating shaft 315 may be disposed below the hub 278 by a distance CSD in the y-axis direction. As the rotating shaft 315 is disposed below the hub 278, a greater force may be transferred to the hub 278 compared to the case where the rotating shaft 315 is disposed at the same height as or above the hub 278. By the restoring force provided by the spring 314 to the hub 278, the display unit 20 may be rolled around the roller 143.

Referring to FIG. 46, as the number of rotations of an existing torsion spring increases, an applied torque increases as shown by a dotted line. As the number of rotations of the spring 314 exceeds a predetermined number of rotations, an applied torque may be constant as shown by a solid line. A torque required for the display unit 20 to be rolled around the roller 143 may not be changed significantly compared to the number of times the display unit 20 is rolled around the roller 143. Accordingly, by applying the constant force spring, a constant torque may be obtained, such that the roller 143 may be stably driven.

Referring to FIG. 47, the top case 950 may have a maximum height in the y-axis direction. In the case where the top case 950 has a maximum height in the y-axis direction, an angle E formed between the lower links 912 and 912L and the upper links 911 and 911L may be maximum. For example, the angle E may be 180 degrees. When the top case 950 has the maximum height in the y-axis direction, the gas springs 850 and 850L may have a maximum length. When the top case 950 has the maximum height in the y-axis direction, the display unit 20 may be unrolled from the roller 143 to the maximum. When the top case 950 has the maximum height in the y-axis direction, the shock absorbers 930 and 930L may not come into contact with the links 860 and 860L. When the top case 950 has the maximum height in the y-axis direction, the height HE1 of the shock absorbers 930 and 930L may be maximum.

Referring to FIG. 48, the motors 800 and 800L may rotate or pivot the lower links 912 and 912L.

As the motors 800 and 800L rotate or pivot the lower links 912 and 912L in a direction to raise the lower links 912 and 912L with respect to the base 32, an angle D formed between the lower links 912 and 912L and the upper links 911 and 911L may increase. As the motors 800 and 800L rotate or pivot the lower links 912 and 912L in the direction to raise the lower links 912 and 912L with respect to the base 32, an angle formed between the lower links 912 and 912L and the base 32 may increase. As the motors 800 and 800L rotate or pivot the lower links 912 and 912L in the direction to raise the lower links 912 and 912L with respect to the base 32, the top case 950 may be moved in the positive y-axis direction. As the motors 800 and 800L rotate or pivot the lower links 912 and 912L in the direction to raise the lower links 912 and 912L with respect to the base 32, the display unit may be unrolled from the roller. As the motors 800 and 800L rotate or pivot the lower links 912 and 912L in the direction to raise the lower links 912 and 912L with respect to the base 32, the gas springs 850 and 850L may extend in length. The gas springs 850 and 850L may provide a restoring force to the lower links 912 and 912L in the direction to raise the lower links 912 and 912L with respect to the base 32.

As the motors 800 and 800L rotate or pivot the lower links 912 and 912L in a direction opposite to the direction to raise the lower links 912 and 912L with respect to the base 32, an angle D formed between the lower links 912 and 912L and the upper links 911 and 911L may decrease. As the motors 800 and 800L rotate or pivot the lower links 912 and 912L in the direction opposite to the direction to raise the lower links 912 and 912L with respect to the base 32, the angle D formed between the lower links 912 and 912L and the base 32 may decrease. As the motors 800 and 800L rotate or pivot the lower links 912 and 912L in the direction opposite to the direction to raise the lower links 912 and 912L with respect to the base 32, the top case 950 may be moved in the negative y-axis direction. As the motors 800 and 800L rotate or pivot the lower links 912 and 912L in the direction opposite to the direction to raise the lower links 912 and 912L with respect to the base 32, the display unit may be rolled around the roller. As the motors 800 and 800L rotate or pivot the lower links 912 and 912L in the direction opposite to the direction to raise the lower links 912 and 912L with respect to the base 32, the gas springs 850 and 850L may be reduced in length. The gas springs 850 and 850L may provide a restoring force to the lower links 912 and 912L in the direction to raise the lower links 912 and 912L with respect to the base 32.

As the lower links 912 and 912L rotate or pivot in the raising direction, a distance between the joints 913 and 913L may increase. As the lower links 912 and 912L rotate or pivot in the direction opposite to the raising direction, a distance between the joints 913 and 913L may decrease.

Referring to FIG. 49, the top case 950 may have a minimum height in the y-axis direction. When the top case 950 has a minimum height in the y-axis direction, an angle G formed between the lower links 912 and 912L and the upper links 911 and 911L may be minimum. When the top case 950 has the minimum height in the y-axis direction, the gas springs 850 and 850L may have a minimum length. When the top case 950 has the minimum height in the y-axis direction, the display unit 20 may be rolled around the roller 143 to the maximum. When the top case 950 has the minimum height in the y-axis direction, the shock absorbers 930 and 930L may come into contact with the links 860 and 860L. When the top case 950 has the minimum height in the y-axis direction, the height HE2 of the shock absorbers 930 and 930L may be minimum.

Referring to FIG. 50, a PCB 870 may be disposed between the covers 926 and 926L and the mounts 920 and 920L. The PCB 870 may face the gear 880. The PCB 870 may be disposed between the gear 880 and the covers 926 and 926L. The PCB 870 may be included in the left assembly LA or the right assembly RA. The gear 880 may include at least one of a plurality of gears 810, 820, 830, and 865.

The PCB (Printed Board) 870 may include a position sensor 871. The position sensor may protrude toward the gear. A plurality of position sensors 871 may be provided. The plurality of position sensors 871 may be disposed along a virtual circular line 872. The plurality of position sensors 871 may be disposed at equal intervals along the virtual circular line 872. A rotation axis 882 of the gear 880 may pass through a center cn of the virtual circular line 872. The PCB 870 may be referred to as a sensor 870, a position sensor 870, an angle sensor 870, an encoder 870, or a rotary encoder 870.

A protrusion 881 may be formed on one surface or the entire surface of the gear 880. The protrusion 881 may be spaced apart from the rotation axis 882 of the gear 880. A plurality of protrusions 881 may be formed. As the gear 880 is rotated, the protrusions 881 may form a circular moving line 881a. The moving line 881a may be referred to as a trace 881a, a trajectory 881a, a rotational trajectory 881a, or a rotational moving line 881a. The protrusion 881 may be referred to as a block 881. The PCB 870 may sense the protrusions 881 passing through the position sensor 871. As the gear 880 is rotated, the protrusions 881 may sequentially pass through the plurality of position sensors 871. The PCB 870 may sense an amount, direction, or speed of rotation of the gear 880 by the position sensor 871.

Referring to FIG. 51, a sensor 890 may be installed on a rear surface of the mounts 920 and 920L. A sensor mount 923 may be formed on a rear surface of a gear mount 920. The sensor mount 923 and the gear mounts 920 and 920L may be integrally formed with each other. The sensor 890 may be installed on the sensor mount 923. A plurality of sensors 890 may be provided. The sensors 890 may include the position sensor 891. The sensors 890 may be referred to as the position sensor 890 or the angle sensor 890. A protrusion 882 may be formed on a rear surface of the second part 862. A plurality of protrusions 882 may be formed. The protrusion 882 may be referred to as a block 882. As the link 860 rotates or pivots, the protrusions 882 may pass through the position sensor 891. As the link 860 rotates or pivots, the sensor 890 may sense the protrusions 882 passing through the position sensor 891. The sensors 890 may sense an amount, direction, or speed of rotation of the link 860 by the position sensor 891. As the link 860 pivots or rotates, the protrusions 882 may form a circular moving line 882a. The moving line 882a may be referred to as a trace 882a, a trajectory 882a, a pivot trajectory 882a, pivot moving line 882a, a rotational trajectory 882a, or a rotational moving line 882a.

Referring to FIG. 52, the display device 100 may include an interface 1200 connected to an external device. The interface 1200 may be connected to an external power source 1300 and may receive power from the external power source 1300. The processor 1000 may distribute power to the respective components. The processor 1000 may be referred to as a control unit 1000 or a controller 1000.

The memory 1100 may store various data for the operation of the display device 100, such as programs for processing or controlling the processor 1000. The memory 1100 may store various application programs or applications running on the display device 100.

The processor 1000 may control the operation of the left assembly LA and the right assembly RA. The left assembly LA and the right assembly RA are required to be driven symmetrically in order to allow the display unit 20 to be smoothly wound around or unwound from the roller 143.

The processor 1000 may simultaneously control the motors 800 and 800L. The processor 1000 may control an amount, speed, or direction of rotation of the driving shafts 800*d* and 800L*d* of the motors 800 and 800L. The processor 1000 may control the driving shafts 800*d* and 800L*d* of the motors 800 and 800L to rotate in opposite directions. The processor 1000 may control the driving shafts 800*d* and 800L*d* of the motors 800 and 800L to have the same rotation speed. The processor 1000 may control the driving shafts 800*d* and 800L*d* of the motors 800 and 800L to have the same amount of rotation. As the driving shafts 800*d* and 800L*d* of the motors 800 and 800L are controlled to have the same amount of rotation or the same rotation speed, the links 911 and 911L may have the same amount of rotation or the same amount of pivot. As the driving shafts 800*d* and 800L*d* of the motors 800 and 800L are controlled to have the same amount of rotation or the same rotation speed, the links 911 and 911L may be moved symmetrically. As the driving shafts 800*d* and 800L*d* of the motors 800 and 800L are controlled to have the same amount of rotation or the same rotation speed, the top case 950 may be moved up and down in the y-axis direction while maintaining horizontality.

The processor 1000 may sense an amount, speed, or direction of rotation of the motor 800L of the left assembly LA by the position sensor 800L*b*. The position sensor 800L*b* may include at least one of the PCB 870 and the sensor 890. The rotation amount may refer to angular displacement. The rotation speed may refer to angular velocity. The processor 1000 may sense an amount, speed, or direction of rotation of the motor 800 of the right assembly RA by the position sensor 800*b*. The position sensor 800*b* may include at least one of the PCB 870 and the sensor 890. The motors 800 and 800L may include brakes 800*e* and 800L*e* for braking the driving shafts 800*d* and 800L*d*. The processor 1000 may control the operation of the brakes 800*e* and 800L*e* to reduce the rotation speed of the motors 800 and 800L or to stop the operation of the motors 800 and 800L.

If any one of the motors 800 and 800L has a greater amount of rotation than the other, the processor 1000 may reduce a rotation speed of the motor having a greater amount of rotation, or may stop the operation of the motor having a greater amount of rotation. Alternatively, if any one of the motors 800 and 800L has a greater amount of rotation than the other, the processor 1000 may increase a rotation speed of the motor having a smaller amount of rotation.

If any one of the motors 800 and 800L has a higher rotation speed than the other, the processor 1000 may reduce a rotation speed of the motor having a higher rotation speed, or may stop the operation of the motor having a higher rotation speed. Alternatively, if any one of the motors 800 and 800L has a higher rotation speed than the other, the processor 1000 may increase a rotation speed of the motor having a lower rotation speed.

Referring to FIG. 53, the motors 800 and 800L may include encoders 800L*a* and 800*a* for sensing an amount, speed, or direction of rotation of the driving shafts 800*d* and 800L*d*. The processor 1000 may receive information on the amount, speed, or direction of rotation of the driving shafts 800*d* and 800L*d* of the motors 800 and 800L through the encoders 800L*a* and 800*a*. The motors 800 and 800L may include the brakes 800*e* and 800L*e* for braking rotation of the driving shafts 800*d* and 800L*d*. The processor 1000 may control the operation of the brakes 800*e* and 800L*e* to reduce the rotation speed of the motors 800 and 800L or to stop the operation of the motors 800 and 800L.

If any one of the motors 800 and 800L has a greater amount of rotation than the other, the processor 1000 may reduce a rotation speed of the motor having a greater amount of rotation, or may stop the operation of the motor having a greater amount of rotation. Alternatively, if any one of the motors 800 and 800L has a greater amount of rotation than the other, the processor 1000 may increase a rotation speed of the motor having a smaller amount of rotation.

If any one of the motors 800 and 800L has a higher rotation speed than the other, the processor 1000 may reduce a rotation speed of the motor having a higher rotation speed, or may stop the operation of the motor having a higher rotation speed. Alternatively, if any one of the motors 800 and 800L has a higher rotation speed than the other, the processor 1000 may increase a rotation speed of the motor having a lower rotation speed.

Referring to FIG. 54, the motors 800L*a* and 800*a* may be step motors, stepper motors or stepping motors. The processor 1000 may simultaneously control the motors 800 and 800L. The processor 1000 may control an amount, speed, or direction of rotation of the driving shafts 800*d* and 800L*d* of the motors 800 and 800L. The rotation amount of the driving shafts 800*d* and 800L*d* of the motors 800 and 800L may refer to the number of steps of rotation of the driving shafts 800*d* and 800L*d*. The rotation speed of the driving shafts 800*d* and 800L*d* of the motors 800*d* and 800L*d* may refer to the number of steps per unit time of rotation of the driving shafts 800*d* and 800L*d*. The motors 800 and 800L may include the brakes 800*e* and 800L*e* for braking rotation of the driving shafts 800*d* and 800L*d*. The processor 1000 may control the operation of the brakes 800*e* and 800L*e* to reduce the rotation speed of the motors 800 and 800L or to stop the operation of the motors 800 and 800L. The processor 1000 may receive, from the motors 800 and 800L, information on the amount, speed, or direction of rotation of the driving shafts 800*d* and 800L*d* of the motors 800 and 800L.

If any one of the motors 800 and 800L has a greater amount of rotation than the other, the processor 1000 may reduce a rotation speed of the motor having a greater amount of rotation, or may stop the operation of the motor having a greater amount of rotation. Alternatively, if any one of the motors 800 and 800L has a greater amount of rotation than the other, the processor 1000 may increase a rotation speed of the motor having a smaller amount of rotation.

If any one of the motors 800 and 800L has a higher rotation speed than the other, the processor 1000 may reduce a rotation speed of the motor having a higher rotation speed, or may stop the operation of the motor having a higher rotation speed. Alternatively, if any one of the motors 800 and 800L has a higher rotation speed than the other, the processor 1000 may increase a rotation speed of the motor having a lower rotation speed.

According to an aspect of the present disclosure, a display device may include: a housing; a roller installed in the housing; a display unit rolled around or unrolled from the roller; a first foldable link and a second foldable link each including one side pivotally coupled to the housing, and another side pivotally coupled to an upper portion of the display unit, and disposed opposite to each other; a first motor and a second motor installed in the housing and configured to pivot the first foldable link and the second foldable link, respectively; and a controller configured to control the first motor and the second motor so that the first foldable link the second foldable link are synchronized.

In addition, according to another aspect of the present disclosure, the display device may further include a cylinder pivotally coupled to the housing, and a gas spring reciprocating inside the cylinder and pivotally coupled to the first foldable link.

In addition, according to another aspect of the present disclosure, the first foldable link may include: a lower link having one side pivotally coupled to the housing; and an upper link pivotally coupled to the upper portion of the display unit, wherein the first foldable link may further include a shock absorber installed in the housing and coming into contact with the lower link as the first foldable link is folded.

In addition, according to another aspect of the present disclosure, the first motor may include: a first driving shaft; and a first rotary encoder configured to sense angular displacement of the first driving shaft, wherein the controller may control the first motor by obtaining angular displacement information of the first driving shaft from the first rotary encoder.

In addition, according to another aspect of the present disclosure, there are further included: a first gear rotated by the first motor; a first protrusion formed on the gear and spaced apart from an axis of rotation of the gear; and a second rotary encoder including a substrate facing the gear, and a position sensor formed on the substrate and protruding toward the gear, wherein the position sensor senses the first protrusion as the first gear is rotated, and the controller obtains angular displacement information of the first gear from the position sensor to control the first motor.

In addition, according to another aspect of the present disclosure, a plurality of position sensors are formed, and the plurality of position sensors may be arranged along a circular moving line of the protrusion.

In addition, according to another aspect of the present disclosure, the first foldable link includes: a lower link having one side pivotally coupled to the housing; and an upper link pivotally coupled to the upper portion of the display unit, wherein the first foldable link may further include: a second protrusion spaced apart from an axis of pivot of the lower link; and a position sensor installed in the housing, disposed adjacent to a pivot moving line, and sensing the second protrusion, wherein the controller may control the first motor by obtaining angular displacement information of the lower link from the position sensor.

In addition, according to another aspect of the present disclosure, the first motor may be a step motor, wherein the controller may control a step of the first motor.

In addition, according to another aspect of the present disclosure, there is further included a brake installed on a driving shaft of the first motor, wherein the controller may control the first motor by actuating the brake.

In addition, according to another aspect of the present disclosure, the first foldable link may include: a lower link having one side pivotally coupled to the housing; and an upper link pivotally coupled to an upper portion of the display unit, wherein the first foldable link may further include: a first gear fixed to a driving shaft of the first motor; and a second gear fixed to the lower link and engaged with the first gear, wherein an axis of rotation of the second gear is aligned with an axis of pivot of the lower link.

In addition, according to another aspect of the present disclosure, there are further included: a third gear coupled to a driving shaft of the first motor; a first double gear including a primary gear engaged with the third gear and a secondary gear with a lager diameter than the secondary gear; and a second double gear including a third gear engaged with the secondary gear and a fourth gear with a smaller diameter than the third gear and engaged with the second gear.

In addition, according to another aspect of the present disclosure, the first foldable link may include: a lower link including one side pivotally coupled to the housing; and an upper link pivotally coupled to the upper portion of the display unit, wherein the gas spring provides a force for raising the lower link to the lower link.

In addition, according to another aspect of the present disclosure, as the first foldable link is unfolded, a distance between one side and another side of the gas spring may increase.

In addition, according to another aspect of the present disclosure, there are included: a fourth gear formed at an upper end of the lower link; and a fifth gear formed at a lower end of the upper link and engaged with the fourth gear.

In addition, according to another aspect of the present disclosure, as the first lower link and the second lower link are raised, a distance between the first joint and the second joint may be moved away from each other.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a housing;
a roller installed in the housing;
a display unit configured to be rolled around the roller and unrolled from the roller;
a foldable link including:
a lower link having one side pivotally coupled to the housing, an upper link having one side pivotally coupled to another side of the lower link, and
another side pivotally coupled to an upper portion of the display unit;
a motor installed adjacent to the lower link in the housing and configured to provide a driving force;
a gear fixed to a driving shaft of the motor; and
a link gear coupled to the lower link and engaged with the gear,
wherein the lower link is eccentric to an axis of rotation of the link gear, to be coupled to the link gear,
wherein the link gear comprises:
a body having a disk shape; and
teeth formed on a circumference of the body,
wherein the body comprises:
a flat part;
a shaft hole formed at a center of rotation of the flat part; and
a cut-out part having the shaft hole and formed by cutting out a portion of one surface of the flat part,
wherein the cut-out part is eccentric to the shaft hole.

2. The display device of claim 1, further comprising:
a link for connecting the link gear with the lower link,
wherein the link comprises:
a bar-shaped body;
a lower link coupling part formed at an upper portion of the body; and
a gear coupling part formed at a lower portion of the body,
wherein the gear coupling part has a shape corresponding to the cut-out part of the link gear, and is inserted or press-fit into the cut-out part of the link gear.

3. The display device of claim 2,
wherein the gear coupling part comprises:
a first rectilinear part;
a second rectilinear part parallel to the first rectilinear part; and
a curved part connecting the first rectilinear part and the second rectilinear part,
wherein a distance from the shaft hole to the first rectilinear part is smaller than a distance from the shaft hole to the second rectilinear part.

4. The display device of claim 2,
wherein the gear coupling part comprises:
a first rectilinear part;
a second rectilinear part parallel to the first rectilinear part;
a curved part connected to the first rectilinear part;
a third rectilinear part connected to the curved part; and
a fourth rectilinear part connecting the third rectilinear part with the second rectilinear part, and tilted with respect to the second rectilinear part,
wherein the third rectilinear part forms an obtuse angle with respect to the fourth rectilinear part.

5. The display device of claim 2,
wherein the gear coupling part comprises:
a first rectilinear part;
a second rectilinear part parallel to the first rectilinear part;
a first curved part connected to the first rectilinear part; and
a second curved part connected to the second rectilinear part,
wherein:
the first curved part is convex in a radial direction of the link gear;
the second curved part is concave in the radial direction of the link gear; and
the first curved part and the second curved part form an inflection point.

6. The display device of claim 5, wherein the second rectilinear part and the second curved part form an acute angle.

7. The display device of claim 2,
wherein the gear coupling part comprises:
a first rectilinear part;
a second rectilinear part parallel to the first rectilinear part;
a first curved part connected to the first rectilinear part;
a second curved part connected to the second rectilinear part;
a third rectilinear part connected to the first curved part; and
a fourth rectilinear part connected to the second curved part,
wherein:
an extension of the fourth rectilinear part passes through the shaft hole; and
the third rectilinear part and the fourth rectilinear part form an obtuse angle.

8. The display device of claim 7, wherein the third rectilinear part and the fourth rectilinear part form a right angle.

9. The display device of claim 2,
wherein the link gear further comprises:
a first support hole formed in the cut-out part and having a first distance from the shaft hole; and
a second support hole formed in the cut-out part and having a second distance from the shaft hole,
wherein the link further comprises:
a first support boss formed on the gear coupling part and inserted into the first support hole; and
a second support boss formed on the gear coupling part and inserted into the second support hole, and
wherein the second distance is greater than the first distance.

10. The display device of claim 9,
wherein the link comprises:
a first fastening hole formed in the gear coupling part and having a first distance from the shaft hole;
a second fastening hole formed in the gear coupling part and having a second distance from the shaft hole; and
a third fastening hole formed in the gear coupling part and having a third distance from the shaft hole,
wherein:
the first distance is greater than the third distance: and
the second distance is greater than the first distance.

11. The display device of claim 10, wherein:
the first fastening hole, the second fastening hole, and the third fastening hole are arranged in an overall triangular shape;
the first support hole is disposed between the first fastening hole and the second fastening hole; and
the second support hole is disposed between the second fastening hole and the third fastening hole.

* * * * *